US012805117B2

(12) United States Patent
Li

(10) Patent No.: US 12,805,117 B2
(45) Date of Patent: Nov. 17, 2026

(54) LIGHT-EMITTING DEVICE AND MANUFACTURING METHOD THEREFOR, AND DISPLAY SUBSTRATE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Dong Li, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 409 days.

(21) Appl. No.: 18/559,674

(22) PCT Filed: Oct. 28, 2022

(86) PCT No.: PCT/CN2022/128437
§ 371 (c)(1),
(2) Date: Nov. 8, 2023

(87) PCT Pub. No.: WO2024/087228
PCT Pub. Date: May 2, 2024

(65) Prior Publication Data

US 2025/0098406 A1 Mar. 20, 2025

(51) Int. Cl.
*H10K 50/852* (2023.01)
*H10K 50/15* (2023.01)
(Continued)

(52) U.S. Cl.
CPC ......... *H10K 50/852* (2023.02); *H10K 50/156* (2023.02); *H10K 50/166* (2023.02);
(Continued)

(58) Field of Classification Search
CPC .... H10K 50/852; H10K 50/166; H10K 71/40; H10K 50/156; H10K 71/231; H10K 2102/351
See application file for complete search history.

(56) References Cited

U.S. PATENT DOCUMENTS

2007/0200804 A1 8/2007 Kwon
2010/0102706 A1* 4/2010 Miller ................. H10K 59/879 313/494
(Continued)

FOREIGN PATENT DOCUMENTS

CN 103762318 A 4/2014
CN 108134012 A 6/2018
(Continued)

OTHER PUBLICATIONS ip.com search history (Year: 2026).*

*Primary Examiner* — Zandra V Smith
*Assistant Examiner* — Andre C Stevenson
(74) *Attorney, Agent, or Firm* — Dority & Manning, P.A.

(57) ABSTRACT

A light-emitting device includes a first electrode, a first carrier transport layer, a light-emitting layer, a second carrier transport layer and a second electrode; the first carrier transport layer includes at least two first carrier transport sub-layers with different refractive indexes, and the refractive indexes of the first carrier transport sub-layers decrease layer by layer in a direction from the light-emitting layer to the first electrode; and/or, the second carrier transport layer includes at least two second carrier transport sub-layers with different refractive indexes, and the refractive indexes of the second carrier transport sub-layers decrease layer by layer in a direction from the light-emitting layer to the second electrode; and in the first carrier transport sub-layers and/or the second carrier transport sub-layers, a thickness of a film (Continued)

layer with a low refractive index is greater than a thickness of a film layer with a high refractive index.

19 Claims, 32 Drawing Sheets

(51) Int. Cl.

| | |
|---|---|
| ***H10K 50/16*** | (2023.01) |
| ***H10K 71/20*** | (2023.01) |
| ***H10K 71/40*** | (2023.01) |
| ***H10K 102/00*** | (2023.01) |

(52) U.S. Cl.
CPC ........... *H10K 71/231* (2023.02); *H10K 71/40* (2023.02); *H10K 2102/351* (2023.02)

(56) References Cited

U.S. PATENT DOCUMENTS

| | | | | |
|---|---|---|---|---|
| 2017/0373266 | A1 | 12/2017 | Xu et al. | |
| 2021/0133575 | A1* | 5/2021 | Imamura ................. | C02F 1/008 |
| 2021/0234098 | A1 | 7/2021 | Lee et al. | |
| 2021/0234115 | A1* | 7/2021 | Seo ...................... | H10K 50/155 |
| 2022/0077426 | A1 | 3/2022 | Chen et al. | |
| 2023/0337447 | A1 | 10/2023 | Mei et al. | |

FOREIGN PATENT DOCUMENTS

| | | | |
|---|---|---|---|
| CN | 110911588 | A | 3/2020 |
| JP | 2000156536 | A | 6/2000 |
| KR | 20100012254 | A | 2/2010 |
| KR | 20180003164 | A | 1/2018 |

* cited by examiner

100nm 110nm 120nm 130nm 140nm

70nm 80nm 90nm 100nm 110nm

S21: Form an initial first carrier first transport sub-layer on the first electrode, and anneal the initial first carrier first transport sub-layer to form the first carrier first transport sub-layer
↓
S22: Form the first carrier second transport sub-layer on the first carrier first transport sub-layer
FIG. 15A
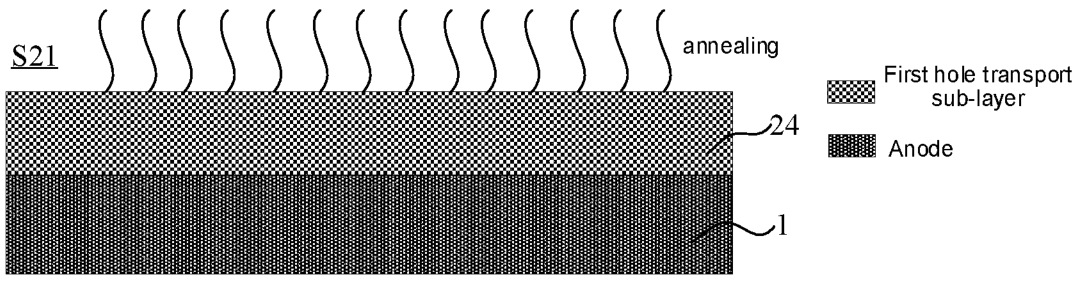
FIG. 15B
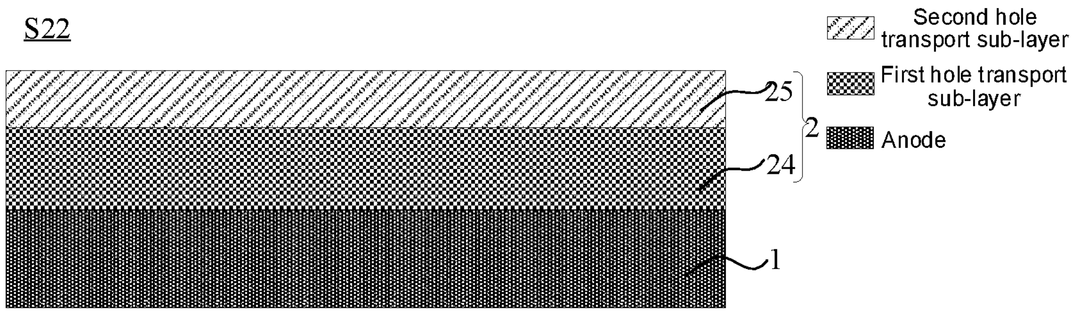
FIG. 15C

LIGHT-EMITTING DEVICE AND MANUFACTURING METHOD THEREFOR, AND DISPLAY SUBSTRATE

CROSS-REFERENCE TO RELATED APPLICATION

This application is a national phase entry under 35 USC 371 of International Patent Application No. PCT/CN2022/128437 filed on Oct. 28, 2022, which is incorporated herein by reference in its entirety.

TECHNICAL FIELD

The present disclosure relates to the field of display technologies, and in particular, to a light-emitting device and a manufacturing method therefor, and a display substrate.

BACKGROUND

Quantum dot light-emitting diode (QLED) devices have received widespread attention in the display field due to their advantages such as high color gamut, self-luminescence, low start-up voltage, and fast response speed. The working principle of the substrate of the QLED device is that electrons and holes are injected into two sides of the quantum dot light-emitting layer respectively, and these electrons and holes form photons after recombination in the quantum dot light-emitting layer, thereby emitting light through the photons.

SUMMARY

In an aspect, a light-emitting device is provided. The light-emitting device includes: a first electrode, and a first carrier transport layer, a light-emitting layer, a second carrier transport layer and a second electrode that are stacked on the first electrode in sequence. Transmittance of the second electrode is higher than that of the first electrode, and the transmittance is transmittance of visible light. The first carrier transport layer includes at least two first carrier transport sub-layers with different refractive indexes, and in the at least two first carrier transport sub-layers, the refractive indexes of the first carrier transport sub-layers decrease layer by layer in a direction from the light-emitting layer to the first electrode; and/or, the second carrier transport layer includes at least two second carrier transport sub-layers with different refractive indexes, and in the at least two second carrier transport sub-layers, the refractive indexes of the second carrier transport sub-layers decrease layer by layer in a direction from the light-emitting layer to the second electrode. In the at least two first carrier transport sub-layers, a thickness of a film layer with a low refractive index is greater than a thickness of a film layer with a high refractive index; and/or, in the at least two second carrier transport sub-layers, a thickness of a film layer with a low refractive index is greater than a thickness of a film layer with a high refractive index.

In some embodiments, the first carrier transport layer includes two first carrier transport sub-layers, a first carrier transport sub-layer proximate to the first electrode is a first carrier first transport sub-layer, and a first carrier transport sub-layer proximate to the light-emitting layer is a first carrier second transport sub-layer; and/or, the second carrier transport layer includes two second carrier transport sub-layers, a second carrier transport sub-layer proximate to the second electrode is a second carrier first transport sub-layer, and a second carrier transport sub-layer proximate to the light-emitting layer is a second carrier second transport sub-layer.

In some embodiments, in the two first carrier transport sub-layers, the first carrier first transport sub-layer is a continuous film layer, and a material of the first carrier first transport sub-layer is a first carrier first material; and/or, in the two second carrier transport sub-layers, the second carrier first transport sub-layer is a continuous film layer, and a material of the second carrier first transport sub-layer is a second carrier first material.

In some embodiments, in the two first carrier transport sub-layers, the first carrier first transport sub-layer includes a plurality of patterned structures spaced apart from each other, and materials of the plurality of patterned structures are a first carrier first material; the first carrier second transport sub-layer includes a first portion disposed on a side of the plurality of patterned structures of the first carrier first transport sub-layer away from the first electrode, and a second portion disposed on the first electrode and in contact with the first electrode. Thicknesses of the first portion and the second portion of the first carrier second transport sub-layer are equal, and a surface of the first carrier second transport sub-layer away from the first electrode is uneven; materials of the first portion and the second portion of the first carrier second transport sub-layer are both a first carrier second material.

In some embodiments, in the two first carrier transport sub-layers, the first carrier first transport sub-layer is a continuous film layer, and includes a plurality of patterned structures spaced apart from each other and other structures except the plurality of patterned structures; a surface of the first carrier first transport sub-layer away from the first electrode is in a same plane and the first carrier second transport sub-layer is a continuous film layer, and a material of the first carrier second transport sub-layer and a material of the other structures of the first carrier first transport sub-layer are both a first carrier second material, and a material of the plurality of patterned structures of the first carrier first transport sub-layer is a first carrier first material.

In some embodiments, in the two second carrier transport sub-layers, the second carrier first transport sub-layer includes a plurality of patterned structures spaced apart from each other, and a material of the plurality of patterned structures of the second carrier first transport sub-layer is a second carrier first material; the second carrier second transport sub-layer includes a first portion disposed on a side of the plurality of patterned structures of the second carrier first transport sub-layer away from the second electrode, and a second portion disposed on a side of the second electrode and in contact with the second electrode; materials of the first portion and the second portion of the second carrier second transport sub-layer are both a second carrier second material.

Thicknesses of the first portion and the second portion of the second carrier second transport sub-layer are not equal, and a thickness of the second portion of the second carrier second transport sub-layer is equal to a sum of a thickness of the first portion of the second carrier second transport sub-layer and a thickness of the second carrier first transport sub-layer.

In some embodiments, cross-sectional areas of at least one patterned structure in the plurality of patterned structures gradually increase or remain unchanged in a direction away from the light-emitting layer, a cross-sectional area of the patterned structure being an area of a cross-section obtained by taking a section of the patterned structure along a plane parallel to the light-emitting layer.

In some embodiments, a three-dimensional shape of the patterned structure is at least one of a prism, a semi-cylinder, a pyramid, a hemisphere, a semi-ellipsoid, and a truncated pyramid.

In some embodiments, in the two first carrier transport sub-layers, a grain size of the first carrier first material is greater than that of the first carrier second material, and grain boundaries of the first carrier first material are sharper than those of the first carrier second material; and/or, in the two second carrier transport sub-layers, a grain size of the second carrier first material is greater than that of the second carrier second material, and grain boundaries of the second carrier first material are sharper than those of the second carrier second material.

In some embodiments, same host atoms are included in the first carrier first material and the first carrier second material, and the first carrier first material further includes metal doped atoms; and/or, same host atoms are included in the second carrier first material and the second carrier second material, and the second carrier first material further includes metal doped atoms.

In some embodiments, a concentration of the doped atoms in the second carrier first transport sub-layer decreases exponentially with a depth of the doped atoms in the second carrier first transport sub-layer, and a distance between the doped atoms increases as the depth of the doped atoms in the second carrier first transport sub-layer increases; the depth of the doped atoms in the second carrier first transport sub-layer is a distance between the doped atoms and a surface of the second carrier first transport sub-layer away from the first electrode. And/or, a concentration of the doped atoms in the first carrier first transport sub-layer decreases exponentially with a depth of the doped atoms in the first carrier first transport sub-layer, and a distance between the doped atoms increases as the depth of the doped atoms in the first carrier first transport sub-layer increases; the depth of the doped atoms in the first carrier first transport sub-layer is a distance between the doped atoms and a surface of the first carrier first transport sub-layer away from the first electrode.

In some embodiments, in the two first carrier transport sub-layers, the first carrier second transport sub-layer is C-axis oriented; and/or, in the two second carrier transport sub-layers, the second carrier second transport sub-layer is C-axis oriented.

In some embodiments, in the two first carrier transport sub-layers, the first carrier first transport sub-layer is C-axis oriented, and a degree of C-axis orientation of the first carrier first transport sub-layer is less than that of the first carrier second transport sub-layer; and/or, in the two second carrier transport sub-layers, the second carrier first transport sub-layer is C-axis oriented, and a degree of C-axis orientation of the second carrier first transport sub-layer is less than that of the second carrier second transport sub-layer.

In some embodiments, a refractive index of the first carrier first transport sub-layer is in a range of 1.7 to 1.77, and a refractive index of the first carrier second transport sub-layer is in a range of 2.0 to 2.06; and/or, a refractive index of the second carrier first transport sub-layer is in a range of 1.7 to 1.77; and a refractive index of the second carrier second transport sub-layer is in a range of 2.0 to 2.06.

In some embodiments, the light-emitting layer is a red quantum dot light-emitting layer, a thickness of the first carrier first transport sub-layer is in a range of 30 nm to 60 nm, and a thickness of the first carrier second transport sub-layer is in a range of 10 nm to 40 nm; and/or, a thickness of the second carrier first transport sub-layer is in a range of 30 nm to 60 nm, and a thickness of the second carrier second transport sub-layer is in a range of 10 nm to 40 nm.

In some embodiments, the light-emitting layer is a green quantum dot light-emitting layer, a thickness of the first carrier first transport sub-layer is in a range of 50 nm to 60 nm, and a thickness of the first carrier second transport sub-layer is in a range of 10 nm to 20 nm; and/or, a thickness of the second carrier first transport sub-layer is in a range of 50 nm to 60 nm, and a thickness of the second carrier second transport sub-layer is in a range of 10 nm to 20 nm.

In some embodiments, the light-emitting layer is a blue quantum dot light-emitting layer, a thickness of the first carrier first transport sub-layer is in a range of 55 nm to 65 nm, and a thickness of the first carrier second transport sub-layer is in a range of 5 nm to 15 nm; and/or, a thickness of the second carrier first transport sub-layer is in a range of 55 nm to 65 nm, and a thickness of the second carrier second transport sub-layer is in a range of 5 nm to 15 nm.

In some embodiments, a surface roughness of the first carrier transport layer away from the first electrode is in a range of 0.5 nm to 2 nm; and/or, a surface roughness of the second carrier transport layer away from the first electrode is in a range of 0.5 nm to 2 nm.

In some embodiments, the light-emitting device is upright, the first electrode is an anode, the second electrode is a cathode, the first carrier transport layer is a hole transport layer, and the second carrier transport layer is an electron transport layer; or the light-emitting device is inverted, the first electrode is the cathode, the second electrode is the anode, the first carrier transport layer is the electron transport layer, and the second carrier transport layer is the hole transport layer. The second electrode is a transparent electrode.

In some embodiments, the electron transport layer includes at least two electron transport sub-layers with different refractive indexes, the hole transport layer is of one layer structure, and a thickness of the hole transport layer is in a range of 10 nm to 40 nm.

In another aspect, a manufacturing method for a light-emitting device is provided. The manufacturing method includes: forming a first electrode; forming a first carrier transport layer on the first electrode; forming a light-emitting layer on the first carrier transport layer; forming a second carrier transport layer on the light-emitting layer; forming a second electrode on the second carrier transport layer. The first carrier transport layer includes at least two first carrier transport sub-layers with different refractive indexes, and in the at least two first carrier transport sub-layers, the refractive indexes of the first carrier transport sub-layers decrease layer by layer in a direction from the light-emitting layer to the first electrode; and/or, the second carrier transport layer includes at least two second carrier transport sub-layers with different refractive indexes, and in the at least two second carrier transport sub-layers, the refractive indexes of the second carrier transport sub-layers decrease layer by layer in a direction from the light-emitting layer to the second electrode. In the at least two first carrier transport sub-layers, a thickness of a film layer with a low refractive index is greater than a thickness of a film layer with a high refractive index; and/or, in the at least two second carrier transport sub-layers, a thickness of a film layer with a low refractive index is greater than a thickness of a film layer with a high refractive index.

In some embodiments, the first carrier transport layer includes two first carrier transport sub-layers, a first carrier transport sub-layer proximate to the first electrode is a first carrier first transport sub-layer, and a first carrier transport sub-layer proximate to the light-emitting layer is a first carrier second transport sub-layer. Forming the first carrier transport layer on the first electrode, includes: forming an initial first carrier first transport sub-layer on the first electrode, and annealing the initial first carrier first transport sub-layer to form the first carrier first transport sub-layer; and forming the first carrier second transport sub-layer on the first carrier first transport sub-layer. Or, forming the first carrier transport layer on the first electrode, includes: forming the initial first carrier first transport sub-layer on the first electrode, etching the initial first carrier first transport sub-layer to form a plurality of patterned structures, and annealing the plurality of patterned structures to form the first carrier first transport sub-layer; and forming the first carrier second transport sub-layer on the first carrier first transport sub-layer. Or, forming the first carrier transport layer on the first electrode, includes: forming the initial first carrier first transport sub-layer on the first electrode, and performing local laser annealing on the initial first carrier first transport sub-layer to form the first carrier first transport sub-layer; and forming the first carrier second transport sub-layer on the first carrier first transport sub-layer. Or, forming the first carrier transport layer on the first electrode, includes: forming the initial first carrier first transport sub-layer on the first electrode, and performing ion implantation on the initial first carrier first transport sub-layer to form the first carrier first transport sub-layer; and forming the first carrier second transport sub-layer on the first carrier first transport sub-layer.

In some embodiments, the second carrier transport layer includes two second carrier transport sub-layers, and a second carrier transport sub-layer proximate to the second electrode is a second carrier first transport sub-layer, and a second carrier transport sub-layer proximate to the light-emitting layer is a second carrier second transport sub-layer. Forming the second carrier transport layer on the light-emitting layer, includes: forming an initial second carrier transport sub-layer on the light-emitting layer, and performing ion implantation on the initial second carrier transport sub-layer to form the second carrier first transport sub-layer and the second carrier second transport sub-layer, the second carrier first transport sub-layer being a portion of the initial second carrier transport sub-layer that has been implanted with ions, and the second carrier second transport sub-layer being a portion of the initial second carrier transport sub-layer that has not been implanted with ions. Or, forming the second carrier transport layer on the light-emitting layer, includes: forming the initial second carrier transport sub-layer on the light-emitting layer; and performing ion implantation at different positions of the initial second carrier transport sub-layer by using a mask scanning method to form the second carrier first transport sub-layer with a plurality of patterned structures and the second carrier second transport sub-layer, the second carrier first transport sub-layer being a portion of the initial second carrier transport sub-layer that has been implanted with ions, and the second carrier second transport sub-layer being a portion of the initial second carrier transport sub-layer that has not been implanted with ions. Or, forming the second carrier transport layer on the light-emitting layer, includes: forming the initial second carrier transport sub-layer on the light-emitting layer, etching the initial second carrier transport sub-layer to form the second carrier second transport sub-layer with a plurality of depressions; and filling the plurality of depressions in the second carrier second transport sub-layer with a material to form the second carrier first transport sub-layer with a plurality of patterned structures.

In yet another aspect, a display substrate is provided, and the display substrate includes the light-emitting device described above.

In some embodiments, the display substrate includes a plurality of sub-pixels, and the plurality of sub-pixels include red sub-pixels, green sub-pixels and blue sub-pixels. A surface of a first carrier transport layer of a light-emitting device in a red sub-pixel away from the first electrode, a surface of a first carrier transport layer of a light-emitting device in a green sub-pixel away from the first electrode, and a surface of a first carrier transport layer of a light-emitting device in a blue sub-pixel away from the first electrode are not in a same plane; and a surface of a second carrier transport layer of the light-emitting device in the red sub-pixel away from the second electrode, a surface of a second carrier transport layer of the light-emitting device in the green sub-pixel away from the second electrode, and a surface of a second carrier transport layer of the light-emitting device in the blue sub-pixel away from the second electrode are not in a same plane.

In some embodiments, the display substrate includes a plurality of sub-pixels, and the plurality of sub-pixels include red sub-pixels, green sub-pixels and blue sub-pixels. A surface of a first carrier transport layer of a light-emitting device in a red sub-pixel away from the first electrode, a surface of a first carrier transport layer of a light-emitting device in a green sub-pixel away from the first electrode, and a surface of a first carrier transport layer of a light-emitting device in a blue sub-pixel away from the first electrode are in a same plane; and a surface of a second carrier transport layer of the light-emitting device in the red sub-pixel away from the second electrode, a surface of a second carrier transport layer of the light-emitting device in the green sub-pixel away from the second electrode, and a surface of a second carrier transport layer of the light-emitting device in the blue sub-pixel away from the second electrode are in a same plane.

In some embodiments, a wavelength of light emitted by the light-emitting device in the red sub-pixel is $\lambda 1$, a wavelength of light emitted by the light-emitting device in the green sub-pixel is $\lambda 2$, and a wavelength of light emitted by the light-emitting device in the blue sub-pixel is $\lambda 3$; $\lambda 1>\lambda 2>\lambda 3$. A proportion of a thickness of a first carrier first transport sub-layer to a total thickness of the first carrier transport layer in the light-emitting device in the red sub-pixel is k1, a proportion of a thickness of a first carrier first transport sub-layer to a total thickness of the first carrier transport layer in the light-emitting device in the green sub-pixel is k2, and a proportion of a thickness of a first carrier first transport sub-layer to a total thickness of the first carrier transport layer in the light-emitting device in the blue sub-pixel is k3; $k1<k2<k3$; and/or, a proportion of a thickness of a second carrier first transport sub-layer to a total thickness of the second carrier transport layer in the light-emitting device in the red sub-pixel is k1', a proportion of a thickness of a second carrier first transport sub-layer to a total thickness of the second carrier transport layer in the light-emitting device in the green sub-pixel is k2', and a proportion of a thickness of a second carrier first transport sub-layer to a total thickness of the second carrier transport layer in the light-emitting device in the blue sub-pixel is k3'; $k1'<k2'<k3'$.

BRIEF DESCRIPTION OF THE DRAWINGS

In order to describe technical solutions in the present disclosure more clearly, the accompanying drawings to be used in some embodiments of the present disclosure will be introduced briefly; Obviously, the accompanying drawings to be described below are merely drawings of some embodiments of the present disclosure, and a person of ordinary skill in the art can obtain other drawings according to those drawings. In addition, the accompanying drawings to be described below may be regarded as schematic diagrams, but are not limitations on actual sizes of products, actual processes of methods and actual timings of signals involved in the embodiments of the present disclosure.

FIG. 15A is another flow chart for a light-emitting device, in accordance with some embodiments of the present disclosure;

FIG. 15B is a process diagram of a manufacturing method for a light-emitting device, in accordance with some embodiments of the present disclosure;

FIG. 15C is another process diagram of a manufacturing method for a light-emitting device, in accordance with some embodiments of the present disclosure;

DETAILED DESCRIPTION

Figure 1:
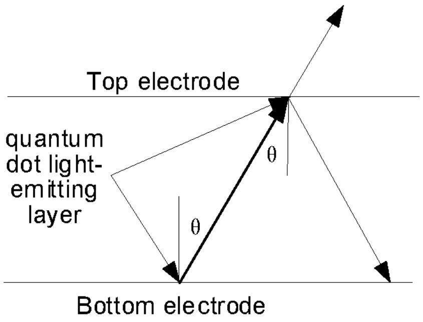
FIG. 1 is a diagram showing light reflection of a light-emitting device, in accordance with some embodiments of the present disclosure.

The technical solutions in some embodiments of the present disclosure will be described clearly and completely with reference to the accompanying drawings. However, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the description and the claims, the term “comprise” and other forms thereof such as the third-person singular form “comprises” and the present participle form “comprising” are construed as an open and inclusive meaning, i.e., “including, but not limited to". In the description of the specification, the terms such as "one embodiment", "some embodiments", "exemplary embodiments", "example", "specific example", or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying a relative importance or implicitly indicating a number of indicated technical features. Thus, a feature defined with "first" or "second" may explicitly or implicitly include one or more of the features. In the description of the embodiments of the present disclosure, the term "a/the plurality of" means two or more unless otherwise specified.

In the description of some embodiments, the terms such as "coupled" and "connected" and their derivatives may be used. The term "connected" should be understood in a broad sense. For example, the term "connected" may represent a fixed connection, a detachable connection, or a one-piece connection, or may represent a direct connection, or may represent an indirect connection through an intermediate medium. The term "coupled" indicates, for example, that two or more components are in direct physical or electrical contact with each other. The term "coupled" or "communicatively coupled" may also mean that two or more components are not in direct contact with each other but still cooperate or interact with each other. The embodiments disclosed herein are not necessarily limited to the content herein.

The phrase "at least one of A, B, and C" has the same meaning as the phrase "at least one of A, B, or C", and they both include the following combinations of A, B, and C: only A, only B, only C, a combination of A and B, a combination of A and C, a combination of B and C, and a combination of A, B, and C.

The phrase "A and/or B" includes following three combinations: only A, only B, and a combination of A and B.

As used herein, the term "if" is optionally construed as "when" or "in a case where" or "in response to determining" or "in response to detecting", depending on the context. Similarly, depending on the context, the phrase "if it is determined" or "if [a stated condition or event] is detected" is optionally construed as "in a case where it is determined" or "in response to determining" or "in a case where [the stated condition or event] is detected" or "in response to detecting [the stated condition or event]".

The phrase "applicable to" or "configured to" used herein means an open and inclusive expression, which does not exclude devices that are applicable to or configured to perform additional tasks or steps.

In addition, the phase "based on" used is meant to be open and inclusive, since a process, a step, a calculation or other action that is "based on" one or more of stated conditions or values may, in practice, be based on additional conditions or values exceeding those stated.

The term such as "about", "substantially", and "approximately" as used herein includes a stated value and an average value within an acceptable range of deviation of a particular value. The acceptable range of deviation is determined by a person of ordinary skill in the art in consideration of measurement in question and errors associated with measurement of a particular quantity (i.e., limitations of a measurement system).

The term such as "parallel", "perpendicular" or "equal" as used herein includes a stated condition and a condition similar to the stated condition. A range of the similar condition is within an acceptable deviation range, and the acceptable deviation range is determined by a person of ordinary skill in the art in consideration of measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, that a difference between two equals is less than or equal to 5% of either of the two equals.

It will be understood that, when a layer or an element is referred to as being on another layer or substrate, it may be that the layer or element is directly on the another layer or substrate, or it may be that intermediate layer(s) exist between the layer or element and the another layer or substrate.

Exemplary embodiments are described herein with reference to sectional views and/or plan views as idealized exemplary drawings. In the accompanying drawings, thicknesses of layers and areas of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown to have a rectangular shape generally has a curved feature. Therefore, the regions shown in the accompanying drawings are schematic in nature, and their shapes are not intended to show actual shapes of the regions in devices, and are not intended to limit the scope of the exemplary embodiments.

Quantum dots (QD), as a new type of luminescent material, have the advantages of high light color purity, high luminescent quantum efficiency, adjustable luminescence color, and long service life. They are currently the research hotspot of new light-emitting diode (LED) luminescent materials. Therefore, quantum dot light-emitting diodes (QLEDs) with the quantum dot material as the light-emitting layer have become the main direction of research on new display devices.

Active electroluminescent quantum dot light-emitting diodes (MQLEDs) have also received more and more attention due to their potential advantages in wide color gamut and long life, and research on them has become increasingly in-depth. The efficiency of quantum dots has been continuously improved and has basically reached the level of industrialization. It is of great significance to further adopt new processes and technologies. Due to the characteristics of the quantum dot material itself, printing technology or printing method is generally adopted, which can effectively improve the utilization rate of the material, and provide an effective way for large-scale fabrication.

In the high-resolution demand of high-resolution display products, it is required that the light-emitting device adopts a top emission structure to improve the aperture ratio. It is necessary to optimize the thickness of each film layer to unify the best electrical structure and optical structure of the device, and at the same time optimize the electrical balance and light extraction efficiency. However, it is difficult to achieve the unification of the best electrical structure and optical structure at present.

In some embodiments, the QLED device includes a first electrode, an electron transport layer (ET), a quantum dot light-emitting layer, a hole transport layer (HT), a hole injection layer (HI) and a second electrode that are stacked in sequence, and the QLED device may be a top emission device or a bottom emission device.

Generally, in the microcavity structure of the top emission QLED device, the light is generated in the quantum dot light-emitting layer, and then one path of light propagates to the top and reaches the top electrode, and the other path of light propagates to the bottom, is reflected by the bottom electrode and then propagates to the top to reach the top electrode. Referring to FIG. 1, two beams of coherent light have different phases due to different optical paths under the influence of cavity length and viewing angle. At the multiple film layers and the metal film layers for the electrodes in the optical microcavity, the light will undergo multiple reflections, scattering and diffraction, causing changes in the phase. Generally, in a case where the phase is $2k\pi$ (k is an integer), the outgoing light works best.

Figure 2A:
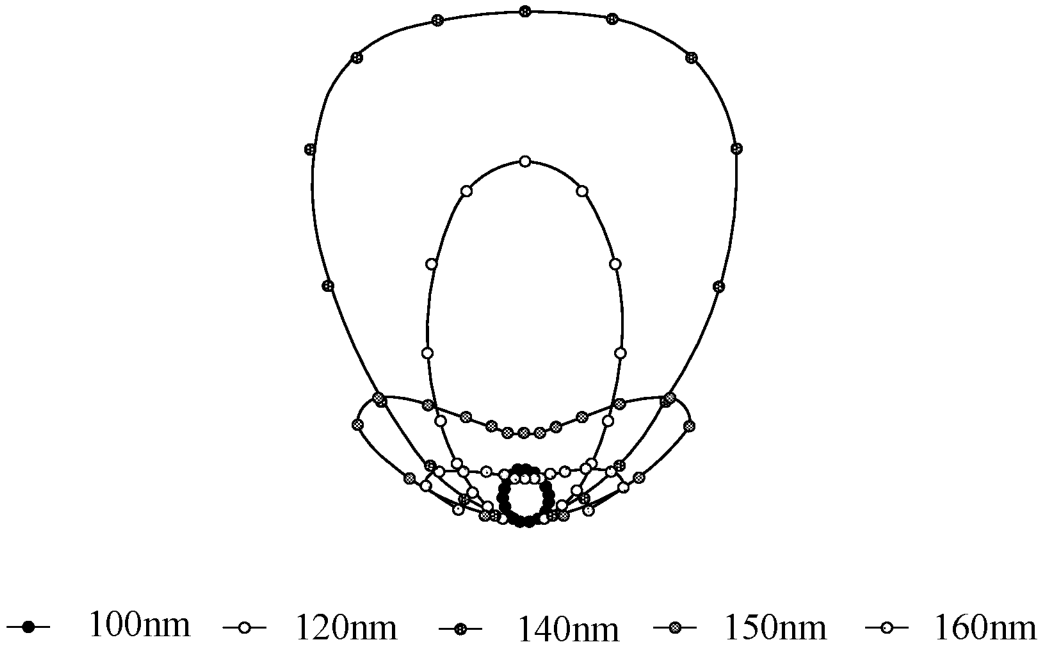
FIG. 2A is a simulation result diagram of light-exit angle distribution of red light-emitting devices with different cavity lengths, in accordance with some embodiments of the present disclosure.
Figure 2B:
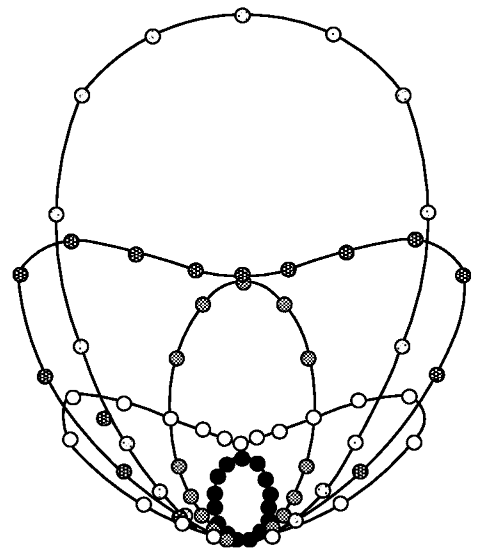
FIG. 2B is a simulation result diagram of light-exit angle distribution of green light-emitting devices with different cavity lengths, in accordance with some embodiments of the present disclosure.
Figure 2C:
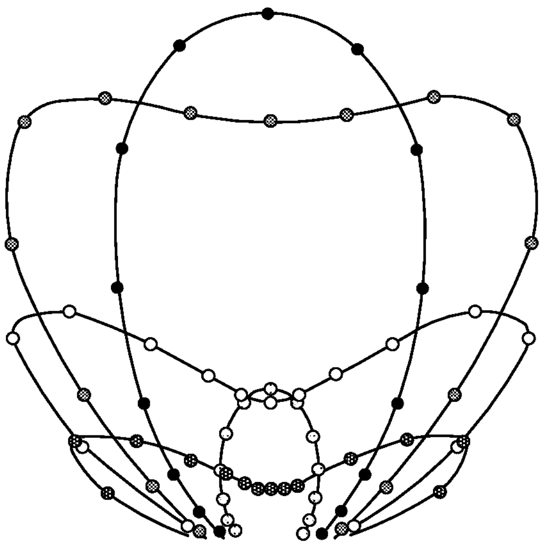
FIG. 2C is a simulation result diagram of light-exit angle distribution of blue light-emitting devices with different cavity lengths, in accordance with some embodiments of the present disclosure.
Figure 3A:
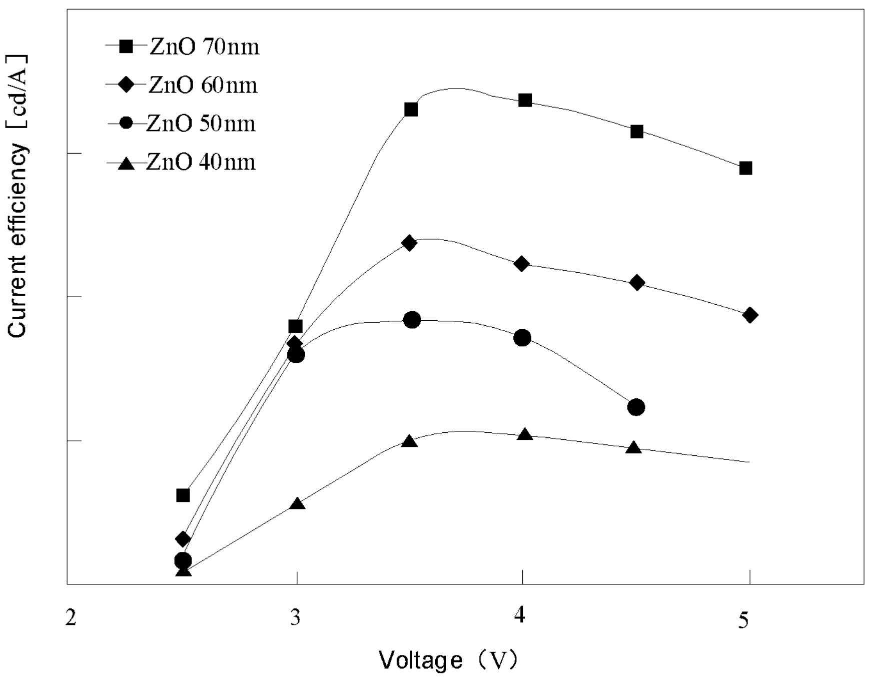
FIG. 3A is a curve graph of brightness attenuation of a green light-emitting device of bottom emission with voltages, in accordance with some embodiments of the present disclosure.
Figure 3B:
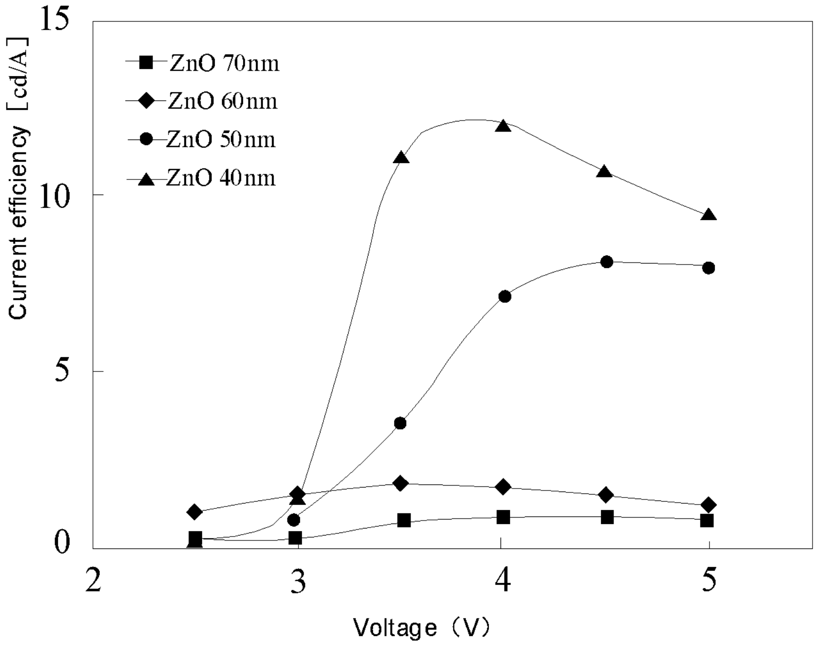
FIG. 3B is a curve graph of brightness attenuation of a green light-emitting device of top emission with voltages, in accordance with some embodiments of the present disclosure.

For the red, green and blue sub-pixels, to achieve the best light extraction efficiency, the requirements for the cavity length are significantly different. Generally, red devices require the largest cavity length, and blue devices require the smallest cavity length. Referring to FIGS. 2A, 2B and 2C, in a case where the cavity lengths of red, green and blue devices are 140 nm, 120 nm and 80 nm respectively, they have the best light extraction efficiency (in this case, for the red device, the thickness of the ET is 60 nm, the thickness of the quantum dot light-emitting layer is 30 nm, the thickness of the HT is 40 nm, and the thickness of the HI is about 5 to 10 nm; for the green device, the thickness of the ET is 40 nm, the thickness of the quantum dot light-emitting layer is 30 nm, the thickness of the HT is 40 nm, and the thickness of the HI is about 5 to 10 nm; for the blue device, the thickness of the ET is 20 nm, the thickness of the quantum dot light-emitting layer is 25 nm, the thickness of the HT is 30 nm, and the thickness of the HI is about 5 nm). For the red device, due to the large cavity length, there is a large adjustment space within the appropriate cavity length range to optimize the electrical structure, and the thicknesses of film layers may also be large; therefore, it is easier to achieve the electrical balance. For the blue device, the thicknesses of layers within the appropriate cavity length range are small, and the adjustment space for the electrical balance is small. Due to the small cavity length and the small thicknesses of the layers, it will also cause the problem of device leakage, which will further affect the electrical balance. For the green device, the outgoing light is the best in a case where the thickness of the ET is 40 nm (corresponding to the cavity length of 120 nm), and the outgoing light is poor in a case where the thickness of the ET is above 60 nm. Referring to FIGS. 3A and 3B, FIG. 3A is an efficiency diagram of green bottom emission devices with different ET thicknesses, and FIG. 3B is an efficiency diagram of green top emission devices with different ET thicknesses. In FIG. 3A, the electrical balance of the device is the worst in the case where the thickness of the ET is 40 nm, and the electrical balance of the device is the best in a case where the thickness of the ET is 70 nm (that is, the efficiency of the bottom emission device is the best; however, the cavity length at this time is relatively large, and the corresponding light extraction efficiency is poor). In FIG. 3B, the efficiency of the top emission device is the worst in the case where the thickness of the ET is 70 nm. Therefore, in the electrical balance structure, it is necessary to appropriately reduce the cavity length to achieve the best light extraction effect. However, the decrease in the cavity length will lead to carrier injection imbalance, which is also the contradiction of the thicknesses of layers in the electrical and optical adjustment of the top emission QLED device.

In order to solve the technical problem, embodiments of the present disclosure provide a light-emitting device 10. The light-emitting device 10 can achieve the effect of reducing the cavity length without changing the thickness of the film layer and maintaining the electrical structure of the device.

In some embodiments of the present disclosure, as shown in FIGS. 4A to 4F, the light-emitting device 10 includes a first electrode 1, and a first carrier transport layer 2, a light-emitting layer 3, a second carrier transport layer 4 and a second electrode 5 that are stacked on the first electrode 1 in sequence. Transmittance of the second electrode 5 is higher than that of the first electrode 1, and the transmittance is transmittance of visible light.

The first electrode 1 can be called the bottom electrode, and the second electrode 5 can be called the top electrode. The transmittance of the second electrode 5 is higher than that of the first electrode 1, and the light emitted by the light-emitting layer 3 exits through the second electrode 5. For example, the light-emitting device 10 is a top emission light-emitting device.

It should be noted that the wavelength of visible light is in a range of 390 nm to 780 nm, inclusive.

Figure 4A:
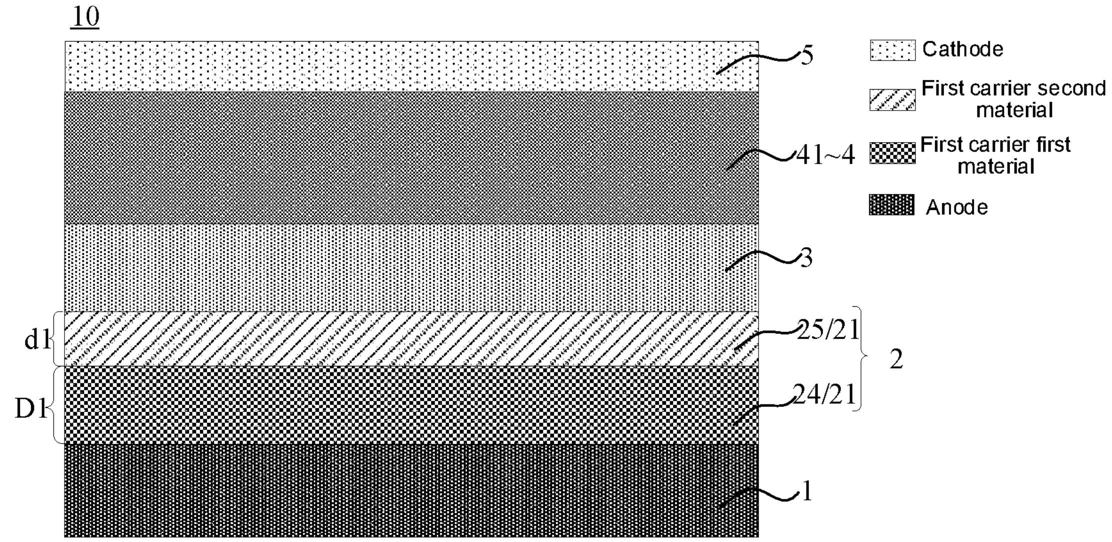
FIG. 4A is a structural diagram of a light-emitting device, in accordance with some embodiments of the present disclosure.
Figure 4B:
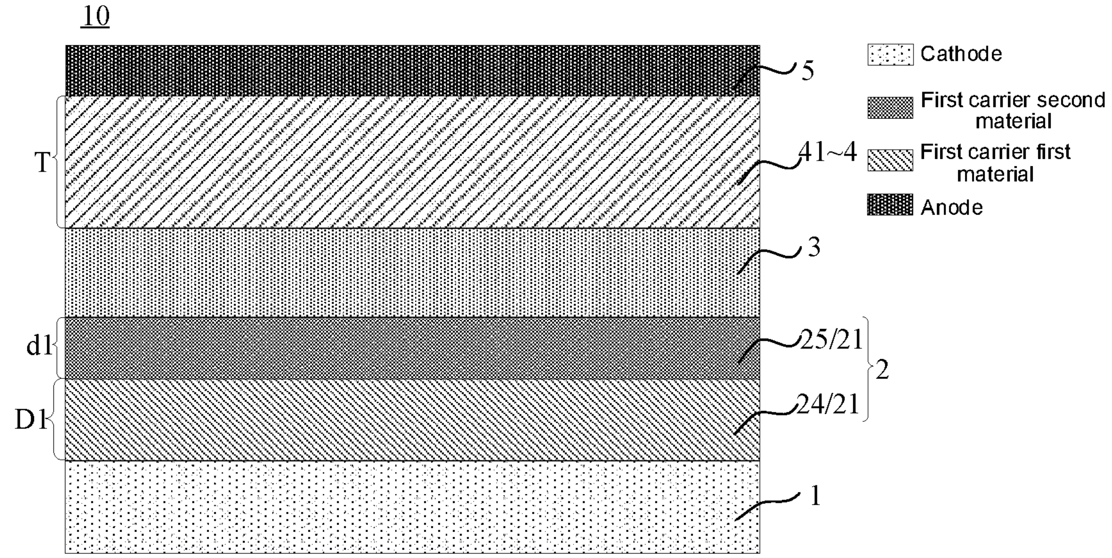
FIG. 4B is a structural diagram of another light-emitting device, in accordance with some embodiments of the present disclosure.
Figure 4C:
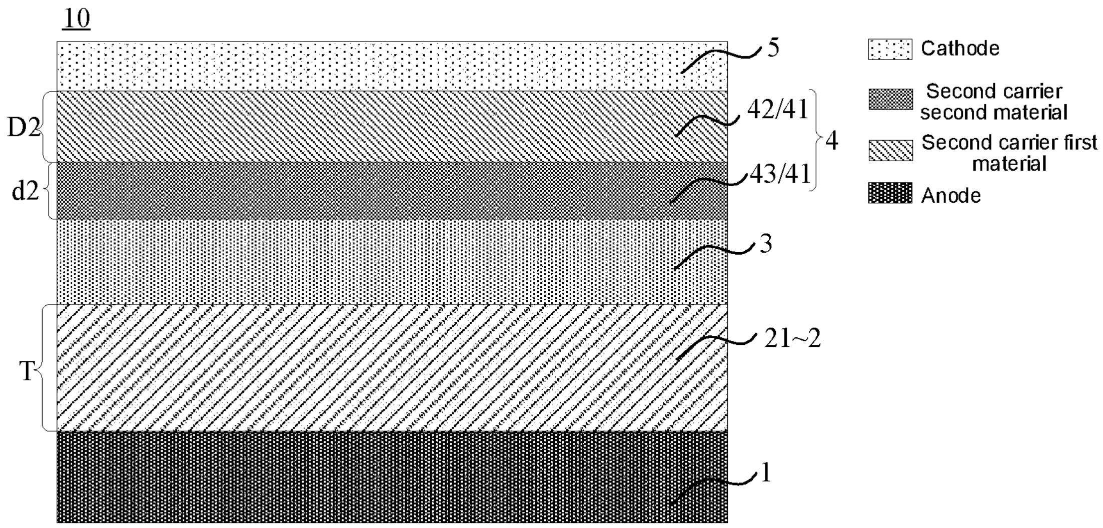
FIG. 4C is a structural diagram of yet another light-emitting device, in accordance with some embodiments of the present disclosure.
Figure 4D:
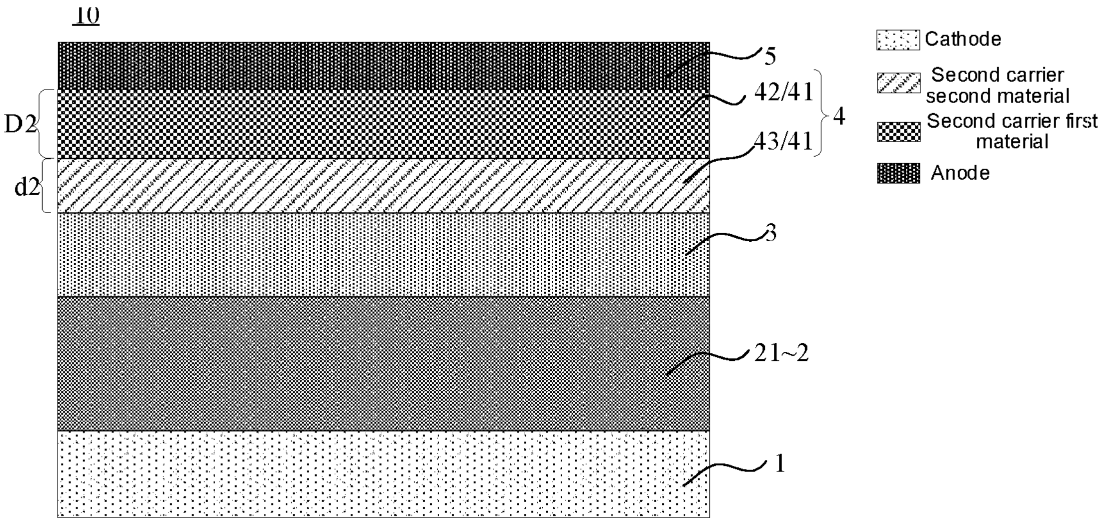
FIG. 4D is a structural diagram of yet another light-emitting device, in accordance with some embodiments of the present disclosure.
Figure 4E:
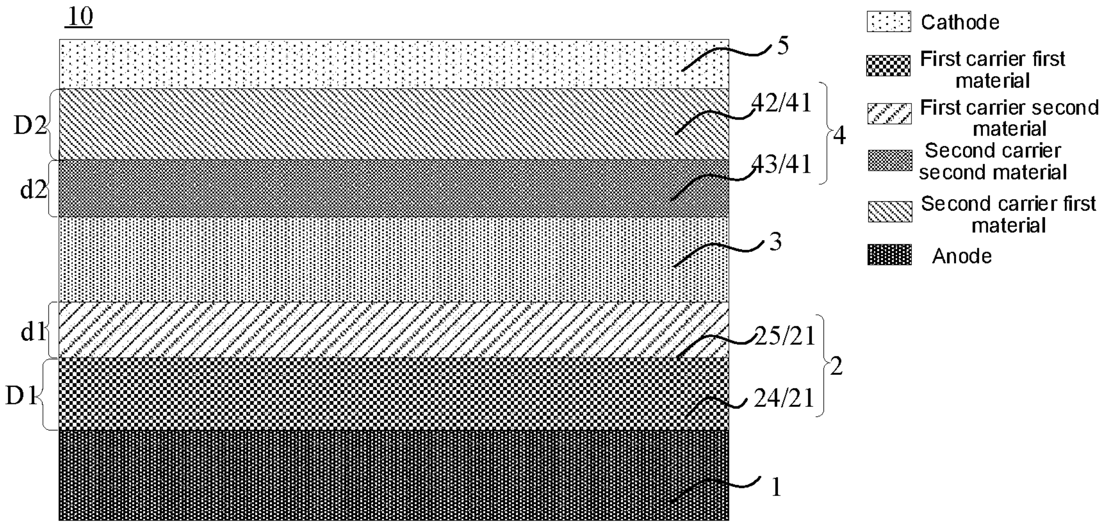
FIG. 4E is a structural diagram of yet another light-emitting device, in accordance with some embodiments of the present disclosure.
Figure 4F:
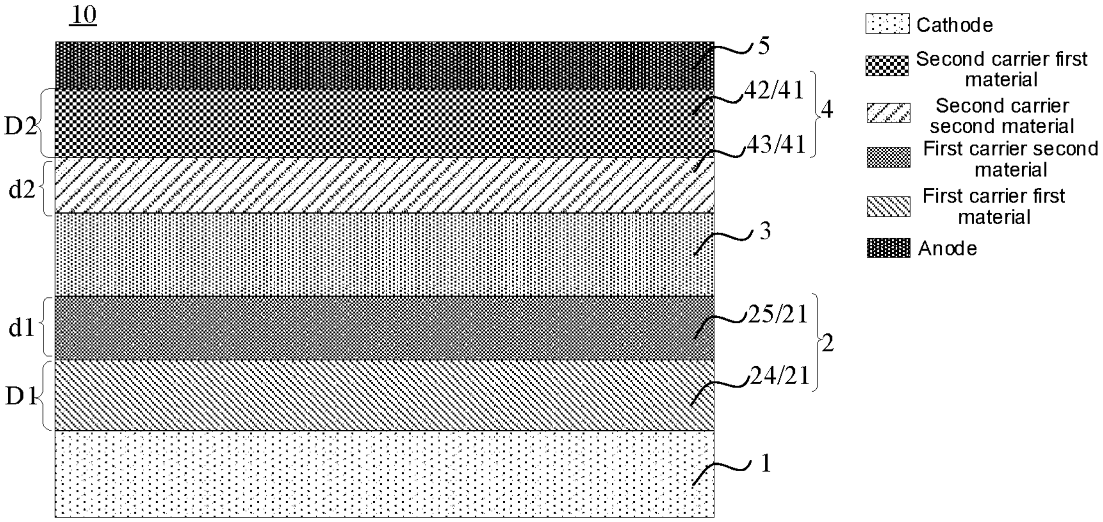
FIG. 4F is a structural diagram of yet another light-emitting device, in accordance with some embodiments of the present disclosure.

In some examples, the light-emitting device 10 may be upright or inverted. For example, as shown in FIGS. 4A, 4C and 4E, the light-emitting device 10 is upright, the first electrode 1 is an anode, the second electrode 5 is a cathode, the first carrier transport layer 2 is a hole transport layer, and the second carrier transport layer 4 is an electron transport layer. As shown in FIGS. 4B, 4D and 4F, the light-emitting device 10 is inverted, the first electrode 1 is a cathode, the second electrode 5 is an anode, the first carrier transport layer 2 is an electron transport layer, and the second carrier transport layer 4 is a hole transport layer.

In some embodiments, the first carrier transport layer 2 includes at least two first carrier transport sub-layers 21 with different refractive indexes, and in the at least two first carrier transport sub-layers 21, the refractive indexes of the first carrier transport sub-layers 21 decrease layer by layer in a direction from the light-emitting layer 3 to the first electrode 1. That is, the refractive index of the first carrier transport sub-layer 21 away from the light-emitting layer 3 is less than that of the first carrier transport sub-layer 21 proximate to the light-emitting layer 3. In this case, for example, the first carrier transport layer 2 includes two, three or four sub-layers, and the second carrier transport layer 4 includes one layer. This embodiment is referred to as scheme one.

For example, referring to FIGS. 4A and 4B, the first carrier transport layer 2 shown in FIGS. 4A and 4B includes two first carrier transport sub-layers 21 with different refractive indexes, and in the two first carrier transport sub-layers 21, the refractive indexes of the first carrier transport sub-layers 21 gradually decrease in the direction from the light-emitting layer 3 to the first electrode 1. The first carrier transport sub-layer 21 proximate to the first electrode 1 is a first carrier first transport sub-layer 24, and the first carrier transport sub-layer 21 proximate to the light-emitting layer 3 is a first carrier second transport sub-layer 25. The refractive index of the first carrier first transport sub-layer 24 is less than that of the first carrier second transport sub-layer 25.

The first carrier transport layer 2 may be the hole transport layer or electron transport layer.

For example, as shown in FIG. 4A, the light-emitting device 10 is upright; the first electrode 1 is the anode, the second electrode 5 is the cathode, the first carrier transport layer 2 is the hole transport layer, and the hole transport layer includes two hole transport sub-layers; in the two hole transport sub-layers, the refractive indexes of the hole transport sub-layers gradually decrease in the direction from the light-emitting layer 3 to the first electrode 1. In this case, the hole transport sub-layer proximate to the first electrode 1 is a first hole transport sub-layer, and the hole transport sub-layer proximate to the light-emitting layer 3 is a second hole transport sub-layer, and the refractive index of the first hole transport sub-layer is less than that of the second hole transport sub-layer.

For example, as shown in FIG. 4B, the light-emitting device 10 is inverted; the first electrode 1 is the cathode, the second electrode 5 is the anode, the first carrier transport layer 2 is the electron transport layer, and the electron transport layer includes two electron transport sub-layers; in the two electron transport sub-layers, the refractive indexes of the electron transport sub-layers gradually decrease in the direction from the light-emitting layer 3 to the first electrode 1. In this case, the electron transport sub-layer proximate to the first electrode 1 is a first electron transport sub-layer, and the electron transport sub-layer proximate to the light-emitting layer 3 is a second electron transport sub-layer, and the refractive index of the first electron transport sub-layer is less than that of the second electron transport sub-layer.

In some other embodiments, the second carrier transport layer 4 includes at least two second carrier transport sub-layers 41 with different refractive indexes, and in the at least two second carrier transport sub-layers 41, the refractive indexes of the second carrier transport sub-layers 41 decrease layer by layer in a direction from the light-emitting layer 3 to the second electrode 5. That is, the refractive index of the second carrier transport sub-layer 41 away from the light-emitting layer 3 is less than that of the second carrier transport sub-layer 41 proximate to the light-emitting layer 3. In this case, for example, the second carrier transport layer 4 includes two, three or four sub-layers, and the first carrier transport layer 2 includes one layer. This embodiment is referred to as scheme two.

For example, referring to FIGS. 4C and 4D, the second carrier transport layer 4 shown in FIGS. 4C and 4D includes two second carrier transport sub-layers 41 with different refractive indexes, and in the two second carrier transport sub-layers 41, the refractive indexes of the second carrier transport sub-layers 41 gradually decrease in the direction from the light-emitting layer 3 to the second electrode 5. The second carrier transport sub-layer 41 proximate to the second electrode 5 is a second carrier first transport sub-layer 42, and the second carrier transport sub-layer 41 proximate to the light-emitting layer 3 is a second carrier second transport sub-layer 43. The refractive index of the second carrier first transport sub-layer 42 is less than that of the second carrier second transport sub-layer 43.

The second carrier transport layer 4 may be the hole transport layer or electron transport layer.

For example, as shown in FIG. 4C, the light-emitting device 10 is upright; the first electrode 1 is the anode, the second electrode 5 is the cathode, the second carrier transport layer 4 is the electron transport layer, and the electron transport layer includes two electron transport sub-layers; in the two electron transport sub-layers, the refractive indexes of the electron transport sub-layers gradually decrease in the direction from the light-emitting layer 3 to the second electrode 5. In this case, the electron transport sub-layer proximate to the second electrode 5 is a first electron transport sub-layer, and the electron transport sub-layer proximate to the light-emitting layer 3 is a second electron transport sub-layer, and the refractive index of the first electron transport sub-layer is less than that of the second electron transport sub-layer.

For example, as shown in FIG. 4D, the light-emitting device 10 is inverted; the first electrode 1 is the cathode, the second electrode 5 is the anode, the second carrier transport layer 4 is the hole transport layer, and the hole transport layer includes two hole transport sub-layers; in the two hole transport sub-layers, the refractive indexes of the hole transport sub-layers gradually decrease in the direction from the light-emitting layer 3 to the second electrode 5. In this case, the hole transport sub-layer proximate to the second electrode 5 is a first hole transport sub-layer, and the hole transport sub-layer proximate to the light-emitting layer 3 is a second hole transport sub-layer, and the refractive index of the first hole transport sub-layer is less than that of the second hole transport sub-layer.

In yet other embodiments, the first carrier transport layer 2 includes at least two first carrier transport sub-layers 21 with different refractive indexes, and in the at least two first carrier transport sub-layers 21, the refractive indexes of the first carrier transport sub-layers 21 decrease layer by layer in the direction from the light-emitting layer 3 to the first electrode 1; the second carrier transport layer 4 includes at least two second carrier transport sub-layers 41 with different refractive indexes, and in the at least two second carrier transport sub-layers 41, the refractive indexes of the second carrier transport sub-layers 41 decrease layer by layer in the direction from the light-emitting layer 3 to the second electrode 5. For example, both the first carrier transport layer 2 and the second carrier transport layer 4 may include a plurality of sub-layers, such as two sub-layers, three sub-layers or four sub-layers. This embodiment is referred to as scheme three.

For example, referring to FIGS. 4E and 4F, the first carrier transport layer 2 shown in FIGS. 4E and 4F includes two first carrier transport sub-layers 21 with different refractive indexes, and in the two first carrier transport sub-layers 21, the refractive indexes of the first carrier transport sub-layers 21 gradually decrease in the direction from the light-emitting layer 3 to the first electrode 1. For example, the two first carrier transport sub-layers 21 include the first carrier first transport sub-layer 24 and the first carrier second transport sub-layer 25, and the refractive index of the first carrier first transport sub-layer 24 is less than that of the first carrier second transport sub-layer 25. For example, the second carrier transport layer 4 includes two second carrier transport sub-layers 41 with different refractive indexes, and in the two second carrier transport sub-layers 41, the refractive indexes of the second carrier transport sub-layers 41 gradually decrease in the direction from the light-emitting layer 3 to the second electrode 5. For example, the two second carrier transport sub-layers 41 include the second carrier first transport sub-layer 42 and the second carrier second transport sub-layer 43, and the refractive index of the second carrier first transport sub-layer 42 is less than that of the second carrier second transport sub-layer 43.

The first carrier transport layer 2 may be the hole transport layer or electron transport layer, and the second carrier transport layer 4 may be the electron transport layer or hole transport layer.

For example, as shown in FIG. 4E, the light-emitting device 10 is upright, the first electrode 1 is the anode, the second electrode 5 is the cathode, the first carrier transport layer 2 is the hole transport layer, and the second carrier transport layer 4 is the electron transport layer; the hole transport layer includes two hole transport sub-layers, and the electron transport layer includes two electron transport sub-layers. In the two hole transport sub-layers, the refractive indexes of the hole transport sub-layers gradually decrease in the direction from the light-emitting layer 3 to the first electrode 1, and the refractive index of the first hole transport sub-layer is less than that of the second hole transport sub-layer; in the two electron transport sub-layers, the refractive indexes of the electron transport sub-layers gradually decrease in the direction from the light-emitting layer 3 to the second electrode 5, and the refractive index of the first electron transport sub-layer is less than that of the second electron transport sub-layer.

For example, as shown in FIG. 4F, the light-emitting device 10 is inverted, the first electrode 1 is the cathode, the second electrode 5 is the anode, the first carrier transport layer 2 is the electron transport layer, and the second carrier transport layer 4 It is the hole transport layer; the hole transport layer includes two hole transport sub-layers, and the electron transport layer includes two electron transport sub-layers. In the two electron transport sub-layers, the refractive indexes of the electron transport sub-layers gradually decrease in the direction from the light-emitting layer 3 to the first electrode 1, and the refractive index of the first electron transport sub-layer is less than that of the second electron transport sub-layer; in the two hole transport sub-layers, the refractive indexes of the hole transport sub-layers gradually decrease in the direction from the light-emitting layer 3 to the second electrode 5, and the refractive index of the first hole transport sub-layer is less than that of the second hole transport sub-layer.

It should be noted that, the light-emitting device 10 can be configured such that the first carrier transport layer 2 includes at least two first carrier transport sub-layers 21 with different refractive indexes and the second carrier transport layer 4 includes at least two second carrier transport sub-layers 41 with different refractive indexes, or can also be configured as any one of the first carrier transport layer 2 including at least two first carrier transport sub-layers 21 with different refractive indexes or the second carrier transport layer 4 including at least two second carrier transport sub-layers 41 with different refractive indexes, which constitute the above three schemes.

The light-emitting device provided in the embodiments of the present disclosure is the top emission light-emitting device. After the light is generated in the light-emitting layer, one path of light propagates to the top and reaches the second electrode (top electrode), which is the first light path; and the other path of light propagates to the bottom, is reflected by the first electrode (bottom electrode) and then propagates to the top to reach the second electrode (top electrode), which is referred to as the second light path. If this path of light all propagates to the first electrode, and then reflected by the first electrode, the optical path of this path of light includes the entire first carrier transport layer. However, in the light propagation, part of the light will be reflected at an interface of different film layers, thereby changing the optical path. For example, in the light propagation from a high refractive index film layer to a low refractive index film layer, i.e., from an optically denser medium to an optically rarer medium, part of the light will be reflected at the interface between the two, which is equivalent to shortening part of the cavity lengths to a certain extent. It can be seen from the above that the cavity length of the light-emitting device affects its light extraction effect.

In the light-emitting device described above, the first carrier transport layer 2 includes at least two first carrier transport sub-layers 21 with different refractive indexes, and in the at least two first carrier transport sub-layers 21, the refractive indexes of the first carrier transport sub-layers 21 gradually decrease in the direction from the light-emitting layer 3 to the first electrode 1. That is, when the light generated by the light-emitting layer propagates through the second light path, in the process of propagating to the second electrode, the light propagates from the high refractive index film layer to the low refractive index film layer, i.e., from the optically denser medium to the optically rarer medium. In this way, part of the light will be reflected, which is equivalent to shortening part of the cavity lengths and increasing the light extraction efficiency to a certain extent. Moreover, in the process of light propagating through the two light paths, the two paths of light have different phases due to different optical paths, and since part of the light is reflected at the interface between the high refractive index film layer and the low refractive index film layer, the phase changes, which may improve light extraction effect of the light-emitting device.

The second carrier transport layer 4 includes at least two second carrier transport sub-layers 41 with different refractive indexes, and in the at least two second carrier transport sub-layers 41, the refractive indexes of the second carrier transport sub-layers 41 gradually decrease in the direction from the light-emitting layer 3 to the second electrode 5. That is, when the light generated by the light-emitting layer propagates through the first light path, in the process of propagating to the second electrode, the light propagates from the high refractive index film layer to the low refractive index film layer, i.e., from the optically denser medium to the optically rarer medium. In this case, in the light-emitting device 10, a critical surface of the high refractive index film layer and the low refractive index film layer is equivalent to a reflective surface, so that part of the light will be reflected at this reflective surface. Compared with a light-emitting device without this reflective surface, the light extraction path of part of the light may be shortened, which is equivalent to shortening part of the cavity lengths and increasing the light extraction efficiency to a certain extent. Moreover, in the process of light propagating through the two light paths, the two paths of light have different phases due to different optical paths, and since part of the light is reflected at the interface between the high refractive index film layer and the low refractive index film layer, the phase changes, which may improve light extraction effect of the light-emitting device.

Moreover, compared with the original structural design, the first carrier transport layer 2 and the second carrier transport layer 4 only change the refractive index, and do not change their total thicknesses, so that the electrical balance of the light-emitting device will not be affected. Therefore, in a case where the thicknesses of the first carrier transport layer 2 and the second carrier transport layer 4 do not change, and the electrical balance is not affected, the cavity length of the light-emitting device is reduced, the light extraction efficiency is enhanced, and thus it can solve the problem of the electrical and optical balance of the light-emitting device 10.

In some embodiments, in the at least two first carrier transport sub-layers 21, a thickness of a film layer with a low refractive index is greater than that of a film layer with a high refractive index. For example, in a direction away from the light-emitting layer 3, the thicknesses of the first carrier transport sub-layers 21 increase layer by layer.

For example, corresponding to scheme one, referring to FIGS. 4A and 4B, FIGS. 4A and 4B show that the first carrier transport layer 2 includes two first carrier transport sub-layers 21, the thickness D1 of the film layer with the low refractive index is greater than the thickness d1 of the film layer with the high refractive index. Here, the first carrier transport sub-layer 21 may be a hole transport sub-layer or an electron transport sub-layer.

For example, as shown in FIG. 4A, the light-emitting device 10 is upright, and the first carrier transport layer 2 is the hole transport layer. In this case, a film thickness of a first hole transport sub-layer with a low refractive index is greater than that of a second hole transport sub-layer with a high refractive index.

For example, as shown in FIG. 4B, the light-emitting device 10 is inverted, and the first carrier transport layer 2 is the electron transport layer. In this case, a film thickness of a first electron transport sub-layer with a low refractive index is greater than that of a second electron transport sub-layer with a high refractive index.

In some embodiments, in the at least two second carrier transport sub-layers 41, a thickness of a film layer with a low refractive index is greater than that of a film layer with a high refractive index. For example, in a direction away from the light-emitting layer 3, the thicknesses of the second carrier transport sub-layers 41 increase layer by layer.

For example, corresponding to scheme two, referring to FIGS. 4C and 4D, FIGS. 4C and 4D show that the second carrier transport layer 4 includes two second carrier transport sub-layers 41, the thickness D2 of the film layer with the low refractive index is greater than the thickness d2 of the film layer with the high refractive index. Here, the second carrier transport sub-layer 41 may be a hole transport sub-layer or an electron transport sub-layer.

For example, as shown in FIG. 4C, the light-emitting device 10 is upright, and the second carrier transport layer 4 is the electron transport layer. In this case, a film thickness of a first electron transport sub-layer with a low refractive index is greater than that of a second electron transport sub-layer with a high refractive index.

For example, as shown in FIG. 4D, the light-emitting device 10 is inverted, and the second carrier transport layer 4 is the hole transport layer. In this case, a film thickness of a first hole transport sub-layer with a low refractive index is greater than that of a second hole transport sub-layer with a high refractive index.

In some embodiments, in the at least two first carrier transport sub-layers 21, a thickness of a film layer with a low refractive index is greater than that of a film layer with a high refractive index; and in the at least two second carrier transport sub-layers 41, a thickness of a film layer with a low refractive index is greater than that of a film layer with a high refractive index. For example, in the direction away from the light-emitting layer 3, the thicknesses of the first carrier transport sub-layers 21 increase layer by layer, and the thicknesses of the second carrier transport sub-layers 41 increase layer by layer.

For example, corresponding to scheme three, referring to FIGS. 4E and 4F, FIGS. 4E and 4F show that the first carrier transport layer 2 includes two first carrier transport sub-layers 21, and the thickness D1 of the film layer with the low refractive index is greater than the thickness d1 of the film layer with the high refractive index; the second carrier transport layer 4 includes two second carrier transport sub-layers 41, and the thickness D2 of the film layer with the low refractive index is greater than the thickness d2 of the film layer with the high refractive index.

For example, as shown in FIG. 4E, the light-emitting device 10 is upright, the first carrier transport layer 2 is the hole transport layer, and in this case, a film thickness of a first hole transport sub-layer with a low refractive index is greater than that of a second hole transport sub-layer with a high refractive index; the second carrier transport layer 4 is the electron transport layer, and in this case, a film thickness of a first electron transport sub-layer with a low refractive index is greater than that of a second electron transport sub-layer with a high refractive index.

For example, as shown in FIG. 4F, the light-emitting device 10 is inverted, the first carrier transport layer 2 is the electron transport layer, and in this case, a film thickness of a first electron transport sub-layer with a low refractive index is greater than that of a second electron transport sub-layer with a high refractive index; the second carrier transport layer 4 is the hole transport layer, and a film thickness of a first hole transport sub-layer with a low refractive index is greater than that of a second hole transport sub-layer with a high refractive index.

In the above embodiments of the present disclosure, the thickness of the film layer with the low refractive index is greater than that of the film layer with the high refractive index, which means that in the first carrier transport layer or in the second carrier transport layer, the thickness proportion of the film layer with the low refractive index is higher. In the propagation of light generated by the light-emitting layer, it will propagate from the film layer with the high refractive index to the film layer with the low refractive index, i.e., from the optically denser medium to the optically rarer medium, so that part of the light will be reflected at the interface between the two film layers. The thickness of the film layer with the low refractive index is greater than that of the film layer with the high refractive index, and this part of the light can reach the interface of the two film layers through the thin film layer with the high refractive index, so that the reflection occurs, which is equivalent to further shortening the optical path. To a certain extent, in a case where the thicknesses of the higher film layers with the low refractive index are equal, part of the cavity lengths can be shortened to achieve a better light extraction effect.

The film structures and materials of the first carrier transport sub-layer 21 and the second carrier transport sub-layer 41 are introduced below. Each material has a specific microscopic morphology, and the occupancy of doped atoms, grain structures, orientation degrees, refractive indexes and other parameters of different materials are different. It should be noted that, in the drawings of the present disclosure, each filling pattern represents a material, and different filling patterns represent different materials.

In the at least two first carrier transport sub-layers and/or the at least two second carrier transport sub-layers, a film layer farthest from the light-emitting layer 3 may have various structures, for example, it may be of a whole layer structure or may have a plurality of patterned structures, which will be introduced separately below. In the at least two first carrier transport sub-layers, the film layer farthest away from the light-emitting layer 3 is a film layer adjacent to the first electrode 1; and in the at least two second carrier transport sub-layers, the film layer farthest away from the light-emitting layer 3 is a film layer adjacent to the second electrode 5.

In some embodiments, corresponding to scheme one, in the two first carrier transport sub-layers 21, the first carrier first transport sub-layer 24 is a continuous film layer (that is, the film layer with the low refractive index is set as a continuous film layer), and a material of the first carrier first transport sub-layer 24 is a first carrier first material. That is, the material of each position of the first carrier first transport sub-layer 24 has the same grain size range, the same grain orientation degree and the same refractive index, and the included atomic species are the same.

For example, referring to FIGS. 4A and 4B, the first carrier transport layer 2 shown in FIGS. 4A and 4B includes two first carrier transport sub-layers 21, which are the first carrier first transport sub-layer 24 and the first carrier second transport sub-layer 25; the first carrier first transport sub-layer 24 is the continuous film layer, and the material of the first carrier first transport sub-layer 24 is the first carrier first material. The continuous film layer can be understood that the first carrier first transport sub-layer 24 is a film layer arranged on the entire area of the first electrode 1, and a surface of the first carrier first transport sub-layer 24 is a plane, which is a continuous whole layer film. For example, the thickness of each position of the first carrier first transport sub-layer 24 is consistent, and the material of each position is the first carrier first material.

For example, as shown in FIG. 4A, the light-emitting device is upright, and the first carrier transport layer 2 includes two first carrier transport sub-layers 21. In this case, the first carrier transport sub-layers 21 are hole transport sub-layers, and the first carrier first transport sub-layer 24 in the hole transport sub-layers is the first hole transport sub-layer, which is a continuous film layer.

For example, as shown in FIG. 4B, the light-emitting device is inverted, and the first carrier transport layer 2 includes two first carrier transport sub-layers 21. In this case, the first carrier transport sub-layers 21 are electron transport sub-layers, and the first carrier first transport sub-layer 24 in the electron transport sub-layers is the first electron transport sub-layer, which is a continuous film layer.

In some embodiments, corresponding to scheme two, in the two second carrier transport sub-layers 41, the second carrier first transport sub-layer 42 is a continuous film layer (that is, the film layer with the low refractive index is set as a continuous film layer), and a material of the second carrier first transport sub-layer 42 is a second carrier first material. That is, the material of each position of the second carrier first transport sub-layer 42 has the same grain size range, the same grain orientation degree and the same refractive index, and the included atomic species are the same.

For example, referring to FIGS. 4C and 4D, the second carrier transport layer 4 shown in FIGS. 4C and 4D includes two second carrier transport sub-layers 41, which are the second carrier first transport sub-layer 42 and the second carrier second transport sub-layer 43; the second carrier first transport sub-layer 42 is the continuous film layer, and the material of the second carrier first transport sub-layer 42 is the second carrier first material. The continuous film layer can be understood that a surface of the second carrier first transport sub-layer 42 is a plane, which is a continuous whole layer film. For example, the thickness of each position of the second carrier first transport sub-layer 42 is consistent, and the material of each position is the second carrier first material.

For example, as shown in FIG. 4C, the light-emitting device is upright, and the second carrier transport layer 4 includes two second carrier transport sub-layers 41. In this case, the second carrier transport sub-layers 41 are electron transport sub-layers, and the second carrier first transport sub-layer 42 in the electron transport sub-layers is the first electron transport sub-layer, which is a continuous film layer.

For example, as shown in FIG. 4D, the light-emitting device is inverted, and the second carrier transport layer 4 includes two second carrier transport sub-layers 41. In this case, the second carrier transport sub-layers 41 are hole transport sub-layers, and the second carrier first transport sub-layer 42 in the hole transport sub-layers is the first hole transport sub-layer, which is a continuous film layer.

In some embodiments, corresponding to scheme three, in the two first carrier transport sub-layers 21, the first carrier first transport sub-layer 24 is set as the continuous film layer, and the material of the first carrier first transport sub-layer 24 is the first carrier first material; in the two second carrier transport sub-layers 41, the second carrier first transport sub-layer 42 is set as the continuous film layer, and the material of the second carrier first transport sub-layer 42 is the second carrier first material. That is, the material of each position of the first carrier first transport sub-layer 24 has the same grain size range, the same grain orientation degree and the same refractive index, and the included atomic species are the same. The material of each position of the second carrier first transport sub-layer 42 has the same grain size range, the same grain orientation degree and the same refractive index, and the included atomic species are the same.

For example, referring to FIGS. 4E and 4F, the first carrier transport layer 2 shown in FIGS. 4E and 4F includes two first carrier transport sub-layers 21 and the second carrier transport layer 4 shown in FIGS. 4E and 4F includes two second carrier transport sub-layers 41; the two second carrier transport sub-layers 41 are the second carrier first transport sub-layer 42 and the second carrier second transport sub-layer 43 respectively, the two first carrier transport sub-layers 21 are the first carrier first transport sub-layer 24 and the first carrier second transport sub-layer 25 respectively, and the second carrier first transport sub-layer 42 and the first carrier first transport sub-layer 24 are both continuous film layers. The continuous film layers can be understood that the surface of the second carrier first transport sub-layer 42 and the surface of the first carrier first transport sub-layer 24 are planes, which are continuous whole film layers.

For example, as shown in FIG. 4E, the light-emitting device is upright, and the first carrier transport layer 2 includes two first carrier transport sub-layers 21. In this case, the first carrier transport sub-layers 21 are the hole transport sub-layers, the first carrier first transport sub-layer 24 (the first hole transport sub-layer) is the continuous film layer, and the material of each position is the first carrier first material; the second carrier transport layer 4 includes two second carrier transport sub-layers 41. In this case, the second carrier transport sub-layers 41 are the electron transport sub-layers, and the second carrier first transport sub-layer 42 (the first electron transport sub-layer) is the continuous film layer, and the material of the second carrier first transport sub-layer 42 is the second carrier first material.

For example, as shown in FIG. 4F, the light-emitting device is inverted, the first carrier transport layer 2 includes two first carrier transport sub-layers 21. In this case, the first carrier transport sub-layers 21 are the electron transport sub-layers, and the first carrier first transport sub-layer 24 (the first electron transport sub-layer) is the continuous film layer. The second carrier transport layer 4 includes two second carrier transport sub-layers 41. In this case, the second carrier transport sub-layers 41 are the hole transport sub-layers, and the second carrier first transport sub-layer 42 (the first hole transport sub-layer) is the continuous film layer.

In the above embodiments, in the at least two first carrier transport sub-layers and/or the at least two second carrier transport sub-layers, in order to realize the difference between the high and low refractive indexes of film layers, it is necessary to process the film layer, so as to change its refractive index. For the specific process, reference is made to the introduction of the following method part. The first carrier first transport sub-layer 24 and the second carrier first transport sub-layer 42, i.e., the film layers with the low refractive index, are set as continuous film layers; in this way, the whole film layer can be directly processed in the fabrication process to change its refractive index, the fabrication process is simple, and the process steps are reduced.

Figure 4G:
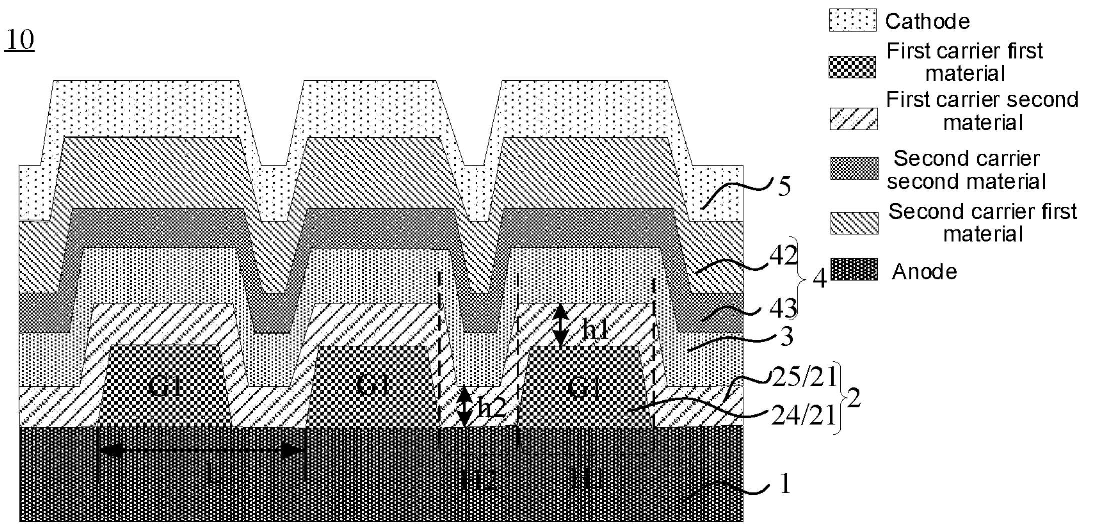
FIG. 4G is a structural diagram of yet another light-emitting device, in accordance with some embodiments of the present disclosure.

In some embodiments, as shown in FIG. 4G, in the two first carrier transport sub-layers 21, the first carrier first transport sub-layer 24 includes a plurality of patterned structures G1 spaced apart from each other, and materials of the plurality of patterned structures G1 are the first carrier first material; the first carrier second transport sub-layer 25 includes a first portion H1 disposed on a side of the plurality of patterned structures G1 of the first carrier first transport sub-layer 24 away from the first electrode 1, and a second portion H2 disposed on the first electrode 1 and in contact with the first electrode 1. Thicknesses of the first portion H1 and the second portion H2 of the first carrier second transport sub-layer 25 are equal (as shown in FIG. 4G, the thickness h1 of the first portion H1 is equal to the thickness h2 of the second portion H2), and a surface of the first carrier second transport sub-layer 25 away from the first electrode 1 is not in the same plane; and materials of the first portion H1 and the second portion H2 of the first carrier second transport sub-layer 25 are both the first carrier second material.

It should be noted that the equal thickness here includes absolute equality and equality within the error range.

For example, referring to FIG. 4G, the first carrier transport layer 2 in the light-emitting device 10 includes two first carrier transport sub-layers 21, and the two first carrier transport sub-layers 21 may be the hole transport sub-layers or electron transport sub-layers. In a case where the light-emitting device 10 is upright, the first carrier transport sub-layers 21 are the hole transport sub-layers. In a case where the light-emitting device 10 is inverted, the first carrier transport sub-layers 21 are the electron transport sub-layers. FIG. 4G shows the case where the light-emitting device 10 is upright, the first carrier first transport sub-layer 24 is the first hole transport sub-layer including the plurality of patterned structures G1, and the first carrier second transport sub-layer 25 is the second hole transport sub-layer.

It can be understood that, the surface of the first portion H1 of the first carrier second transport sub-layer 25 away from the light-emitting layer 3 is in contact with the surfaces of the patterned structures G1 proximate the light-emitting layer 3, and the second portion H2 is filled in the gaps between the patterned structures G1. For example, the first carrier second transport sub-layer 25 is formed by depositing the second carrier second material onto the patterned structures G1 through a deposition process. Therefore, the first portion H1 and the second portion H2 here are integrated, the first carrier second transport sub-layer 25 is a continuous film layer covering the patterned structures G1 of the first carrier first transport sub-layer 24, and the materials of the first portion H1 and the second portion H2 are both the first carrier second material. Since the first carrier second material is mostly inorganic, and the patterned structures G1 are uneven, the surface of the first carrier second transport sub-layer 25 also presents an uneven shape with the patterned structures G1, and the surface of the first carrier second transport sub-layer 25 away from the first electrode 1 is not on the same surface.

For example, as shown in FIG. 4G, the light-emitting layer 3, the second carrier transport layer 4 (for example, including the second carrier first transport sub-layer 42 and the second carrier second transport sub-layer 43) and the second electrode 5 are inorganic film layers sequentially formed on the first carrier second transport sub-layer 25; the surfaces of the light-emitting layer 3, the second carrier transport layer 4 and the second electrode 5 all present uneven shapes with the surface shape of the first carrier second transport sub-layer 25, and the surfaces of the light-emitting layer 3, the second carrier transport layer 4 and the second electrode 5 are all uneven.

Figure 5A:
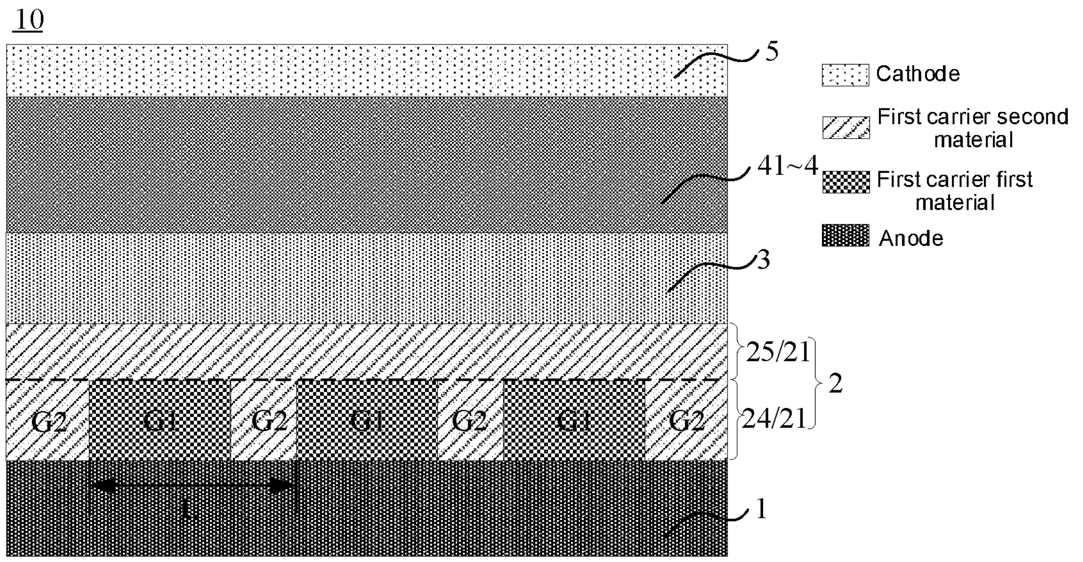
FIG. 5A is a structural diagram of a light-emitting device, in accordance with some embodiments of the present disclosure.

In some embodiments, as shown in FIG. 5A, in the two first carrier transport sub-layers 21, the first carrier first transport sub-layer 24 is a continuous film layer, and includes a plurality of patterned structures G1 spaced apart from each other and other structures G2 except the plurality of patterned structures G1; a surface of the first carrier first transport sub-layer 24 away from the first electrode is in a same plane. The first carrier second transport sub-layer 25 is a continuous film layer, and a material of the first carrier second transport sub-layer 25 and a material of the other structures G2 of the first carrier first transport sub-layer 24 are both the first carrier second material, and a material of the plurality of patterned structures G1 of the first carrier first transport sub-layer 24 is the first carrier first material.

For example, referring to FIGS. 5A to 5E, the first carrier transport layer 2 shown in FIGS. 5A to 5E includes two first carrier transport sub-layers 21; the first carrier first transport sub-layer 24 is the continuous film layer, and includes the plurality of patterned structures G1 spaced apart from each other and other structures G2 except the plurality of patterned structures G1. The two first carrier transport sub-layers 21 may be the hole transport sub-layers or electron transport sub-layers. In a case where the light-emitting device 10 is upright, the first carrier transport sub-layers 21 are the hole transport sub-layers. In a case where the light-emitting device 10 is inverted, the first carrier transport sub-layers 21 are the electron transport sub-layers. FIGS. 5A to 5E show the case where the light-emitting device 10 is upright, the first carrier first transport sub-layer 24 is the first hole transport sub-layer and includes the plurality of patterned structures G1 and other structures G2 except the plurality of patterned structures G1, the first carrier second transport sub-layer 25 is the second hole transport sub-layer and is the continuous film layer.

It can be understood that, the material of the plurality of patterned structures G1 in the first carrier first transport sub-layer 24 is the first carrier first material, and the material of the other structures G2 except the plurality of patterned structures G1 in the first carrier first transport sub-layer 24 is the first carrier second material. As shown in FIGS. 5A to 5E, materials of positions of the first carrier first transport sub-layer 24 are different, but the first carrier first transport sub-layer 24 is the continuous film layer; the plurality of patterned structures G1 and the other structures G2 are made of different materials. Due to the need to change the refractive index of a specific region of the first carrier first transport sub-layer 24, the difference between the two materials is caused by processing the material in the specific region during the fabrication process.

It should be noted that, the plurality of patterned structures G1 and the other structures G2 in the first carrier first transport sub-layer 24 are made of different materials, and the refractive indexes corresponding different materials are also different. The refractive index of the first carrier first material is less than the refractive index of the first carrier second material, so that the overall refractive index of the first carrier first transport sub-layer 24 is less than the refractive index of the first carrier second transport sub-layer 25.

In some embodiments, as shown in FIGS. 6A to 6E, in the two second carrier transport sub-layers 41, the second carrier first transport sub-layer 42 includes a plurality of patterned structures G1 spaced apart from each other, and a material of the plurality of patterned structures G1 of the second carrier first transport sub-layer 42 is a second carrier first material. The second carrier second transport sub-layer 43 includes a first portion H1 disposed on a side of the plurality of patterned structures G1 of the second carrier first transport sub-layer 42 away from the second electrode 5, and a second portion H2 disposed on a side of the second electrode 5 and in contact with the second electrode 5. Materials of the first portion H1 and the second portion H2 of the second carrier second transport sub-layer 43 are both a second carrier second material. Thicknesses of the first portion H1 and the second portion H2 of the second carrier second transport sub-layer 43 are not equal, and a thickness t2 of the second portion H2 of the second carrier second transport sub-layer 43 is equal to a sum of a thickness t1 of the first portion H1 of the second carrier second transport sub-layer 43 and a thickness t3 of the second carrier first transport sub-layer 42. For example, a surface of the second carrier second transport sub-layer 43 proximate to the light-emitting layer 3 is in the same plane.

For example, referring to FIGS. 6A to 6E, the plurality of patterned structures G1 of the second carrier first transport sub-layer 42 are arranged in an array, and the distance L between adjacent patterned structures G1 is equal; the second carrier second transport sub-layer 43 is filled in the gaps of the plurality of patterned structures G1, and is located on the side of the plurality of patterned structures G1 proximate to the light-emitting layer. The materials of the second carrier first transport sub-layer 42 and the second carrier second transport sub-layer 43 are different, this is because the plurality of patterned structures are processed to change their refractive index during the fabrication process, resulting in corresponding changes in the material.

It should be noted that, the thicknesses of the first portion H1 and the second portion H2 of the second carrier second transport sub-layer 43 are not equal, and the surface of the second carrier second transport sub-layer 43 proximate to the light-emitting layer 3 is a flat plane. The thickness of the second portion H2 of the second carrier second transport sub-layer 43 is equal to the sum of the thickness of the first portion H1 of the second carrier second transport sub-layer 43 and the thickness of the second carrier first transport sub-layer 42. A distance from the surface of the second carrier first transport sub-layer 42 in contact with the second carrier second transport sub-layer 43 to the second electrode 5 is the thickness of the second carrier first transport sub-layer 42. The thickness setting here does not affect each other with the thickness of the film layer with the low refractive index being greater than the thickness of the film layer with the high refractive index in the second carrier transport layer, and the two do not conflict.

For example, referring to FIGS. 6A to 6E, the second carrier transport layer 4 shown in FIGS. 6A to 6E includes two second carrier transport sub-layers 41, and the two second carrier transport sub-layers 41 may be the hole transport sub-layers or electron transport sub-layers. In a case where the light-emitting device 10 is upright, the second carrier transport sub-layers 41 are the electron transport sub-layers. In a case where the light-emitting device 10 is inverted, the second carrier transport sub-layers 41 are the hole transport sub-layers. FIGS. 6A to 6E show the case where the light-emitting device 10 is upright, the second carrier first transport sub-layer 42 is the first electron transport sub-layer including the plurality of patterned structures G1, and the second carrier second transport sub-layer 43 is the second electron transport sub-layer.

Figure 7A:
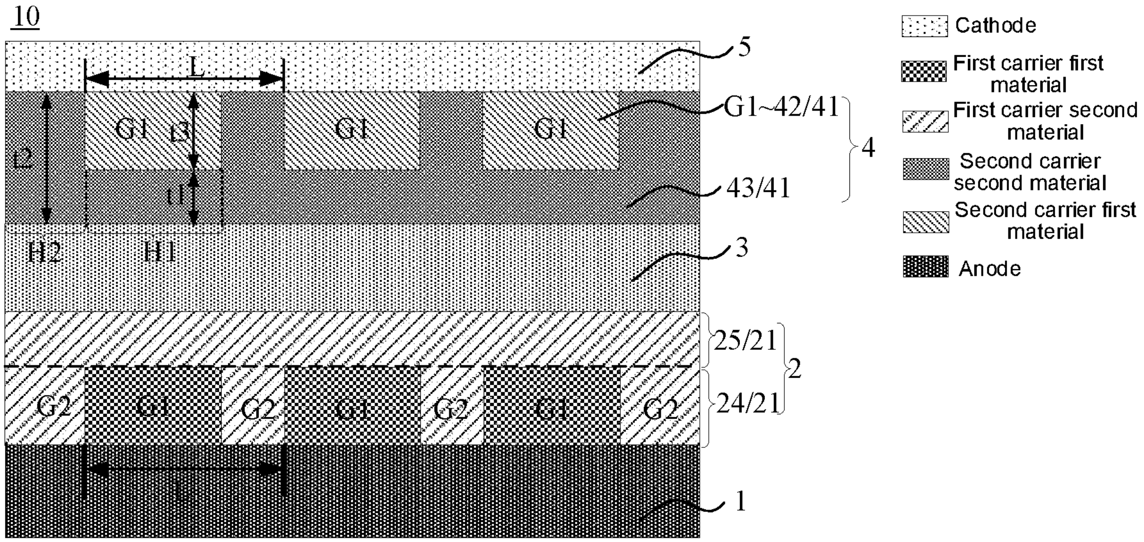
FIG. 7A is a structural diagram of a light-emitting device, in accordance with some embodiments of the present disclosure.

In some embodiments, corresponding to scheme there, as shown in FIG. 7A, in the two first carrier transport sub-layers 21, the first carrier first transport sub-layer 24 is a continuous film layer, and includes a plurality of patterned structures G1 and other structures G2 except the plurality of patterned structures. In the two second carrier transport sub-layers 41, the second carrier first transport sub-layer 42 includes a plurality of patterned structures G1, and the second carrier second transport sub-layer 43 includes a first portion H1 on a side of the plurality of patterned structures G1 of the second carrier first transport sub-layer 42 away from the second electrode 5, and a second portion H2 disposed on a side of the second electrode 5 and in contact with the second electrode 5; materials of the first portion H1 and the second portion H2 of the second carrier second transport sub-layer 43 are both the second carrier second material.

For example, referring to FIGS. 7A to 7E, the first carrier transport layer 2 shown in FIGS. 7A to 7E includes two first carrier transport sub-layers 21, and the second carrier transport layer 4 shown in FIGS. 7A to 7E includes two second carrier transport sub-layers 41. In a case where the light-emitting device 10 is upright, the first carrier transport sub-layers 21 are the hole transport sub-layers, and the second carrier transport sub-layers 41 are the electron transport sub-layers. In a case where the light-emitting device 10 is inverted, the first carrier transport sub-layers 21 are the electron transport sub-layers, and the second carrier transport sub-layers 41 are the hole transport sub-layers. FIGS. 7A to 7E show the case where the light-emitting device 10 is upright. The first carrier first transport sub-layer 24 in the first carrier transport sub-layers 21 and the second carrier first transport sub-layer 42 in the second carrier transport sub-layers 41 both includes the plurality of patterned structures G1, and the plurality of patterned structures G1 can increase the convergence of light and improve the front light extraction efficiency.

In the above light-emitting device, the second carrier first transport sub-layer 42 includes the plurality of patterned structures G1, and the plurality of patterned structures G1 means that the film layer is not a continuous whole layer, but is separated into independent patterns; the second carrier second transport sub-layer 43 fills the gaps between the plurality of patterned structures G1, and is located on the side of the second carrier first transport sub-layer 42 proximate to the light-emitting layer, and the materials of the first portion H1 and the second portion H2 of the second carrier second transport sub-layer 43 are both the second carrier second material. In the first carrier first transport sub-layer 24, it includes the plurality of patterned structures G1 spaced apart from each other and other structures G2 except the plurality of patterned structures G1; the first carrier first transport sub-layer 24 is a continuous film layer, and the materials of the plurality of patterned structures G1 and other structures G2 are different; and the first carrier second transport sub-layer is a continuous film layer. The structure of the first carrier transport layer 2 is different from that of the second carrier transport layer 4 (according to the different fabrication processes, the film layer division method is different), but they both have the plurality of patterned structures G1, which may make different regions have different refractive indexes. Thus, the reflection and refraction of light are more abundant, and the light extraction efficiency is better; and the plurality of patterned structures G1 may form a structure similar to the micro-prism, which can increase the convergence of light and improve the front light extraction efficiency.

In two adjacent patterned structures G1, the distance L between the same positions is in a range of 500 nm to 3000 nm.

In some embodiments, cross-sectional areas of at least one patterned structure G1 in the plurality of patterned structures G1 gradually increase or remain unchanged in a direction away from the light-emitting layer 3, the cross-sectional area of the patterned structure G1 being an area of a cross-section obtained by taking a section of the patterned structure G1 along a plane parallel to the light-emitting layer 3.

The cross-sectional areas of the patterned structure G1 gradually increase in the direction away from the light-emitting layer 3, which indicates that the patterned structure is a structure with narrow top and wide bottom. The "top" refers to the side proximate to the light-emitting layer 3. In this way, the patterned structure G1 is equivalent to a micro-prism or convex mirror structure, which can increase the convergence of light and improve the light extraction efficiency.

In some embodiments, the three-dimensional shape of the patterned structure G1 includes at least one of a prism, a semi-cylinder, a pyramid, a hemisphere, a semi-ellipsoid, and a truncated pyramid.

Figure 5B:
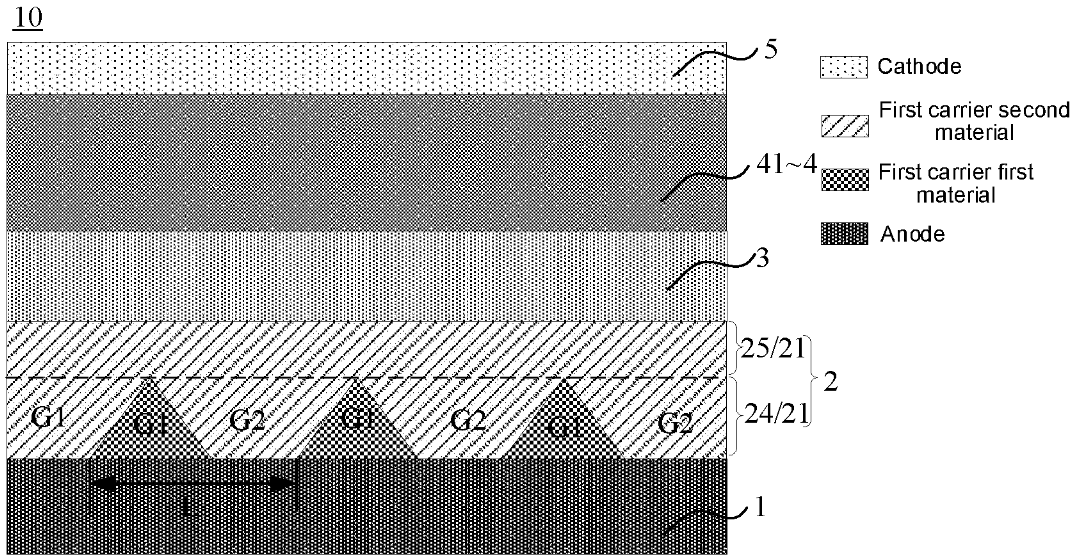
FIG. 5B is a structural diagram of another light-emitting device, in accordance with some embodiments of the present disclosure.
Figure 5C:
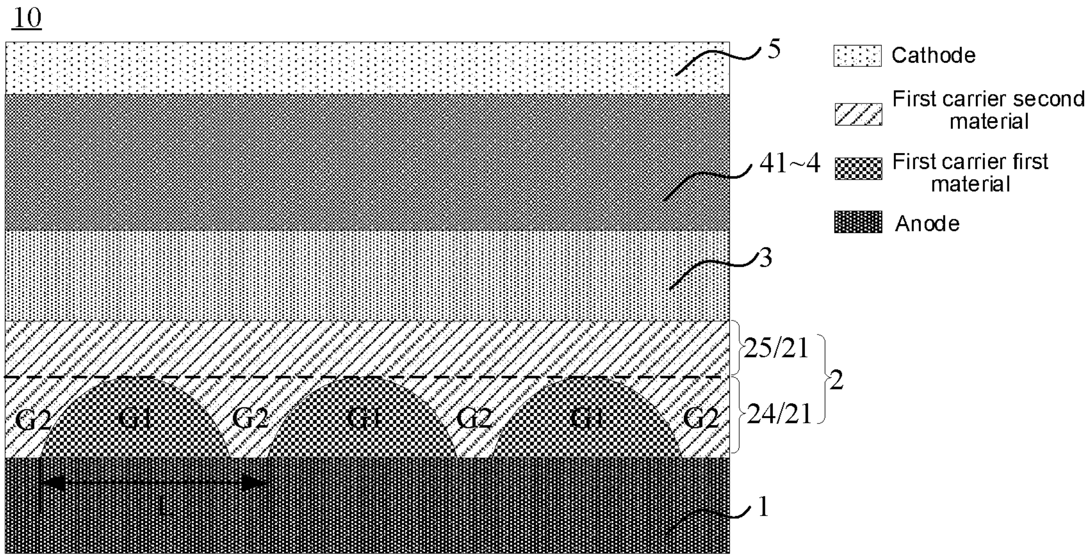
FIG. 5C is a structural diagram of yet another light-emitting device, in accordance with some embodiments of the present disclosure.
Figure 5D:
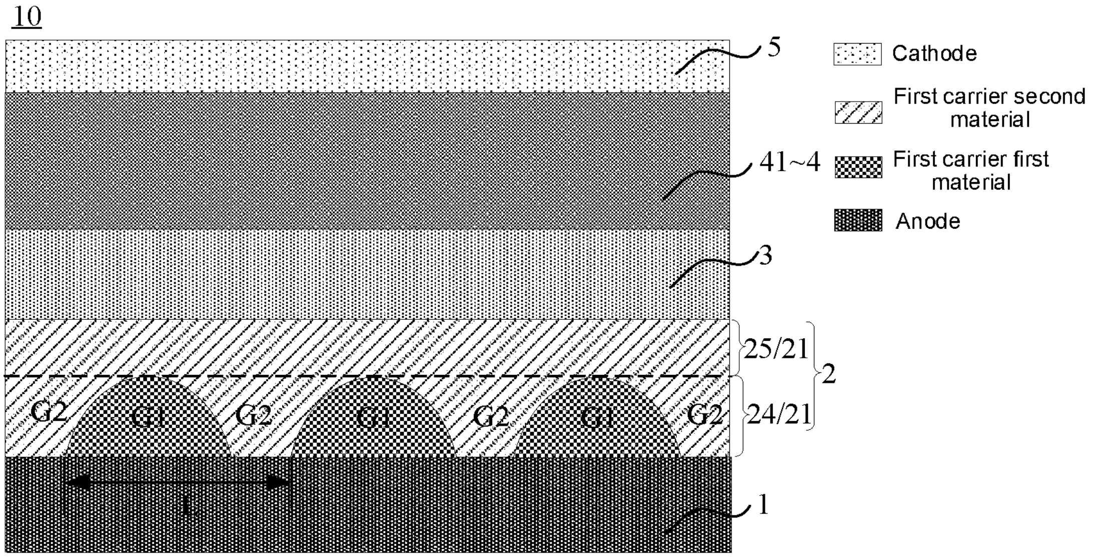
FIG. 5D is a structural diagram of yet another light-emitting device, in accordance with some embodiments of the present disclosure.
Figure 5E:
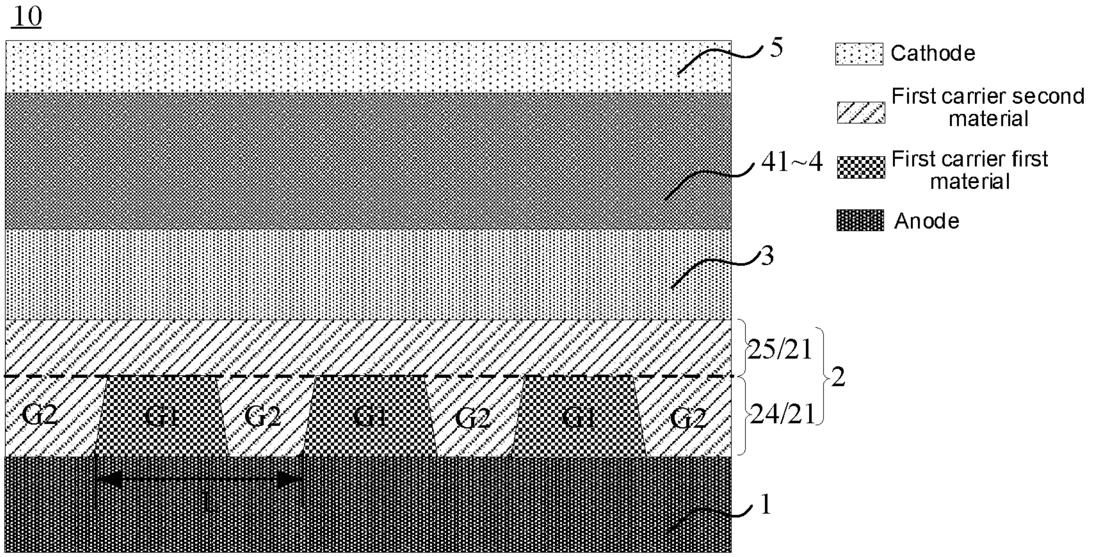
FIG. 5E is a structural diagram of yet another light-emitting device, in accordance with some embodiments of the present disclosure.
Figure 6A:
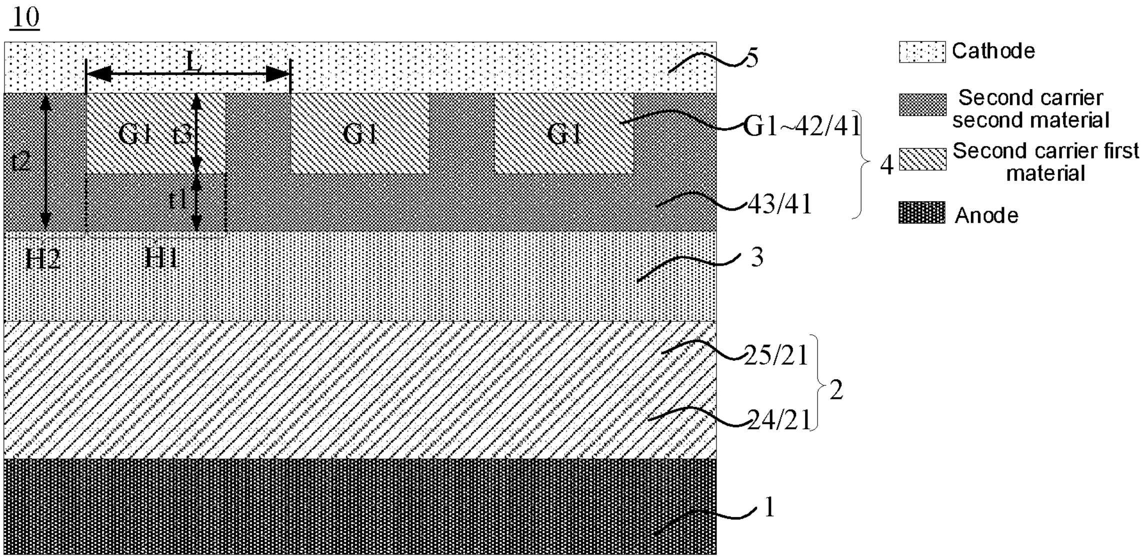
FIG. 6A is a structural diagram of a light-emitting device, in accordance with some embodiments of the present disclosure.
Figure 6B:
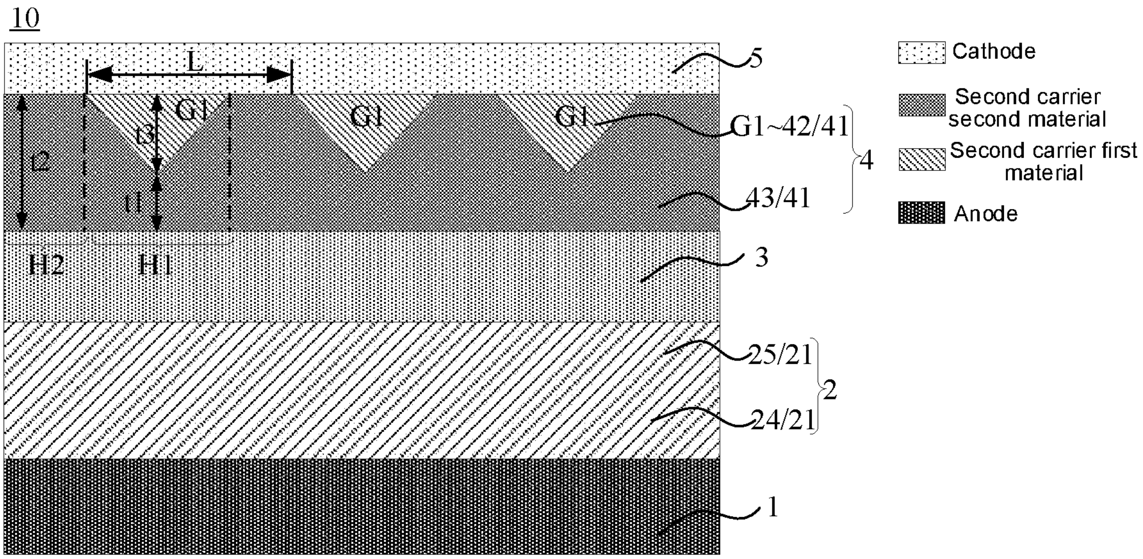
FIG. 6B is a structural diagram of another light-emitting device, in accordance with some embodiments of the present disclosure.
Figure 6C:
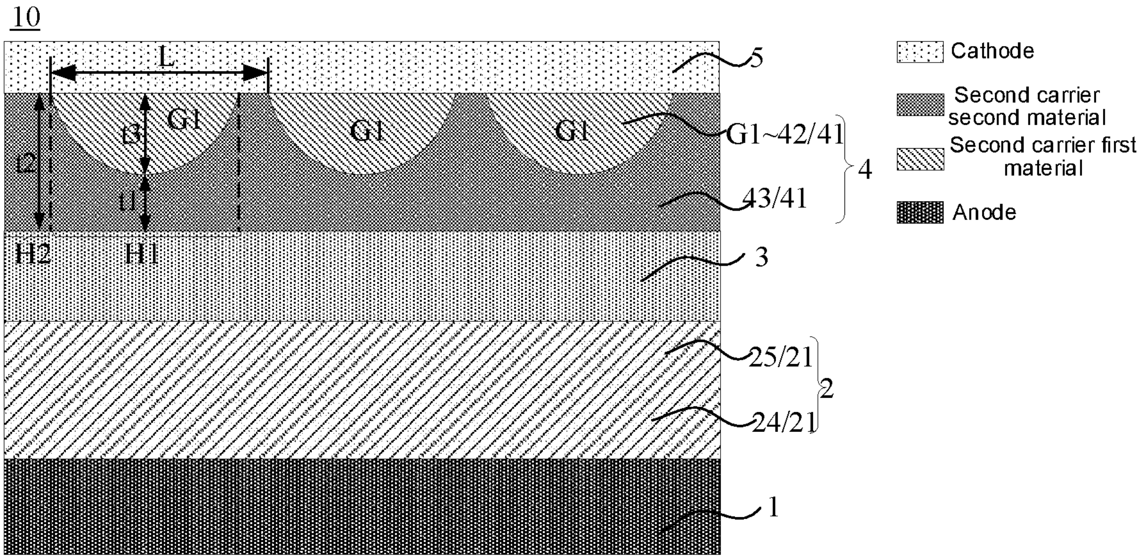
FIG. 6C is a structural diagram of yet another light-emitting device, in accordance with some embodiments of the present disclosure.
Figure 6D:
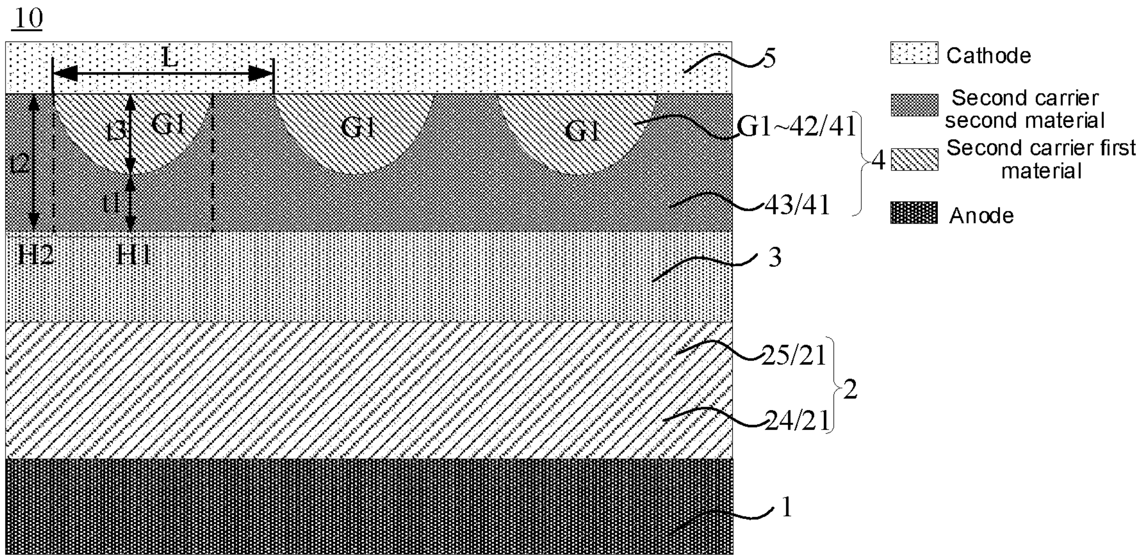
FIG. 6D is a structural diagram of yet another light-emitting device, in accordance with some embodiments of the present disclosure.
Figure 6E:
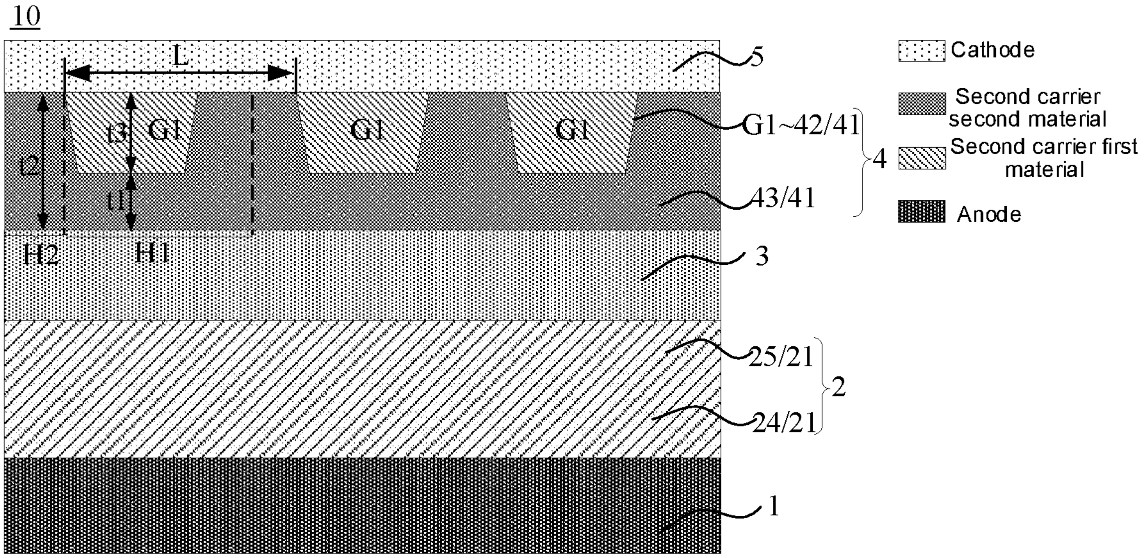
FIG. 6E is a structural diagram of yet another light-emitting device, in accordance with some embodiments of the present disclosure.
Figure 7B:
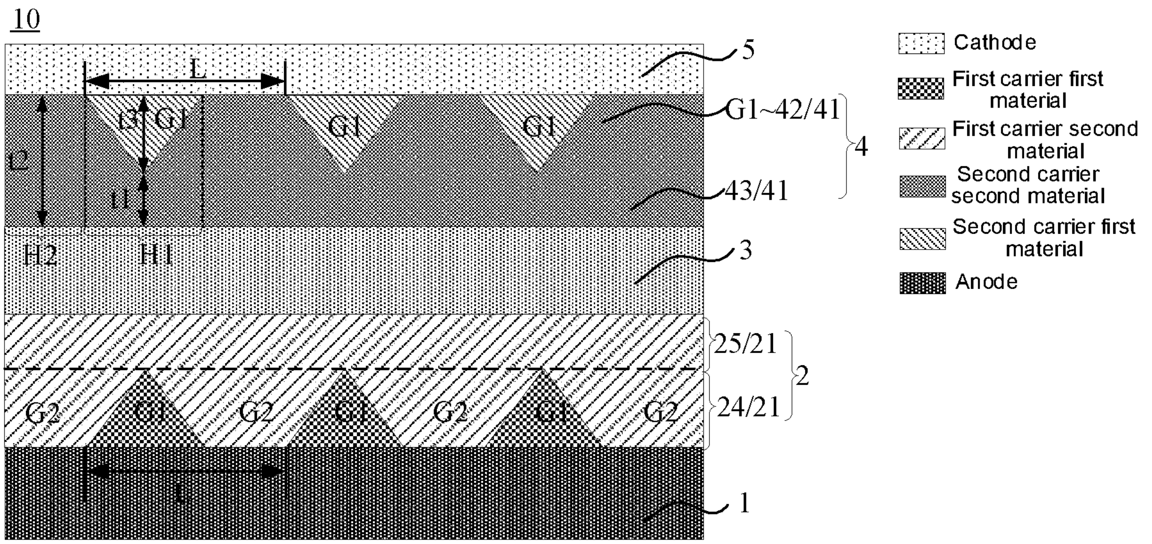
FIG. 7B is a structural diagram of another light-emitting device, in accordance with some embodiments of the present disclosure.
Figure 7C:
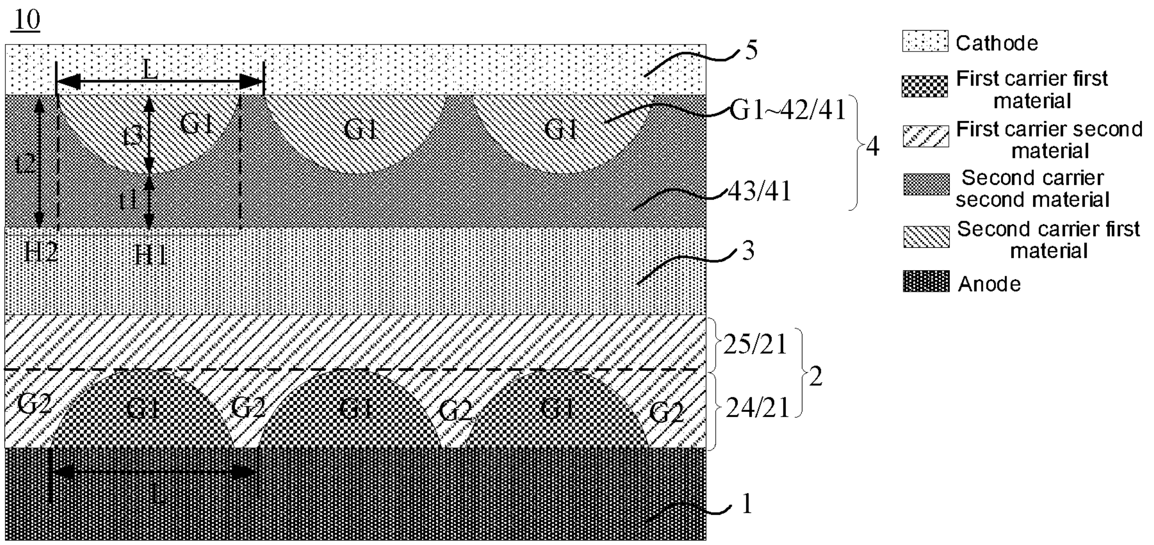
FIG. 7C is a structural diagram of yet another light-emitting device, in accordance with some embodiments of the present disclosure.
Figure 7D:
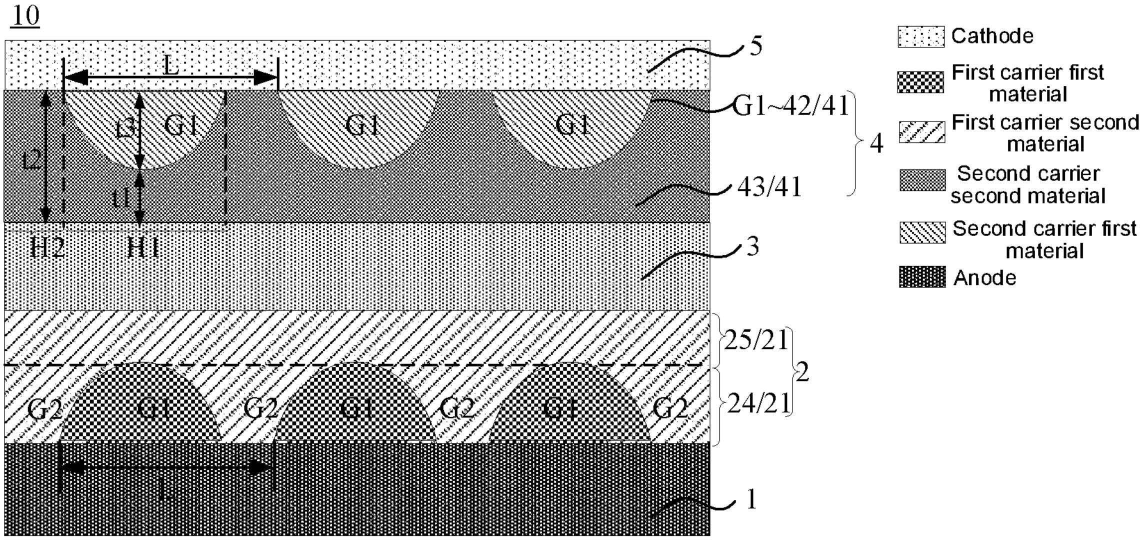
FIG. 7D is a structural diagram of yet another light-emitting device, in accordance with some embodiments of the present disclosure.
Figure 7E:
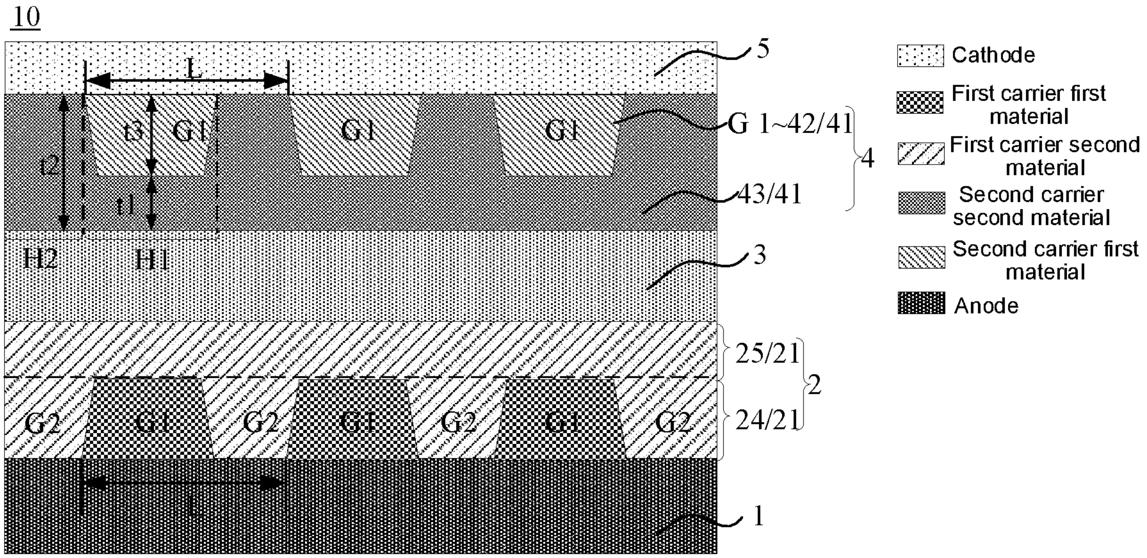
FIG. 7E is a structural diagram of yet another light-emitting device, in accordance with some embodiments of the present disclosure.

For example, as shown in FIGS. 5A to 5E, 6A to 6E, and 7A to 7E, FIGS. 5A to 5E, 6A to 6E, and 7A to 7E all show the section of the patterned structure G1. The section of the patterned structure G1 in FIGS. 5A, 6A and 7A is rectangular, and its three-dimensional shape may be a quadrangular prism. In this case, the cross-sectional areas of the patterned structure G1 remains unchanged in the direction away from the light-emitting layer 3. The section of the patterned structure G1 in FIGS. 5B, 6B and 7B is triangular, and its three-dimensional shape may be a triangular pyramid or a triangular prism. In this case, the cross-sectional areas of the patterned structure G1 gradually increase in the direction away from the light-emitting layer 3. The section of the patterned structure G1 in FIGS. 50, 6C and 7C is semi-elliptical, and its three-dimensional shape may be a semi-ellipsoid; thus, the cross-sectional areas of the patterned structure G1 gradually increase in the direction away from the light-emitting layer 3. The section of the patterned structure G1 in FIGS. 5D, 6D and 7D is semi-circular, and its three-dimensional shape may be a semi-cylinder or hemisphere. In this case, the cross-sectional areas of the patterned structure G1 gradually increase in the direction away from the light-emitting layer 3. The section of the patterned structure G1 in FIGS. 5E, 6E and 7E is trapezoidal, and its three-dimensional shape may be a truncated pyramid. In this case, the cross-sectional areas of the patterned structure G1 gradually increase in the direction away from the light-emitting layer 3. By setting different shapes of the patterned structure G1 above, the convergence of light can be increased, thereby improving the light extraction efficiency.

In the above embodiments, in a case where the patterned structures G1 are hemispheres arranged in an array, which are equivalent to being composed of countless triangular prisms; thus, the light can converge in any direction, the light convergence effect is the best, and the light extraction efficiency can be better improved.

In some embodiments, the refractive index of the film layer may be changed by annealing; correspondingly, the microscopic properties of the material of the film layer before and after annealing are changed.

In some embodiments, in the two first carrier transport sub-layers 21, a grain size of the first carrier first material is greater than that of the first carrier second material, and grain boundaries of the first carrier first material are sharper than those of the first carrier second material.

For example, referring to FIGS. 4A and 4B, in the two first carrier transport sub-layers 21, the grain size of the first carrier first material is greater than that of the first carrier second material, and the grain boundaries of the first carrier first material are sharper than those of the first carrier second material, which are because the material of the film layer with low refractive index includes the first carrier first material, the film layer with low refractive index is obtained by performing an annealing process on an initial film layer with high refractive index, and the microscopic properties of the first carrier first material have changed compared with before. Thus, the grain size of the film after annealing will increase and the grain boundaries will be clear. The film layer with high refractive index has not undergone the annealing process. Therefore, the grain size before annealing is small. For example, the grain size before annealing is less than 10 nm, and the grain boundaries are blurred.

In some embodiments, in the two second carrier transport sub-layers 41, a grain size of the second carrier first material is greater than that of the second carrier second material, and grain boundaries of the second carrier first material are sharper than those of the second carrier second material.

For example, referring to FIGS. 4C and 4D, in the two second carrier transport sub-layers 41, the grain size of the second carrier first material is greater than that of the second carrier second material, and the grain boundaries of the second carrier first material are sharper than those of the second carrier second material, which are because the material of the film layer with low refractive index includes the second carrier first material, the film layer with low refractive index is obtained by performing the annealing process on an initial film layer with high refractive index, and the microscopic properties of the second carrier first material have changed compared with before. Thus, the grain size of the film after annealing will increase and the grain boundaries will be clear. The film layer with high refractive index has not undergone the annealing process. Therefore, the grain size before annealing is small. For example, the grain size before annealing is less than 10 nm, and the grain boundaries are blurred.

In some embodiments, referring to FIGS. 4E and 4F, in the two first carrier transport sub-layers 21, the grain size of the first carrier first material is greater than that of the first carrier second material, and the grain boundaries of the first carrier first material are sharper than those of the first carrier second material; in the two second carrier transport sub-layers 41, the grain size of the second carrier first material is greater than that of the second carrier second material, and the grain boundaries of the second carrier first material are sharper than those of the second carrier second material.

For example, in the two first carrier transport sub-layers 21, the grain size of the first carrier first material is greater than that of the first carrier second material, and the grain boundaries of the first carrier first material are sharper than those of the first carrier second material, which are because the material of the film layer with low refractive index includes the first carrier first material, the film layer with low refractive index is obtained by performing an annealing process on an initial film layer with high refractive index, and the microscopic properties of the first carrier first material have changed compared with before. Thus, the grain size of the film after annealing will increase and the grain boundaries will be clear. The film layer with high refractive index has not undergone the annealing process. Therefore, the grain size before annealing is small. For example, the grain size before annealing is less than 10 nm, and the grain boundaries are blurred. In the two second carrier transport sub-layers 41, the grain size of the second carrier first material is greater than that of the second carrier second material, and the grain boundaries of the second carrier first material are sharper than those of the second carrier second material, which are because the material of the film layer with low refractive index includes the second carrier first material, the film layer with low refractive index is obtained by performing the annealing process on an initial film layer with high refractive index, and the microscopic properties of the second carrier first material have changed compared with before. Thus, the grain size of the film after annealing will increase and the grain boundaries will be clear. The film layer with high refractive index has not undergone the annealing process. Therefore, the grain size before annealing is small. For example, the grain size before annealing is less than 10 nm, and the grain boundaries are blurred.

In some embodiments, the refractive index of the film layer may be changed by ion implantation; correspondingly, the microscopic properties of the material of the film layer before and after ion implantation are changed.

In some embodiments, the same host atoms are included in the first carrier first material and the first carrier second material, and the first carrier first material further includes metal doped atoms.

For example, as shown in FIG. 4A, the same host atoms (e.g., oxygen atoms and zinc atoms, or oxygen atoms, zinc atoms and magnesium atoms) are included in the first carrier first material and the first carrier second material, and the host atoms constitute the host material of the first carrier first material and the first carrier second material. For example, the first carrier first material and the first carrier second material are fabricated by zinc oxide as a whole, and then the refractive index of the first carrier first material is changed through a process (e.g., ion implantation) to reduce its refractive index. Thus, the first carrier first material further includes dopant atoms.

In some embodiments, the same host atoms are included in the second carrier first material and the second carrier second material, and the second carrier first material further includes metal doped atoms.

For example, as shown in FIG. 4C, the same host atoms (e.g., oxygen atoms and zinc atoms, or oxygen atoms, zinc atoms and magnesium atoms) are included in the second carrier first material and the second carrier second material, and the host atoms constitute the host material of the second carrier first material and the second carrier second material. For example, the second carrier first material and the second carrier second material are fabricated by zinc oxide as a whole, and then the refractive index of the second carrier first material is changed through a process (e.g., ion implantation) to reduce its refractive index. Thus, the second carrier first material further includes dopant atoms.

For example, as shown in FIG. 4C, the light-emitting device 10 is upright, the second carrier transport layer 4 is the electron transport layer, and the whole is a zinc oxide (ZnO) film layer, or a zinc oxide film layer doped with magnesium. The ion implantation is performed on the electron transport layer to change the refractive index of the surface portion of the electron transport layer. This is mainly achieved by high-energy ions impacting the surface lattice of ZnO, causing atoms in the surface lattice to enter the interior of the film layer to form lattice damage, and thereby reducing the refractive index. The implanted ions (such as high-energy oxygen ions, silicon ions, helium ions or rare earth metal thulium ions) enter the surface portion of the electron transport layer to form the second carrier first transport sub-layer 42, i.e., the first electron transport sub-layer. Therefore, the second carrier first transport sub-layer 42 further includes dopant atoms. For example, the dopant atoms are at least one of the silicon atoms, helium atoms or thulium atoms.

In some embodiments, the same host atoms are included in the first carrier first material and the first carrier second material, and the first carrier first material further includes metal doped atoms; the same host atoms are included in the second carrier first material and the second carrier second material, and the second carrier first material further includes metal doped atoms.

For example, the same host atoms are included in the first carrier first material and the first carrier second material, and the same host atoms are included in the second carrier first material and the second carrier second material. For example, the host atoms include oxygen atoms and zinc atoms, or oxygen atoms, zinc atoms and magnesium atoms. The refractive index of the first carrier first transport sub-layer 24 and the refractive index of the second carrier first transport sub-layer 42 need to be reduced, e.g., by ion implantation, so that dopant atoms are also included in the first carrier first material and the second carrier first material.

Figure 16A:
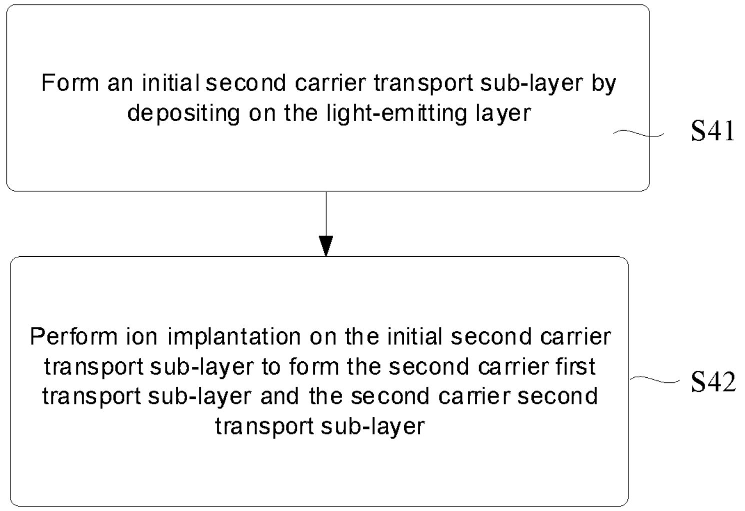
FIG. 16A is another flow chart of a manufacturing method for a light-emitting device, in accordance with some embodiments of the present disclosure.
Figure 16B:
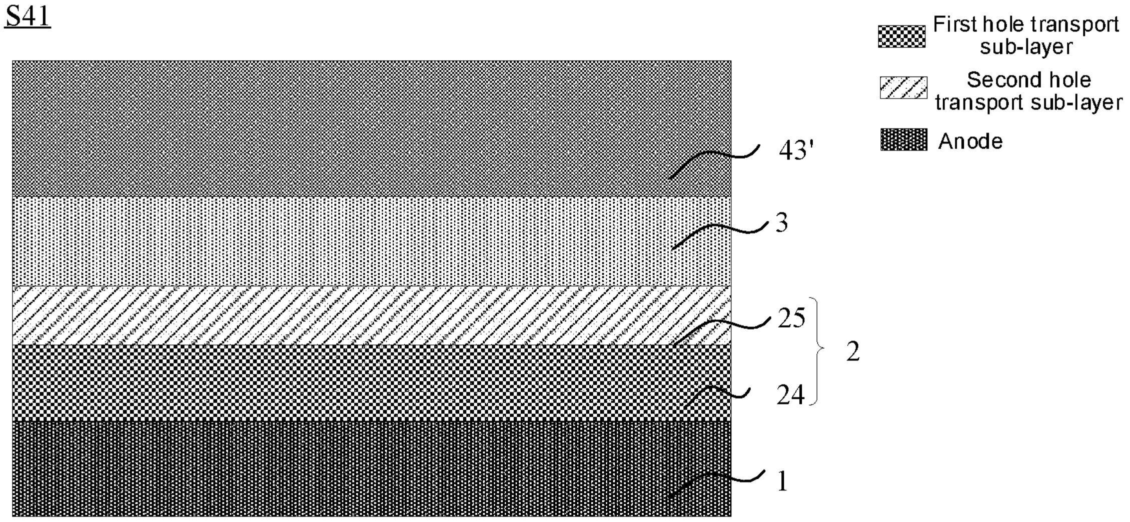
FIG. 16B is a process diagram of a manufacturing method for a light-emitting device, in accordance with some embodiments of the present disclosure.
Figure 16C:
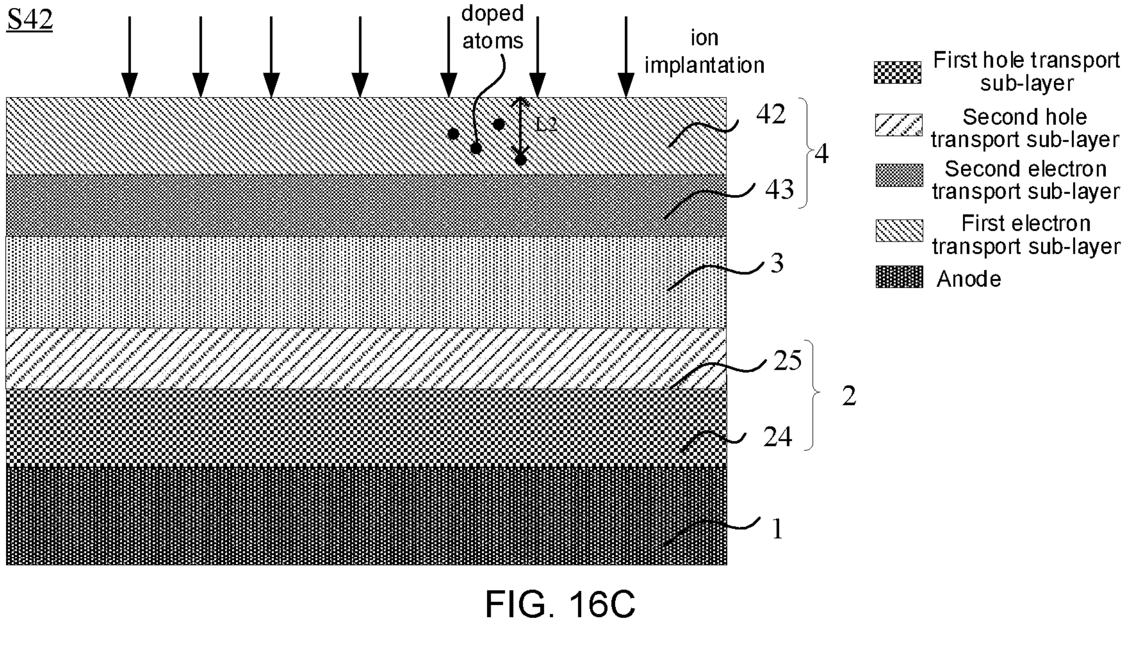
FIG. 16C is another process diagram of a manufacturing method for a light-emitting device, in accordance with some embodiments of the present disclosure.

In some embodiments, as shown in FIG. 16C, the refractive index of the second carrier first transport sub-layer 42 is changed by the ion implantation process, and the concentration of the doped atoms in the second carrier first transport sub-layer 42 decreases exponentially with the depth of the doped atoms in the second carrier first transport sub-layer 42, and the distance between the doped atoms increases as the depth of the doped atoms in the second carrier first transport sub-layer 42 increases. The depth of the doped atoms in the second carrier first transport sub-layer 42 is a distance L2 between the doped atoms and a surface of the second carrier first transport sub-layer 42 away from the first electrode 1.

By using the ion implantation, the doping amount at positions of the second carrier first transport sub-layer 42 is not uniformly distributed, and the concentration of the implanted ions (the concentration of the doped atoms) decreases exponentially with the depth of the implanted ions in the second carrier first transport sub-layer 42. The change degree of the refractive index of the film layer is related to the dose of ion implantation. For example, as the depth of the film layer increases, the refractive index of the second carrier first transport sub-layer 42 gradually changes. The distance between the implanted ions (the distance between the doped atoms) increases as the depth of the doped atoms in the second carrier first transport sub-layer 42 increases. That is, the concentration of doped atoms on a side of the second carrier first transport sub-layer 42 away from the first electrode 1 is the highest.

Figure 15D:
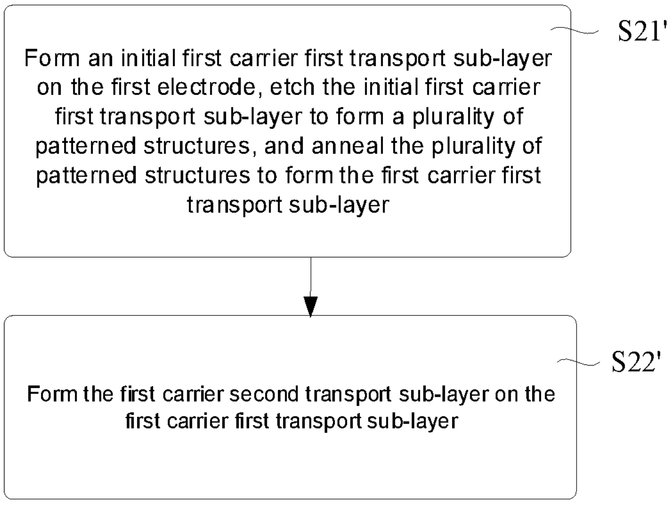
FIG. 15D is a flow chart of a manufacturing method for a light-emitting device, in accordance with some embodiments of the present disclosure.
Figure 15E:
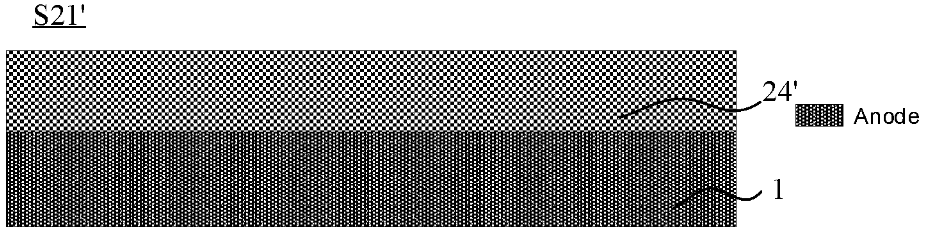
FIG. 15E is a process diagram of a manufacturing method for a light-emitting device, in accordance with some embodiments of the present disclosure.
Figure 15F:
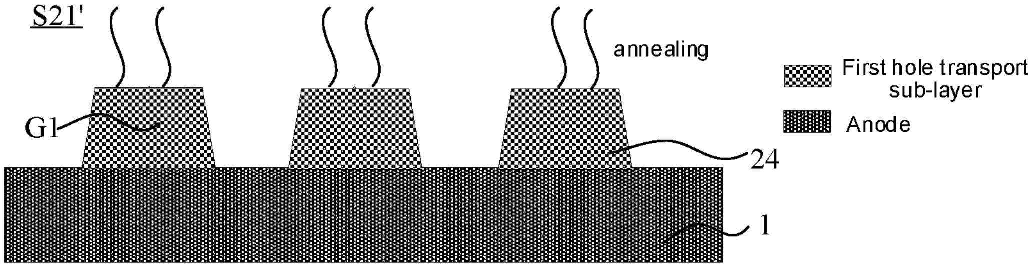
FIG. 15F is another process diagram of a manufacturing method for a light-emitting device, in accordance with some embodiments of the present disclosure.
Figure 15G:
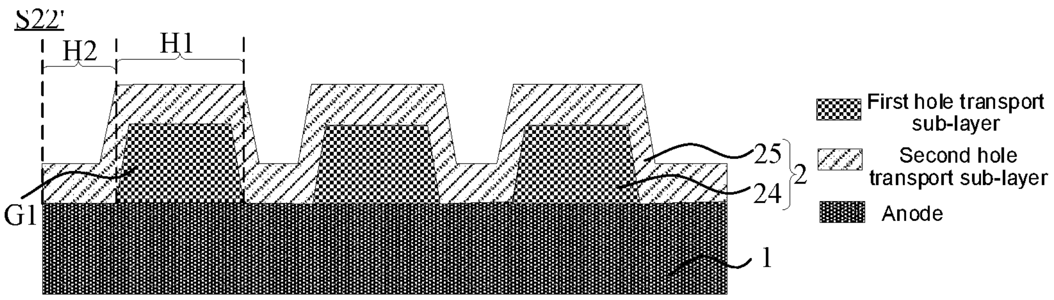
FIG. 15G is yet another process diagram of a manufacturing method for a light-emitting device, in accordance with some embodiments of the present disclosure.
Figure 15H:
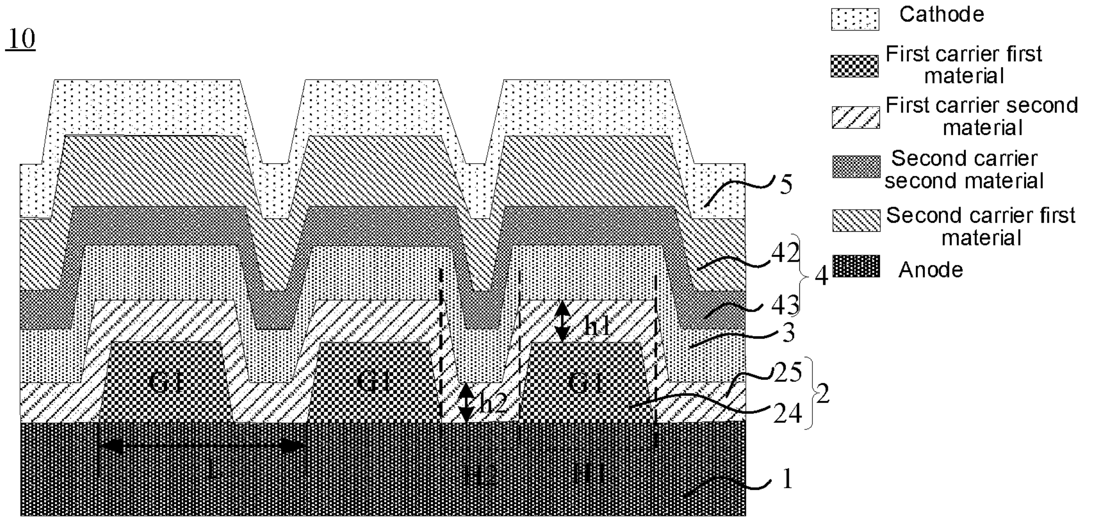
FIG. 15H is a structural diagram of a light-emitting device, in accordance with some embodiments of the present disclosure.
Figure 15I:
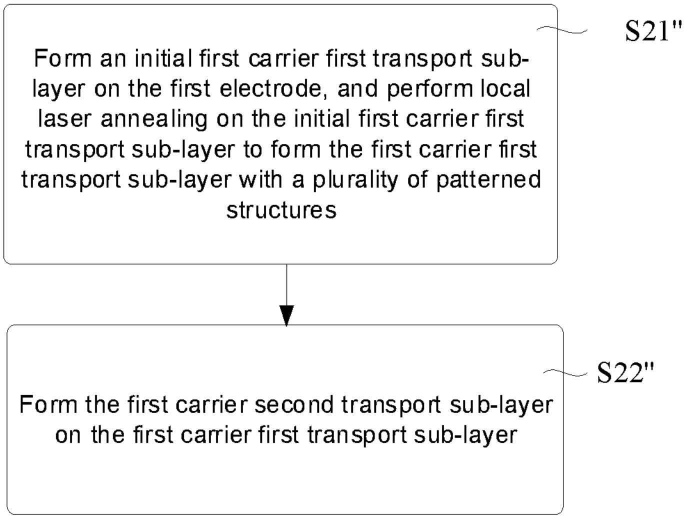
FIG. 15I is a flow chart of a manufacturing method for a light-emitting device, in accordance with some embodiments of the present disclosure.
Figure 15J:
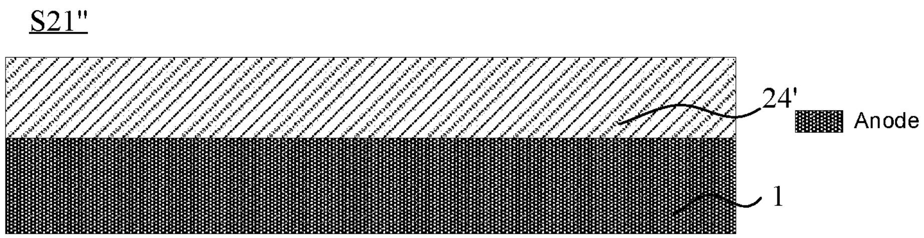
FIG. 15J is yet another process diagram of a manufacturing method for a light-emitting device, in accordance with some embodiments of the present disclosure.
Figure 15K:
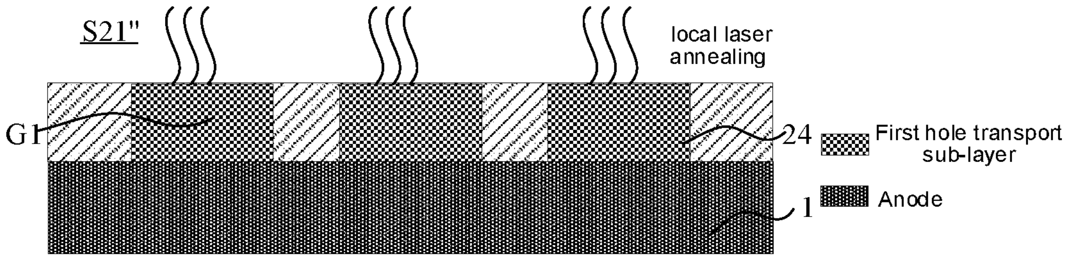
FIG. 15K is yet another process diagram of a manufacturing method for a light-emitting device, in accordance with some embodiments of the present disclosure.
Figure 15L:
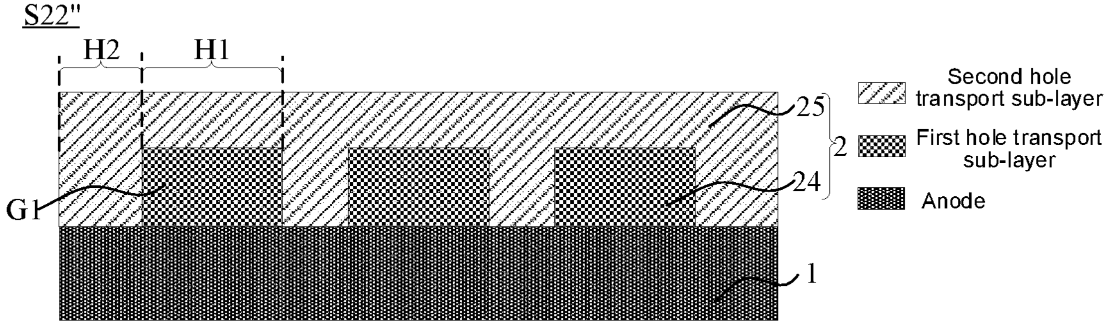
FIG. 15L is yet another process diagram of a manufacturing method for a light-emitting device, in accordance with some embodiments of the present disclosure.
Figure 15M:
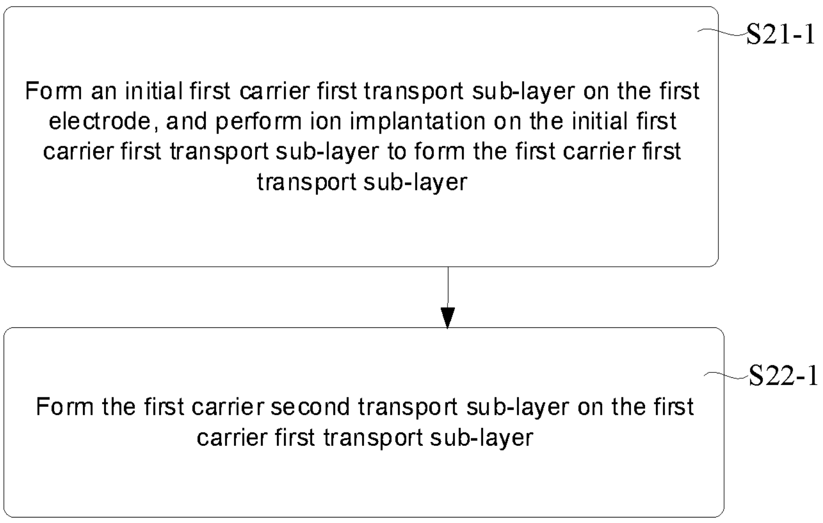
FIG. 15M is a flow chart of a manufacturing method for a light-emitting device, in accordance with some embodiments of the present disclosure.
Figure 15N:
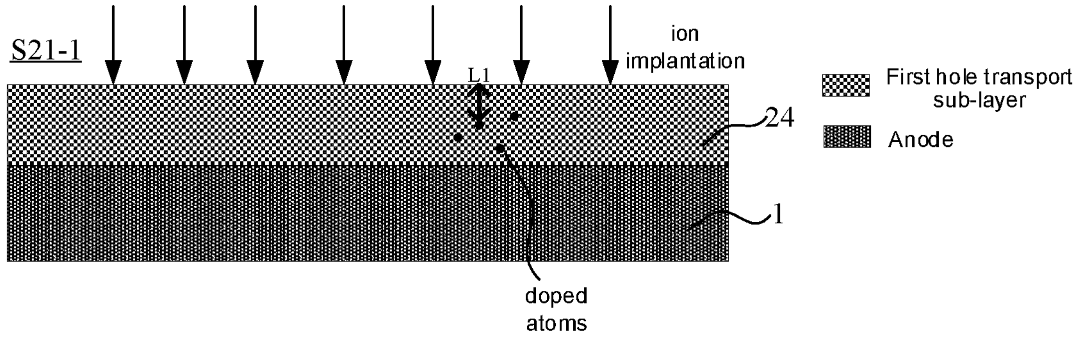
FIG. 15N is yet another process diagram of a manufacturing method for a light-emitting device, in accordance with some embodiments of the present disclosure.

In some embodiments, as shown in FIG. 15N, the refractive index of the first carrier first transport sub-layer 24 is changed by the ion implantation process, and the concentration of the doped atoms in the first carrier first transport sub-layer 24 decreases exponentially with the depth of the doped atoms in the first carrier first transport sub-layer 24, and the distance between the doped atoms increases as the depth of the doped atoms in the first carrier first transport sub-layer 24 increases. The depth of the doped atoms in the first carrier first transport sub-layer 24 is a distance L1 between the doped atoms and a surface of the first carrier first transport sub-layer 24 away from the first electrode 1.

By using the ion implantation, the doping amount at positions of the first carrier first transport sub-layer 24 is not uniformly distributed, and the concentration of the implanted ions (the concentration of the doped atoms) decreases exponentially with the depth of the implanted ions in the first carrier first transport sub-layer 24. The change degree of the refractive index of the film layer is related to the dose of ion implantation. For example, as the depth of the film layer increases, the refractive index of the first carrier first transport sub-layer 24 gradually changes. The distance between the implanted ions (the distance between the doped atoms) increases as the depth of the doped atoms in the first carrier first transport sub-layer 24 increases. That is, the concentration of doped atoms on a side of the first carrier first transport sub-layer 24 proximate to the first electrode 1 is the highest.

In some embodiments, the concentration of the doped atoms in the first carrier first transport sub-layer 24 decreases exponentially with the depth of the doped atoms in the first carrier first transport sub-layer 24, and the distance between the doped atoms increases as the depth of the doped atoms in the first carrier first transport sub-layer 24 increases; the depth of the doped atoms in the first carrier first transport sub-layer 24 is a distance L1 between the doped atoms and the surface of the first carrier first transport sub-layer 24 away from the first electrode 1. The concentration of the doped atoms in the second carrier first transport sub-layer 42 decreases exponentially with the depth of the doped atoms in the second carrier first transport sub-layer 42, and the distance between the doped atoms increases as the depth of the doped atoms in the second carrier first transport sub-layer 42 increases; the depth of the doped atoms in the second carrier first transport sub-layer 42 is a distance L2 between the doped atoms and the surface of the second carrier first transport sub-layer 42 away from the first electrode 1.

By using the ion implantation, the doping amount at positions of the first carrier first transport sub-layer 24 and the doping amount at positions of the second carrier first transport sub-layer 42 are not uniformly distributed, and the concentration of the implanted ions (the concentration of the doped atoms) decreases exponentially with the depth of the film layer. The change degree of the refractive index of the film layer is related to the dose of ion implantation. For example, as the depth of the film layer increases, the refractive index of the first carrier first transport sub-layer 24 gradually changes; the distance between the implanted ions (the distance between the doped atoms) increases as the depth of the doped atoms in the first carrier first transport sub-layer 24 increases. That is, the concentration of doped atoms on a side of the first carrier first transport sub-layer 24 proximate to the first electrode 1 is the highest. For example, as the depth of the film layer increases, the refractive index of the second carrier first transport sub-layer 42 gradually changes; the distance between the implanted ions (the distance between the doped atoms) increases as the depth of the doped atoms in the second carrier first transport sub-layer 42 increases. That is, the concentration of doped atoms on a side of the second carrier first transport sub-layer 42 away from the first electrode 1 is the highest.

In some embodiments, as shown in FIGS. 4A, 4B and 5A to 5E, corresponding to scheme one, the first carrier transport layer 2 includes film layers with different refractive indexes, the refractive index of the first carrier first transport sub-layer 24 is in a range of 1.7 to 1.77 (e.g., 1.77), and the refractive index of the first carrier second transport sub-layer 25 is in a range of 2.0 to 2.06 (e.g., 2.06).

For example, as shown in FIGS. 4A and 5A to 5E, the light-emitting device 10 is upright, the first electrode 1 is the anode, and the second electrode 5 is the cathode. In this case, the first carrier first transport sub-layer 24 is the first hole transport sub-layer with the refractive index of 1.7 to 1.77, and the first carrier second transport sub-layer 25 is the second hole transport sub-layer with the refractive index of 2.0 to 2.06.

For example, as shown in FIG. 4B, the light-emitting device 10 is inverted, the first electrode 1 is the cathode, and the second electrode 5 is the anode. In this case, the first carrier first transport sub-layer 24 is the first electron transport sub-layer with the refractive index of 1.7 to 1.77, and the first carrier second transport sub-layer 25 is the second electron transport sub-layer with the refractive index of 2.0 to 2.06.

In some embodiments, as shown in FIGS. 4C, 4D and 6A to 6E, corresponding to scheme two, the second carrier transport layer 4 includes film layers with different refractive indexes, the refractive index of the second carrier first transport sub-layer 42 is in a range of 1.7 to 1.77 (e.g., 1.77), and the refractive index of the second carrier second transport sub-layer 43 is in a range of 2.0 to 2.06 (e.g., 2.06).

For example, as shown in FIGS. 4C and 6A to 6E, the light-emitting device 10 is upright, the first electrode 1 is the anode, and the second electrode 5 is the cathode. In this case, the second carrier first transport sub-layer 42 is the first electron transport sub-layer with the refractive index of 1.7 to 1.77, and the second carrier second transport sub-layer 43 is the second electron transport sub-layer with the refractive index of 2.0 to 2.06.

For example, as shown in FIG. D, the light-emitting device 10 is inverted, the first electrode 1 is the cathode, and the second electrode 5 is the anode. In this case, the second carrier first transport sub-layer 42 is the first hole transport sub-layer with the refractive index of 1.7 to 1.77, and the second carrier second transport sub-layer 43 is the second hole transport sub-layer with the refractive index of 2.0 to 2.06.

In some embodiments, as shown in FIGS. 4E, 4F and 7A to 7E, corresponding to scheme three, the first carrier transport layer 2 includes film layers with different refractive indexes, and the second carrier transport layer 4 includes film layers with different refractive indexes; the refractive index of the first carrier first transport sub-layer 24 is in the range of 1.7 to 1.77, and the refractive index of the first carrier second transport sub-layer 25 is in the range of 2.0 to 2.06; and the refractive index of the second carrier first transport sub-layer 42 is in the range of 1.7 to 1.77, and the refractive index of the second carrier second transport sub-layer 43 is in the range of 2.0 to 2.06.

For example, as shown in FIGS. 4E and 7A to 7E, the light-emitting device 10 is upright, the first electrode 1 is the anode, and the second electrode 5 is the cathode. In this case, the first carrier first transport sub-layer 24 is the first hole transport sub-layer with the refractive index of 1.7 to 1.77, and the first carrier second transport sub-layer 25 is the second hole transport sub-layer with the refractive index of 2.0 to 2.06; the second carrier first transport sub-layer 42 is the first electron transport sub-layer with the refractive index of 1.7 to 1.77, and the second carrier second transport sub-layer 43 is the second electron transport sub-layer with the refractive index of 2.0 to 2.06.

For example, as shown in FIG. 4F, the light-emitting device 10 is inverted, the first electrode 1 is the cathode, and the second electrode 5 is the anode. In this case, the first carrier first transport sub-layer 24 is the first electron transport sub-layer with the refractive index of 1.7 to 1.77, and the first carrier second transport sub-layer 25 is the second electron transport sub-layer with the refractive index of 2.0 to 2.06; the second carrier first transport sub-layer 42 is the first hole transport sub-layer with the refractive index of 1.7 to 1.77, and the second carrier second transport sub-layer 43 is the second hole transport sub-layer with the refractive index of 2.0 to 2.06.

The following describes the setting of the total thickness of the first carrier transport layer 2 and the thickness of each layer in the first carrier transport layer 2, and the setting of the total thickness of the second carrier transport layer 4 and the thickness of each layer in the second carrier transport layer 4.

In some embodiments, the light-emitting layer 3 emits one of red light, green light, or blue light. The smaller the wavelength of the emitted light, the higher the proportion of the thickness of the first carrier first transport sub-layer 24 to the total thickness of the first carrier transport layer 2.

For example, for the red light, green light or blue light emitted by the light-emitting layer 3, the wavelength of the red light is greater than the wavelength of the green light, and the wavelength of the green light is greater than the wavelength of the blue light. In a case where the light-emitting layer 3 emits the red light, the proportion of the thickness of the first carrier first transport sub-layer 24 to the total thickness of the first carrier transport layer 2 is the lowest. In a case where the light-emitting layer 3 emits the blue light, the proportion of the thickness of the first carrier first transport sub-layer 24 to the total thickness of the first carrier transport layer 2 is the highest. In a case where the light-emitting layer 3 emits the green light, the proportion of the thickness of the first carrier first transport sub-layer 24 to the total thickness of the first carrier transport layer 2 is between the proportion for the red light and the proportion for the blue light.

In some embodiments, the light-emitting layer 3 emits one of red light, green light, or blue light. The smaller the wavelength of the emitted light, the higher the proportion of the thickness of the second carrier first transport sub-layer 42 to the total thickness of the second carrier transport layer 4.

For example, for the red light, green light or blue light emitted by the light-emitting layer 3, the wavelength of the red light is greater than the wavelength of the green light, and the wavelength of the green light is greater than the wavelength of the blue light. In a case where the light-emitting layer 3 emits the red light, the proportion of the thickness of the second carrier first transport sub-layer 42 to the total thickness of the second carrier transport layer 4 is the lowest. In a case where the light-emitting layer 3 emits the blue light, the proportion of the thickness of the second carrier first transport sub-layer 42 to the total thickness of the second carrier transport layer 4 is the highest. In a case where the light-emitting layer 3 emits the green light, the proportion of the thickness of the second carrier first transport sub-layer 42 to the total thickness of the second carrier transport layer 4 is between the proportion for the red light and the proportion for the blue light.

In some embodiments, the light-emitting layer 3 emits one of red light, green light, or blue light. The smaller the wavelength of the emitted light, the higher the proportion of the thickness of the first carrier first transport sub-layer 24 to the total thickness of the first carrier transport layer 2. The smaller the wavelength of the emitted light, the higher the proportion of the thickness of the second carrier first transport sub-layer 42 to the total thickness of the second carrier transport layer 4.

For example, for the red light, green light or blue light emitted by the light-emitting layer 3, the wavelength of the red light is greater than the wavelength of the green light, and the wavelength of the green light is greater than the wavelength of the blue light. In a case where the light-emitting layer 3 emits the red light, the proportion of the thickness of the first carrier first transport sub-layer 24 to the total thickness of the first carrier transport layer 2 is the lowest. In a case where the light-emitting layer 3 emits the blue light, the proportion of the thickness of the first carrier first transport sub-layer 24 to the total thickness of the first carrier transport layer 2 is the highest. In a case where the light-emitting layer 3 emits the green light, the proportion of the thickness of the first carrier first transport sub-layer 24 to the total thickness of the first carrier transport layer 2 is between the proportion for the red light and the proportion for the blue light. In the case where the light-emitting layer 3 emits the red light, the proportion of the thickness of the second carrier first transport sub-layer 42 to the total thickness of the second carrier transport layer 4 is the lowest. In the case where the light-emitting layer 3 emits the blue light, the proportion of the thickness of the second carrier first transport sub-layer 42 to the total thickness of the second carrier transport layer 4 is the highest. In the case where the light-emitting layer 3 emits the green light, the proportion of the thickness of the second carrier first transport sub-layer 42 to the total thickness of the second carrier transport layer 4 is between the proportion for the red light and the proportion for the blue light.

In some embodiments, as shown in FIGS. 4A, 4B and 5A to 5E, the light-emitting layer 3 is a green quantum dot light-emitting layer, the thickness of the first carrier first transport sub-layer 24 is in a range of 50 nm to 60 nm, and the thickness of the first carrier second transport sub-layer 25 is in a range of 10 nm to 20 nm.

For example, as shown in FIGS. 4A and 5A to 5E, the light-emitting device 10 is upright, the first electrode 1 is the anode, the second electrode 5 is the cathode, and the light-emitting layer 3 is the green quantum dot light-emitting layer. In this case, the first carrier first transport sub-layer 24 is the first hole transport sub-layer with the thickness of 50 nm to 60 nm, and the first carrier second transport sub-layer 25 is the second hole transport sub-layer with the thickness of 10 nm to 20 nm.

For example, as shown in FIG. 4B, the light-emitting device 10 is inverted, the first electrode 1 is the cathode, the second electrode 5 is the anode, and the light-emitting layer 3 is the green quantum dot light-emitting layer. In this case, the first carrier first transport sub-layer 24 is the first electron transport sub-layer with the thickness of 50 nm to 60 nm, and the first carrier second transport sub-layer 25 is the second electron transport sub-layer with the thickness of 10 nm to 20 nm.

In some embodiments, as shown in FIGS. 4C, 4D and 6A to 6E, the light-emitting layer 3 is the green quantum dot light-emitting layer, the thickness of the second carrier first transport sub-layer 42 is in a range of 50 nm to 60 nm, and the thickness of the second carrier second transport sub-layer 43 is in a range of 10 nm to 20 nm.

For example, as shown in FIGS. 4C and 6A to 6E, the light-emitting device 10 is upright, the first electrode 1 is the anode, the second electrode 5 is the cathode, and the light-emitting layer 3 is the green quantum dot light-emitting layer. In this case, the second carrier first transport sub-layer 42 is the first electron transport sub-layer with the thickness of 50 nm to 60 nm, and the second carrier second transport sub-layer 43 is the second electron transport sub-layer with the thickness of 10 nm to 20 nm.

For example, as shown in FIG. 4D, the light-emitting device 10 is inverted, the first electrode 1 is the cathode, the second electrode 5 is the anode, and the light-emitting layer 3 is the green quantum dot light-emitting layer. In this case, the second carrier first transport sub-layer 42 is the first hole transport sub-layer with the thickness of 50 nm to 60 nm, and the second carrier second transport sub-layer 43 is the second hole transport sub-layer with the thickness of 10 nm to 20 nm.

In some embodiments, as shown in FIGS. 4E, 4F and 7A to 7E, the light-emitting layer 3 is the green quantum dot light-emitting layer; the thickness of the first carrier first transport sub-layer 24 is in a range of 50 nm to 60 nm, and the thickness of the first carrier second transport sub-layer 25 is in a range of 10 nm to 20 nm; the thickness of the second carrier first transport sub-layer 42 is in a range of 50 nm to 60 nm, and the thickness of the second carrier second transport sub-layer 43 is in a range of 10 nm to 20 nm.

For example, as shown in FIGS. 4E and 7A to 7E, the light-emitting device 10 is upright, the first electrode 1 is the anode, the second electrode 5 is the cathode, and the light-emitting layer 3 is the green quantum dot light-emitting layer. In this case, the first carrier first transport sub-layer 24 is the first hole transport sub-layer with the thickness of 50 nm to 60 nm, and the first carrier second transport sub-layer 25 is the second hole transport sub-layer with the thickness of 10 nm to 20 nm; the second carrier first transport sub-layer 42 is the first electron transport sub-layer with the thickness of 50 nm to 60 nm, and the second carrier second transport sub-layer 43 is the second electron transport sub-layer with the thickness of 10 nm to 20 nm.

For example, as shown in FIG. 4F, the light-emitting device 10 is inverted, the first electrode 1 is the cathode, the second electrode 5 is the anode, and the light-emitting layer 3 is the green quantum dot light-emitting layer. In this case, the first carrier first transport sub-layer 24 is the first electron transport sub-layer with the thickness of 50 nm to 60 nm, and the first carrier second transport sub-layer 25 is the second electron transport sub-layer with the thickness of 10 nm to 20 nm; the second carrier first transport sub-layer 42 is the first hole transport sub-layer with the thickness of 50 nm to 60 nm, and the second carrier second transport sub-layer 43 is the second hole transport sub-layer with the thickness of 10 nm to 20 nm.

In a case where the light-emitting layer 3 in the present disclosure is the green quantum dot light-emitting layer, without changing the thicknesses of the first carrier transport layer 2 and the second carrier transport layer 4 (referring to FIG. 4B), the following is the experimental simulation results of changing the thicknesses of the first carrier transport sub-layers 21 and the second carrier transport sub-layers 41, which affect the light extraction efficiency.

Figure 8A:
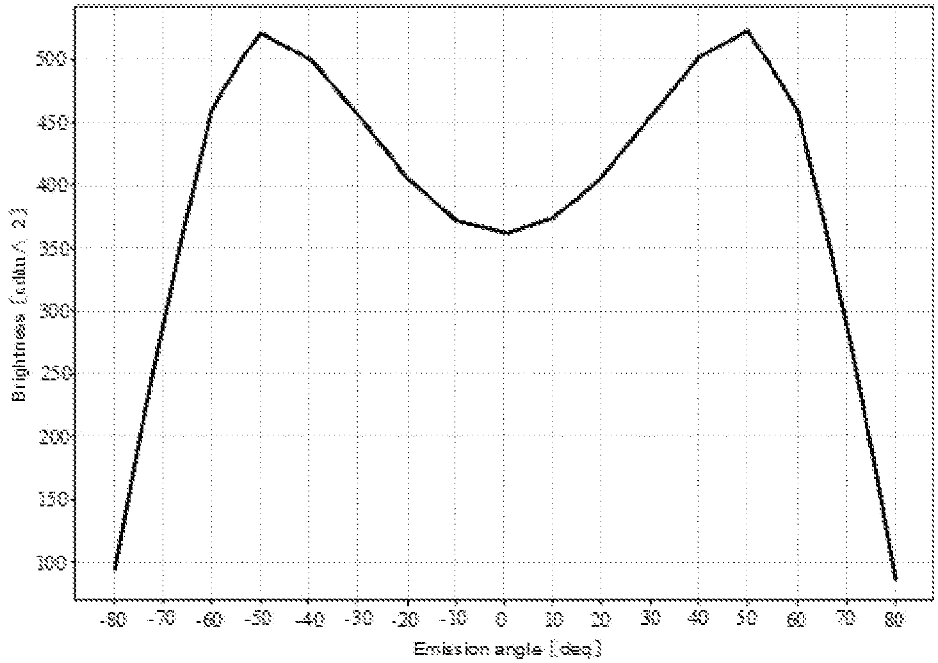
FIG. 8A is a simulation result diagram of light extraction efficiency corresponding to a green light-emitting device having a first carrier transport layer and a second carrier transport layer with different refractive indexes and different thicknesses, in accordance with some embodiments of the present disclosure.

For example, referring to FIG. 8A, the figure shows a distribution diagram of light emitted from the green QLED device corresponding to two first carrier transport sub-layers 21 with different refractive indexes or two second carrier transport sub-layers 41 with different refractive indexes. The thickness of the first carrier transport sub-layer 21 proximate to the first electrode 1 or the thickness of the second carrier transport sub-layer 41 proximate to the second electrode 5 is set to be 20 nm, and the thickness of the first carrier transport sub-layer 21 or the second carrier transport sub-layer 41 proximate to the light-emitting layer 3 is set to be 50 nm. As can be seen form FIG. 8A, the reference value of the brightness of light emitted from the top is 350, the reference value of the maximum brightness of light emitted from the side is 500, and the proportion of the light emitted from the top is 70%. Compared with a case that the first carrier transport layer 2 or the second carrier transport layer 4 is set to be a single layer, the proportion of the light emitted from the top is higher.

Figure 8B:
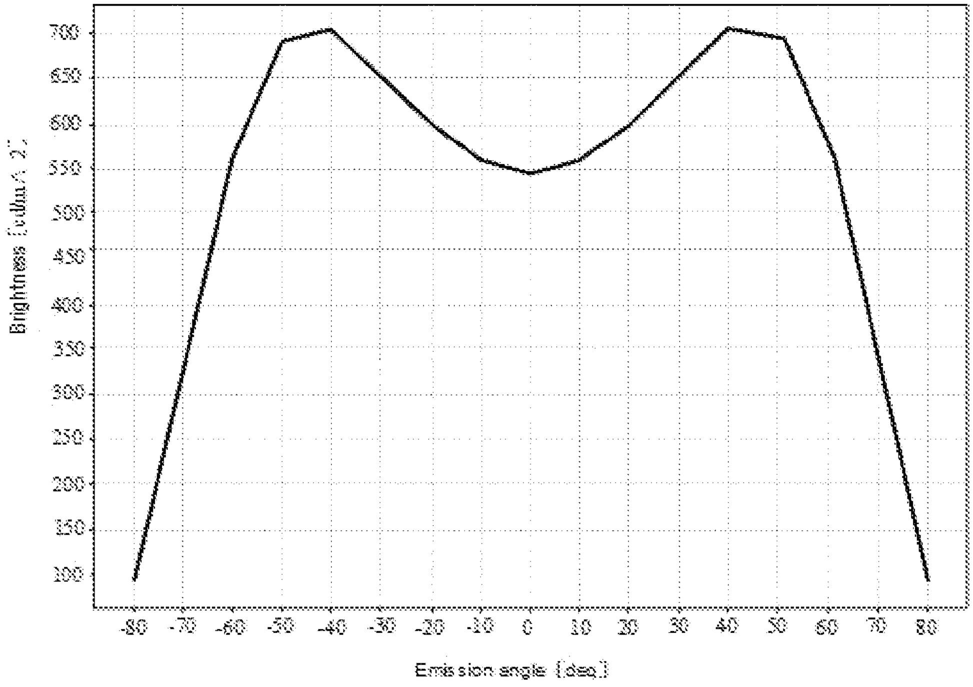
FIG. 8B is another simulation result diagram of light extraction efficiency corresponding to a green light-emitting device having a first carrier transport layer and a second carrier transport layer with different refractive indexes and different thicknesses, in accordance with some embodiments of the present disclosure.

For example, referring to FIG. 8B, the figure shows a distribution diagram of light emitted from the green QLED device corresponding to two first carrier transport sub-layers 21 with different refractive indexes or two second carrier transport sub-layers 41 with different refractive indexes. The thickness of the first carrier transport sub-layer 21 proximate to the first electrode 1 or the thickness of the second carrier transport sub-layer 41 proximate to the second electrode 5 is set to be 30 nm, and the thickness of the first carrier transport sub-layer 21 or the second carrier transport sub-layer 41 proximate to the light-emitting layer 3 is set to be 40 nm. As can be seen form FIG. 8B, the reference value of the brightness of light emitted from the top is 550, the reference value of the maximum brightness of light emitted from the side is 700, the proportion of the light emitted from the top is 79%, and the proportion of the light emitted from the top increases.

Figure 8C:
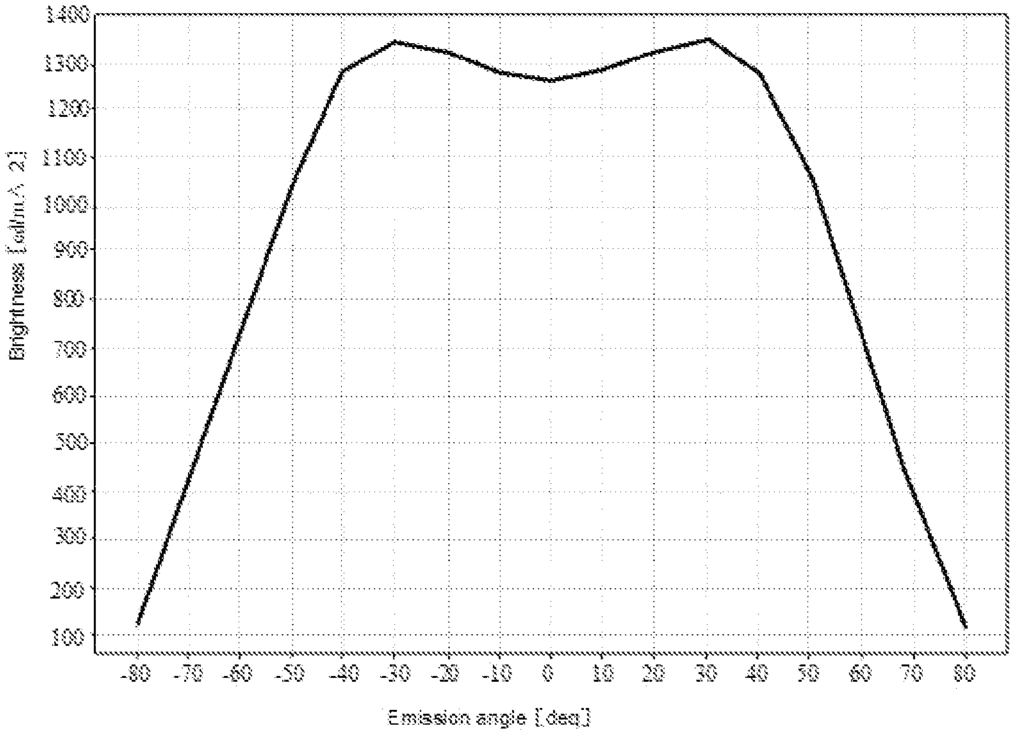
FIG. 8C is yet another simulation result diagram of light extraction efficiency corresponding to a green light-emitting device having a first carrier transport layer and a second carrier transport layer with different refractive indexes and different thicknesses, in accordance with some embodiments of the present disclosure.

For example, referring to FIG. 8C, the figure shows a distribution diagram of light emitted from the green QLED device corresponding to two first carrier transport sub-layers 21 with different refractive indexes or two second carrier transport sub-layers 41 with different refractive indexes. The thickness of the first carrier transport sub-layer 21 proximate to the first electrode 1 or the thickness of the second carrier transport sub-layer 41 proximate to the second electrode 5 is set to be 50 nm, and the thickness of the first carrier transport sub-layer 21 or the second carrier transport sub-layer 41 proximate to the light-emitting layer 3 is set to be 20 nm. As can be seen form FIG. 8C, the reference value of the brightness of light emitted from the top is 1260, the reference value of the maximum brightness of light emitted from the side is 1350, the proportion of the light emitted from the top is 93%, and the difference between the brightness of the light emitted from the top and the maximum brightness of light emitted from the side is relatively small.

Figure 8D:
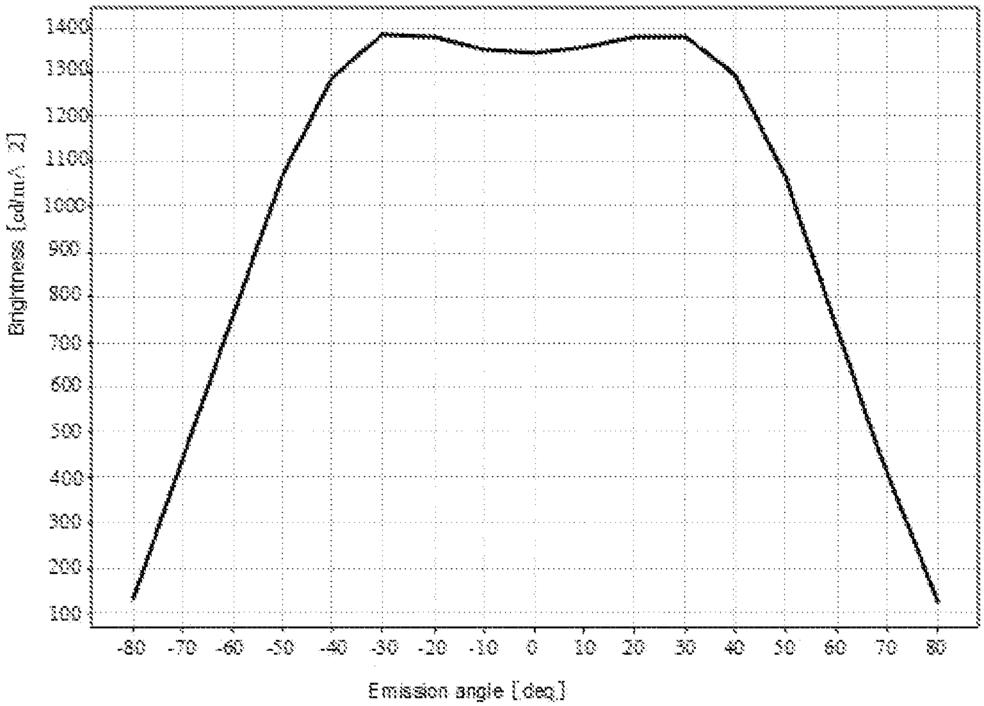
FIG. 8D is yet another simulation result diagram of light extraction efficiency corresponding to a green light-emitting device having a first carrier transport layer and a second carrier transport layer with different refractive indexes and different thicknesses, in accordance with some embodiments of the present disclosure.

For example, referring to FIG. 8D, the figure shows a distribution diagram of light emitted from the green QLED device corresponding to two first carrier transport sub-layers 21 with different refractive indexes or two second carrier transport sub-layers 41 with different refractive indexes. The thickness of the first carrier transport sub-layer 21 proximate to the first electrode 1 or the thickness of the second carrier transport sub-layer 41 proximate to the second electrode 5 is set to be 60 nm, and the thickness of the first carrier transport sub-layer 21 or the second carrier transport sub-layer 41 proximate to the light-emitting layer 3 is set to be 10 nm. As can be seen form FIG. 8D, the reference value of the brightness of light emitted from the top is 1350, the reference value of the maximum brightness of light emitted from the side is 1400, and the proportion of the light emitted from the top is 96%. The brightness of light emitted from the top is closer to the maximum brightness of light emitted from the side, and the top light extraction effect is better compared to FIG. 8C.

Based on the above experimental simulation results, the light-emitting layer 3 is the green quantum dot light-emitting layer, the thicknesses of the first carrier transport sub-layers 21 and the second carrier transport sub-layers 41 are set as above, and the light extraction effect of the light-emitting layer 3 is the best.

In some embodiments, as shown in FIGS. 4A, 4B and 5A to 5E, the light-emitting layer 3 is a red quantum dot light-emitting layer, the thickness of the first carrier first transport sub-layer 24 is in a range of 30 nm to 60 nm, and the thickness of the first carrier second transport sub-layer 25 is in a range of 10 nm to 40 nm.

For example, as shown in FIGS. 4A and 5A to 5E, the light-emitting device 10 is upright, the first electrode 1 is the anode, the second electrode 5 is the cathode, and the light-emitting layer 3 is the red quantum dot light-emitting layer. In this case, the first carrier first transport sub-layer 24 is the first hole transport sub-layer with the thickness of 30 nm to 60 nm, and the first carrier second transport sub-layer 25 is the second hole transport sub-layer with the thickness of 10 nm to 40 nm.

For example, as shown in FIG. 4B, the light-emitting device 10 is inverted, the first electrode 1 is the cathode, the second electrode 5 is the anode, and the light-emitting layer 3 is the red quantum dot light-emitting layer. In this case, the first carrier first transport sub-layer 24 is the first electron transport sub-layer with the thickness of 30 nm to 60 nm, and the first carrier second transport sub-layer 25 is the second electron transport sub-layer with the thickness of 10 nm to 40 nm.

In some embodiments, as shown in FIGS. 4C, 4D and 6A to 6E, the light-emitting layer 3 is the red quantum dot light-emitting layer, the thickness of the second carrier first transport sub-layer 42 is in a range of 30 nm to 60 nm, and the thickness of the second carrier second transport sub-layer 43 is in a range of 10 nm to 40 nm.

For example, as shown in FIGS. 4C and 6A to 6E, the light-emitting device 10 is upright, the first electrode 1 is the anode, the second electrode 5 is the cathode, and the light-emitting layer 3 is the red quantum dot light-emitting layer. In this case, the second carrier first transport sub-layer 42 is the first electron transport sub-layer with the thickness of 30 nm to 60 nm, and the second carrier second transport sub-layer 43 is the second electron transport sub-layer with the thickness of 10 nm to 40 nm.

For example, as shown in FIG. 4D, the light-emitting device 10 is inverted, the first electrode 1 is the cathode, the second electrode 5 is the anode, and the light-emitting layer 3 is the red quantum dot light-emitting layer. In this case, the second carrier first transport sub-layer 42 is the first hole transport sub-layer with the thickness of 30 nm to 60 nm, and the second carrier second transport sub-layer 43 is the second hole transport sub-layer with the thickness of 10 nm to 40 nm.

In some embodiments, as shown in FIGS. 4E, 4F and 7A to 7E, the light-emitting layer 3 is the red quantum dot light-emitting layer; the thickness of the first carrier first transport sub-layer 24 is in a range of 30 nm to 60 nm, and the thickness of the first carrier second transport sub-layer 25 is in a range of 10 nm to 40 nm; the thickness of the second carrier first transport sub-layer 42 is in a range of 30 nm to 60 nm, and the thickness of the second carrier second transport sub-layer 43 is in a range of 10 nm to 40 nm.

For example, as shown in FIGS. 4E and 7A to 7E, the light-emitting device 10 is upright, the first electrode 1 is the anode, the second electrode 5 is the cathode, and the light-emitting layer 3 is the red quantum dot light-emitting layer. In this case, the first carrier first transport sub-layer 24 is the first hole transport sub-layer with the thickness of 30 nm to 60 nm, and the first carrier second transport sub-layer 25 is the second hole transport sub-layer with the thickness of 10 nm to 40 nm; the second carrier first transport sub-layer 42 is the first electron transport sub-layer with the thickness of 30 nm to 60 nm, and the second carrier second transport sub-layer 43 is the second electron transport sub-layer with the thickness of 10 nm to 40 nm.

For example, as shown in FIG. 4F, the light-emitting device 10 is inverted, the first electrode 1 is the cathode, the second electrode 5 is the anode, and the light-emitting layer 3 is the red quantum dot light-emitting layer. In this case, the first carrier first transport sub-layer 24 is the first electron transport sub-layer with the thickness of 30 nm to 60 nm, and the first carrier second transport sub-layer 25 is the second electron transport sub-layer with the thickness of 10 nm to 40 nm; the second carrier first transport sub-layer 42 is the first hole transport sub-layer with the thickness of 30 nm to 60 nm, and the second carrier second transport sub-layer 43 is the second hole transport sub-layer with the thickness of 10 nm to 40 nm.

In some embodiments, as shown in FIGS. 4A, 4B and 5A to 5E, the light-emitting layer 3 is a blue quantum dot light-emitting layer, the thickness of the first carrier first transport sub-layer 24 is in a range of 55 nm to 65 nm, and the thickness of the first carrier second transport sub-layer 25 is in a range of 5 nm to 15 nm.

For example, as shown in FIGS. 4A and 5A to 5E, the light-emitting device 10 is upright, the first electrode 1 is the anode, the second electrode 5 is the cathode, and the light-emitting layer 3 is the blue quantum dot light-emitting layer. In this case, the first carrier first transport sub-layer 24 is the first hole transport sub-layer with the thickness of 55 nm to 65 nm, and the first carrier second transport sub-layer 25 is the second hole transport sub-layer with the thickness of 5 nm to 15 nm.

For example, as shown in FIG. 4B, the light-emitting device 10 is inverted, the first electrode 1 is the cathode, the second electrode 5 is the anode, and the light-emitting layer 3 is the blue quantum dot light-emitting layer. In this case, the first carrier first transport sub-layer 24 is the first electron transport sub-layer with the thickness of 55 nm to 65 nm, and the first carrier second transport sub-layer 25 is the second electron transport sub-layer with the thickness of 5 nm to 15 nm.

In some embodiments, as shown in FIGS. 4C, 4D and 6A to 6E, the light-emitting layer 3 is the blue quantum dot light-emitting layer, the thickness of the second carrier first transport sub-layer 42 is in a range of 55 nm to 65 nm, and the thickness of the second carrier second transport sub-layer 43 is in a range of 5 nm to 15 nm.

For example, as shown in FIGS. 4C and 6A to 6E, the light-emitting device 10 is upright, the first electrode 1 is the anode, the second electrode 5 is the cathode, and the light-emitting layer 3 is the blue quantum dot light-emitting layer. In this case, the second carrier first transport sub-layer 42 is the first electron transport sub-layer with the thickness of 55 nm to 65 nm, and the second carrier second transport sub-layer 43 is the second electron transport sub-layer with the thickness of 5 nm to 15 nm.

For example, as shown in FIG. 4D, the light-emitting device 10 is inverted, the first electrode 1 is the cathode, the second electrode 5 is the anode, and the light-emitting layer 3 is the blue quantum dot light-emitting layer. In this case, the second carrier first transport sub-layer 42 is the first hole transport sub-layer with the thickness of 55 nm to 65 nm, and the second carrier second transport sub-layer 43 is the second hole transport sub-layer with the thickness of 5 nm to 15 nm.

In some embodiments, as shown in FIGS. 4E, 4F and 7A to 7E, the light-emitting layer 3 is the blue quantum dot light-emitting layer; the thickness of the first carrier first transport sub-layer 24 is in a range of 55 nm to 65 nm, and the thickness of the first carrier second transport sub-layer 25 is in a range of 5 nm to 15 nm; the thickness of the second carrier first transport sub-layer 42 is in a range of 55 nm to 65 nm, and the thickness of the second carrier second transport sub-layer 43 is in a range of 5 nm to 15 nm.

For example, as shown in FIGS. 4E and 7A to 7E, the light-emitting device 10 is upright, the first electrode 1 is the anode, the second electrode 5 is the cathode, and the light-emitting layer 3 is the blue quantum dot light-emitting layer. In this case, the first carrier first transport sub-layer 24 is the first hole transport sub-layer with the thickness of 55 nm to 65 nm, and the first carrier second transport sub-layer 25 is the second hole transport sub-layer with the thickness of 5 nm to 15 nm; the second carrier first transport sub-layer 42 is the first electron transport sub-layer with the thickness of 55 nm to 65 nm, and the second carrier second transport sub-layer 43 is the second electron transport sub-layer with the thickness of 5 nm to 15 nm.

For example, as shown in FIG. 4F, the light-emitting device 10 is inverted, the first electrode 1 is the cathode, the second electrode 5 is the anode, and the light-emitting layer 3 is the blue quantum dot light-emitting layer. In this case, the first carrier first transport sub-layer 24 is the first electron transport sub-layer with the thickness of 55 nm to 65 nm, and the first carrier second transport sub-layer 25 is the second electron transport sub-layer with the thickness of 5 nm to 15 nm; the second carrier first transport sub-layer 42 is the first hole transport sub-layer with the thickness of 55 nm to 65 nm, and the second carrier second transport sub-layer 43 is the second hole transport sub-layer with the thickness of 5 nm to 15 nm.

In the case where the light-emitting layer 3 is the red quantum dot light-emitting layer or the blue quantum dot light-emitting layer, the thicknesses of the first carrier transport sub-layers 21 and the second carrier transport sub-layers 41 are set according to the above, and the reference is made to the experimental simulation results in the case where the light-emitting layer 3 is the green quantum dot light-emitting layer.

In some embodiments, a surface roughness of the first carrier transport layer 2 away from the first electrode 1 is in a range of 0.5 nm to 2 nm.

For example, the surface roughness (root mean square (RMS) of roughness) of the first carrier transport layer 2 away from the first electrode 1 is in the range of 0.5 nm to 2 nm. For example, the first carrier transport layer 2 is the electron transport layer, and the electron transport layer is formed by a magnetron sputtering process; and its surface roughness is 0.5 nm, 1.2 nm or 2 nm. Its surface flatness is better.

In some embodiments, a surface roughness of the second carrier transport layer 4 away from the first electrode 1 is in a range of 0.5 nm to 2 nm.

For example, the surface roughness (root mean square (RMS) of roughness) of the second carrier transport layer 4 away from the first electrode 1 is in the range of 0.5 nm to 2 nm. For example, the second carrier transport layer 4 is the electron transport layer, and the electron transport layer is formed by a magnetron sputtering process; and its surface roughness is 0.5 nm, 1.2 nm or 2 nm. Its surface flatness is better.

In some embodiments, the surface roughness of the first carrier transport layer 2 away from the first electrode 1 is in the range of 0.5 nm to 2 nm, and the surface roughness of the second carrier transport layer 4 away from the first electrode 1 is in the range of 0.5 nm to 2 nm.

For example, the surface roughness (root mean square (RMS) of roughness) of the first carrier transport layer 2 away from the first electrode 1 is in the range of 0.5 nm to 2 nm. For example, the first carrier transport layer 2 is the electron transport layer, the electron transport layer is formed by the magnetron sputtering process, and its surface roughness is 0.5 nm, 1.2 nm or 2 nm; and its surface flatness is better. The surface roughness (root mean square (RMS) of roughness) of the second carrier transport layer 4 away from the first electrode 1 is in the range of 0.5 nm to 2 nm. For example, the second carrier transport layer 4 is the hole transport layer, the hole transport layer is formed by the magnetron sputtering process, and its surface roughness is 0.5 nm, 1.2 nm or 2 nm; and its surface flatness is better.

In some embodiments, as shown in FIGS. 4C and 4B, the electron transport layer includes at least two electron transport sub-layers with different refractive indexes, the hole transport layer is of one layer structure, and the thickness of the hole transport layer is in a range of 10 nm to 40 nm.

For example, as shown in FIG. 4C, the light-emitting device 10 is upright, the first electrode 1 is the anode, and the second electrode 5 is the cathode. In this case, the first carrier transport layer 2 is the hole transport layer. The hole transport layer is provided as a whole layer, and the thickness T is in the range of 10 nm to 40 nm. The second carrier transport layer 4 is the electron transport layer, which includes two electron transport sub-layers with different refractive indexes.

For example, as shown in FIG. 4B, the light-emitting device 10 is inverted, the first electrode 1 is a cathode, and the second electrode 5 is the anode. In this case, the first carrier transport layer 2 is the electron transport layer, which includes two electron transport sub-layers with different refractive indexes. The second carrier transport layer 4 is the hole transport layer, the hole transport layer is provided as a whole layer, and the thickness T is in the range of 10 nm to 40 nm.

In some embodiments, the hole transport layer includes at least one hole transport material, and the hole transport material includes at least one of an organic transport material and an inorganic oxide transport material.

For example, the organic transport material mainly includes polyvinylcarbazole, 1,2,4,5-tetrakis(trifluoromethyl)benzene, N,N'-bis(3-methylphenyl)-N, N'-diphenylbenzidine, etc.

For example, the inorganic oxide material mainly includes nickel oxide, vanadium oxide, etc., which can improve the energy conversion efficiency and conductivity of the hole transport layer.

Figure 9:
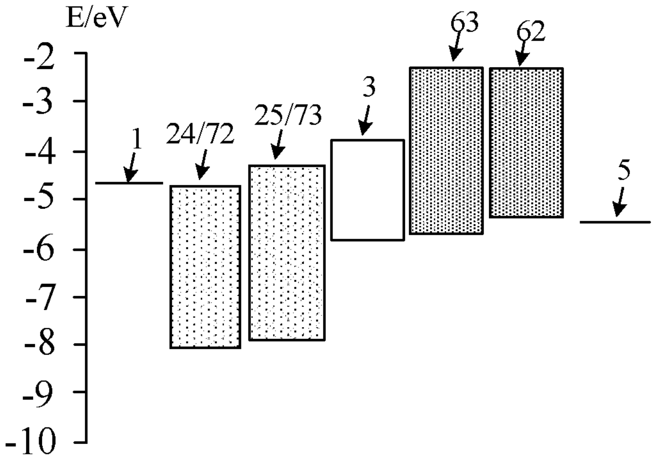
FIG. 9 is a schematic diagram of energy level differences of film layers of a light-emitting device, in accordance with some embodiments of the present disclosure.

In some embodiments, referring to FIG. 9, the hole transport layer includes two layers of hole transport materials, the HOMO energy level of the hole transport material proximate to the light-emitting layer 3 is in a range of −6.2 eV to −5.5 eV, and the HOMO energy level of the hole transport material away from the light-emitting layer 3 is in a range of −5.3 eV to −5.0 eV.

For example, the hole transport layer includes two layers of hole transport materials, that is, the hole transport layer includes two hole transport sub-layers; the hole transport material proximate to the light-emitting layer 3 is the hole transport material of the second hole transport sub-layer, its HOMO energy level is in the range of −6.2 eV to −5.5 eV, and the material may be molybdenum oxide (MoOx). The hole transport material away from the light-emitting layer 3 is the hole transport material of the first hole transport sub-layer, its HOMO energy level is in the range of −5.3 eV to −5.0 eV, and the material may be any one of vanadium pentoxide (V2O5) and nickel oxide (NiOx).

For example, the hole transport layer of the light-emitting device 10 may be of one layer structure, the HOMO energy level of the one-layer hole transport layer is in the range of −6.2 eV to −5.0 eV, and its material may be any one of molybdenum oxide (MoOx), vanadium pentoxide (V2O5) and nickel oxide (NiOx).

Figure 10:
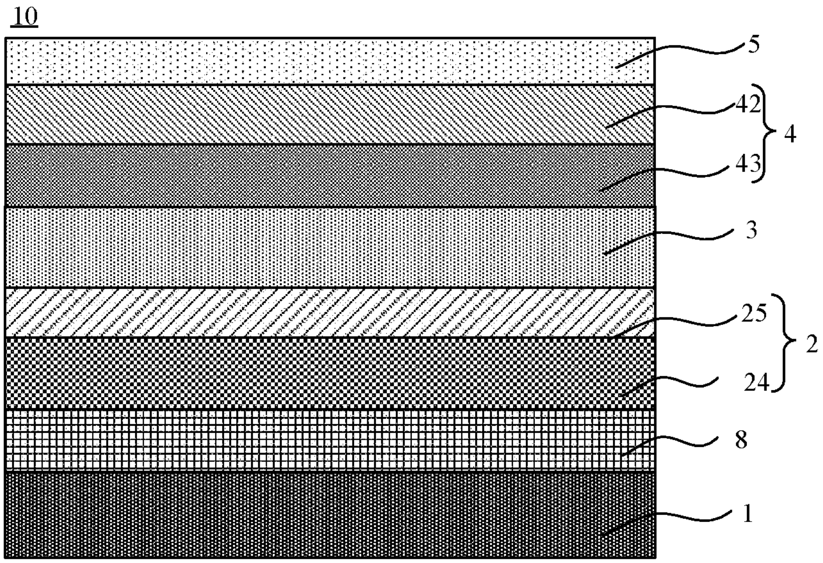
FIG. 10 is a structural diagram of yet another light-emitting device, in accordance with some embodiments of the present disclosure.
Figure 11:
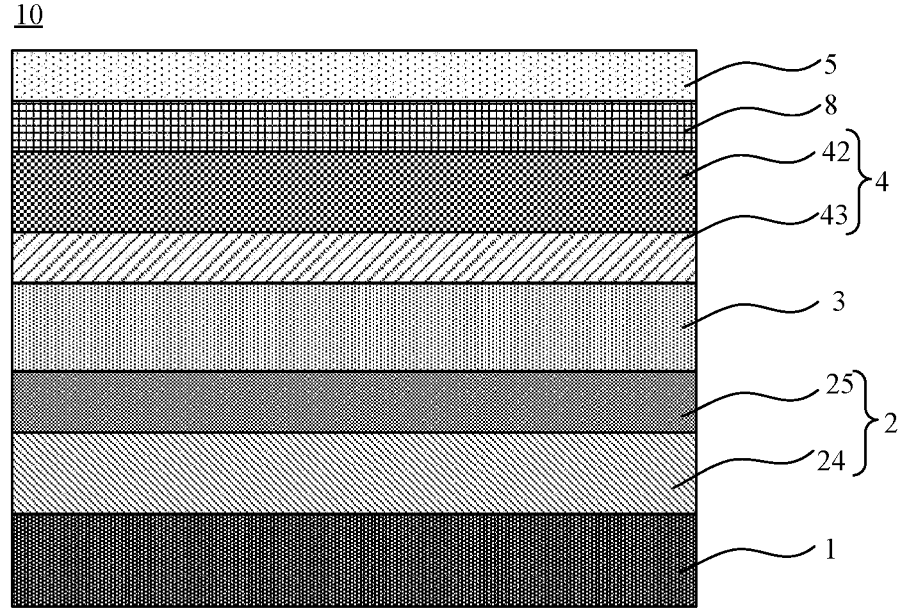
FIG. 11 is a structural diagram of yet another light-emitting device, in accordance with some embodiments of the present disclosure.

In some embodiments, as shown in FIGS. 10 and 11, the light-emitting device 10 further includes a hole injection layer 8 disposed on a side of the hole transport layer away from the light-emitting layer 3.

For example, the material of the hole injection layer 8 includes an aqueous solution of polymer (PEDOT:PSS), 2,3,6,7,10,11-hexacyano-1,4,5,8,9,12-hexaazatriphenylene (HAT-CN), etc. The material of the hole injection layer 8 may also be an inorganic oxide, such as molybdenum oxide (MoOx), which has a strong electron absorption ability.

For example, as shown in FIG. 10, the light-emitting device 10 is upright, the first carrier transport layer 2 is the hole transport layer, the hole injection layer 8 is on the side of the hole transport layer away from the light-emitting layer 3, and the hole injection layer 8 is located between the first electrode 1 and the hole transport layer.

For example, as shown in FIG. 11, the light-emitting device 10 is inverted, the second carrier transport layer 4 is the hole transport layer, the hole injection layer 8 is on the side of the hole transport layer away from the light-emitting layer 3, and the hole injection layer 8 is located between the second electrode 5 and the hole transport layer.

Figure 12:
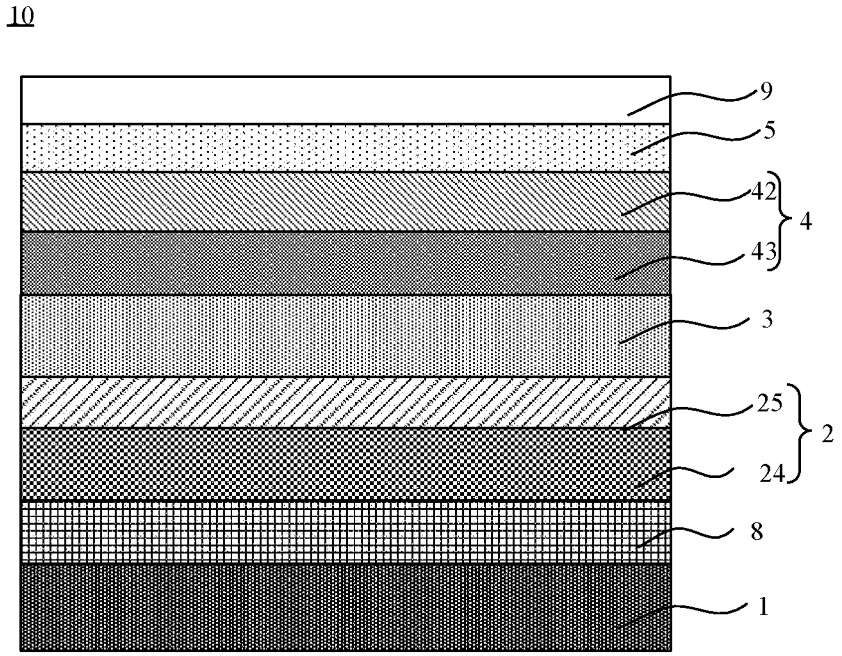
FIG. 12 is a structural diagram of a manufacturing method for a light-emitting device, in accordance with some embodiments of the present disclosure.
Figure 13:
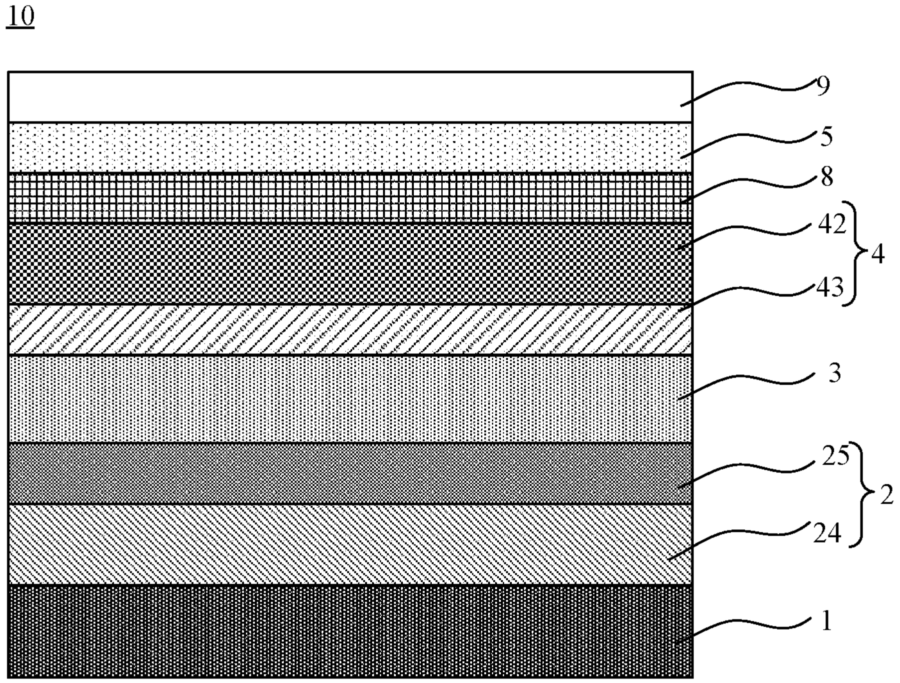
FIG. 13 is a structural diagram of a manufacturing method for another light-emitting device, in accordance with some embodiments of the present disclosure.

In some embodiments, as shown in FIGS. 12 and 13, the light-emitting device 10 further includes a cover layer 9, the cover layer 9 is disposed on a side of the second electrode 5 away from the light-emitting layer 3, and a thickness of the cover layer 9 is in a range of 40 nm to 90 nm.

For example, the thickness of the cover layer 9 is 70 nm. The material of the cover layer 9 is an organic material with a relatively large refractive index and a relatively small light absorption coefficient, which can improve the light extraction effect.

For example, the light-emitting device 10 can be upright or inverted. As shown in FIGS. 12 and 13, the light-emitting device 10 is upright in FIG. 12, and the light-emitting device 10 is inverted in FIG. 13; the light-emitting device 10 further includes the cover layer 9 disposed on the side of the second electrode 5 away from the light-emitting layer 3.

Figure 14:
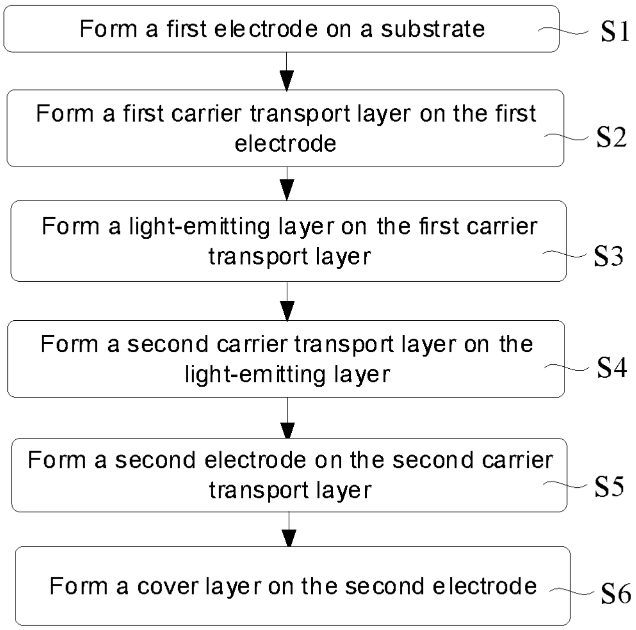
FIG. 14 is a flow chart for a light-emitting device, in accordance with some embodiments of the present disclosure.

Some embodiments of the present disclosure further provide a manufacturing method for a light-emitting device 10, as shown in FIG. 14, the manufacturing method for the light-emitting device 10 includes steps S1 to S6.

In S1, a first electrode 1 is formed on a substrate.

For example, the substrate may be a glass substrate or a flexible polyethylene terephthalate (PET) substrate. The first electrode 1 is one of an anode or a cathode.

For example, the first electrode 1 may be made of an opaque metal such as aluminum, silver, titanium, or molybdenum, and a thickness of the metal electrode may be in a range of 60 nm to 150 nm, on which indium tin oxide (ITO) or fluorine doped tin oxide (FTO) is deposited.

For example, the first electrode 1 may be made of an opaque metal such as aluminum, silver, titanium, or molybdenum, and the thickness of the metal electrode may be in a range of 60 nm to 150 nm, on which a conductive polymer is deposited with the thickness of 5 nm to 50 nm.

For example, the first electrode 1 is the metal electrode made of opaque silver with the thickness of 80 nm, on which indium tin oxide is deposited with the thickness of 10 nm.

In S2, a first carrier transport layer 2 is formed on the first electrode 1.

For example, the first carrier transport layer 2 may be an electron transport layer or a hole transport layer.

For example, as shown in FIGS. 4A, 4B, 4E and 4F, the formed first carrier transport layer 2 includes at least two first carrier transport sub-layers 21 with different refractive indexes; in the at least two first carrier transport sub-layers 21, the refractive indexes of the first carrier transport sub-layers 21 decrease layer by layer in a direction from the light-emitting layer to the first electrode, and a thickness of a film layer with a low refractive index is greater than a thickness of a film layer with a high refractive index. For example, the at least two first carrier transport sub-layers 21 are a first carrier first transport sub-layer 24 and a first carrier second transport sub-layer 25.

Alternatively, as shown in FIGS. 4C and 4D, the formed first carrier transport layer 2 is of one layer structure.

In S3, a light-emitting layer 3 is formed on the first carrier transport layer 2.

For example, the light-emitting layer 3 is a quantum dot light-emitting layer, which is deposited by ink-jet printing, photolithography, etc., and the quantum dot light-emitting layer can emit one of three colors of red, green and blue.

For example, the quantum dots may be cadmium-containing materials such as cadmium selenide (CdSe), or cadmium-free materials such as indium phosphide (InP).

For example, a thickness of the light-emitting layer 3 is in a range of 10 nm to 40 nm, preferably 20 nm to 30 nm.

In S4, a second carrier transport layer 4 is formed on the light-emitting layer 3.

For example, in the case where the first carrier transport layer 2 is the electron transport layer, the second carrier transport layer 4 is the hole transport layer. In the case where the first carrier transport layer 2 is the hole transport layer, the second carrier transport layer 4 is the electron transport layer.

For example, as shown in FIGS. 4C, 4D, 4E and 4F, the formed second carrier transport layer 4 includes at least two second carrier transport sub-layers with different refractive indexes; in the at least two second carrier transport sub-layers, the refractive indexes of the second carrier transport sub-layers decrease layer by layer in a direction away from the light-emitting layer, and a thickness of a film layer with a low refractive index is greater than a thickness of a film layer with a high refractive index. For example, the at least two second carrier transport sub-layers are a second carrier first transport sub-layer 42 and a second carrier second transport sub-layer 43.

Alternatively, as shown in FIGS. 4A and 4B, the formed second carrier transport layer 4 is of one layer structure.

In S5, a second electrode 5 is formed on the second carrier transport layer 4.

For example, in the case where the first electrode 1 is the anode, the second electrode 5 is the cathode. In the case where the first electrode 1 is the cathode, the second electrode 5 is the anode.

For example, the second electrode 5 may be transparent and conductive indium tin oxide (ITO) electrode, indium zinc oxide (IZO) electrode, semiconductor electrode (FTO glass electrode) or conductive polymer electrode, and its thickness may be in a range of 40 nm to 200 nm.

In S6, a cover layer 9 is formed on the second electrode 5.

For example, a thickness of the cover layer is in a range of 40 nm to 90 nm, preferably 70 nm. A material of the cover layer 9 is an organic material.

The following describes the specific steps of S2 under the condition that the formed first carrier transport layer 2 includes two first carrier transport sub-layers 21 with different refractive indexes, in which the first carrier transport sub-layer proximate to the first electrode is the first carrier first transport sub-layer 24, and the first carrier transport sub-layer proximate to the light-emitting layer is the first carrier second transport sub-layer 25.

As shown in FIGS. 15A and 15D, the step of forming the first carrier transport layer 2 on the first electrode 1 in step S2 includes steps S21 and S22, or S21' and S22'. FIGS. 15B and 15C correspond to the process diagrams of steps S21 and S22, and FIGS. 15E, 15F and 15G correspond to the process diagrams of steps S21' and S22'.

In some embodiments, as shown in FIG. 15A, step S2 includes steps S21 and S22.

In S21, an initial first carrier first transport sub-layer is formed on the first electrode 1, and the initial first carrier first transport sub-layer is annealed to form the first carrier first transport sub-layer 24.

For example, as shown in FIG. 15B, a material may be deposited on the first electrode 1 by using magnetron sputtering, and the material may be ZnO or Mg-doped ZnO, thereby forming a ZnO thin film or Mg-doped ZnO thin film, and thus obtaining the initial first carrier first transport sub-layer. Then the high-temperature annealing at 300 to 500 degrees Celsius is performed on the initial first carrier first transport sub-layer to form the first carrier first transport sub-layer 24.

For example, the high-temperature annealing at 300 to 500 degrees Celsius is performed on the initial first carrier first transport sub-layer, and the formed first carrier first transport sub-layer 24 is a film layer with a C-axis orientation.

It should be noted that the above-mentioned high-temperature of 300 to 500 degrees Celsius is a range value of maintaining the temperature of the substrate during the deposition of the initial first carrier first transport sub-layer.

In S22, the first carrier second transport sub-layer 25 is formed on the first carrier first transport sub-layer 24.

For example, as shown in FIG. 15C, a material is deposited on the first carrier first transport sub-layer 24 by using magnetron sputtering, and the material may be ZnO or Mg-doped ZnO, thereby forming a ZnO thin film or Mg-doped ZnO thin film, and thus obtaining the first carrier second transport sub-layer 25. Alternatively, a material is deposited on the first carrier first transport sub-layer 24 by using ink-jet printing, and the material may be zinc oxide nanoparticles formed by a sol-gel method, thereby forming a thin film of zinc oxide nanoparticles, and thus obtaining the first carrier second transport sub-layer 25.

The first carrier transport layer 2 fabricated by using S21 and S22 is the first carrier transport layer 2 shown in FIGS. 4A to 4F, and the first carrier first transport sub-layer 24 is a continuous film layer.

For example, the first carrier first transport sub-layer 24 away from the light-emitting layer 3 may be a C-axis oriented film layer, or a non-C-axis oriented film layer; and the first carrier second transport sub-layer 25 proximate to the light-emitting layer 3 is a C-axis oriented film layer. The C-axis oriented film layer is that the film layer has obvious crystallization and good conductivity in a vertical direction, and has a relatively poor conductivity in a direction perpendicular to the vertical direction. Therefore, during the transfer of carriers from the first electrode 1 to the light-emitting layer 3, the side leakage of the film may be effectively reduced and crosstalk may be avoided. The vertical direction is a direction perpendicular to a plane where the light-emitting layer is located.

For example, the first carrier first transport sub-layer 24 away from the light-emitting layer 3 and the first carrier second transport sub-layer 25 proximate to the light-emitting layer 3 are both C-axis oriented film layers. In this case, the first carrier second transport sub-layer 25 proximate to the light-emitting layer 3 has a greater C-axis orientation than the first carrier first transport sub-layer 24 away from the light-emitting layer 3, which means that a ratio of the conductivity of the first carrier second transport sub-layer 25 in the direction perpendicular to the plane where the light-emitting layer 3 is located to the conductivity of the first carrier second transport sub-layer 25 in the direction parallel to the plane where the light-emitting layer 3 is located is greater.

In some embodiments, as shown in FIG. 15D, step S2 includes steps S21' and S22'.

In S21', an initial first carrier first transport sub-layer 24' is formed on the first electrode 1, the initial first carrier first transport sub-layer is etched to form a plurality of patterned structures G1, and the plurality of patterned structures G1 are annealed to form the first carrier first transport sub-layer 24.

For example, referring to FIG. 15E, a material may be deposited on the first electrode 1 by using magnetron sputtering, and the material may be ZnO or Mg-doped ZnO, thereby forming a ZnO thin film or Mg-doped ZnO thin film, and thus obtaining the initial first carrier first transport sub-layer. As shown in FIG. 15F, the initial first carrier first transport sub-layer is etched by a photolithography process to form the plurality of patterned structures G1, and the plurality of patterned structures G1 are subjected to high-temperature annealing at 300 to 500 degrees Celsius to form the first carrier first transport sub-layer 24.

It should be noted that the above-mentioned high-temperature of 300 to 500 degrees Celsius is a range value of maintaining the temperature of the substrate during the deposition of the initial first carrier first transport sub-layer.

In S22', the first carrier second transport sub-layer 25 is formed on the first carrier first transport sub-layer 24.

For example, as shown in FIG. 15G, a material is deposited on the first carrier first transport sub-layer 24 at a normal temperature by using magnetron sputtering, and the material may be ZnO or Mg-doped ZnO, thereby forming a ZnO thin film or Mg-doped ZnO thin film, and thus obtaining the first carrier second transport sub-layer 25. Alternatively, a material is deposited on the first carrier first transport sub-layer 24 by using ink-jet printing, and the material may be zinc oxide nanoparticles formed by a sol-gel method, thereby forming a thin film of zinc oxide nanoparticles, and thus obtaining the first carrier second transport sub-layer 25.

Since the material of the first carrier second transport sub-layer 25 is an inorganic material, after the material is deposited on the first carrier first transport sub-layer 24, a surface of the formed first carrier second transport sub-layer 25 is uneven with the plurality of patterned structures G1. That is, the surface of the first carrier second transport sub-layer 25 is not flat. Further, as shown in FIG. 15H, surfaces of the light-emitting layer 3, the second carrier transport sub-layer and the second electrode formed in the subsequent steps are not flat.

It should be noted that, the material is deposited on the first carrier first transport sub-layer 24 at the normal temperature by using the magnetron sputtering or nano-imprinting, and the normal temperature here is the temperature of the substrate of the first carrier first transport sub-layer 24. In the case where the temperature of the substrate is the normal temperature, the first carrier first transport sub-layer 24 is the C-axis oriented film layer.

The first carrier transport layer 2 fabricated by using S21' and S22' is the first carrier transport layer 2 shown in FIG. 15G, and the first carrier first transport sub-layer 24 includes the plurality of patterned structures G1.

For example, the first carrier first transport sub-layer 24 away from the light-emitting layer 3 may be the C-axis oriented film layer, or the non-C-axis oriented film layer; and the first carrier second transport sub-layer 25 proximate to the light-emitting layer 3 is the C-axis oriented film layer.

For example, the first carrier first transport sub-layer 24 away from the light-emitting layer 3 and the first carrier second transport sub-layer 25 proximate to the light-emitting layer 3 are both C-axis oriented film layers. In this case, the first carrier second transport sub-layer 25 proximate to the light-emitting layer 3 has a greater C-axis orientation than the first carrier first transport sub-layer 24 away from the light-emitting layer 3.

In some embodiments, referring to FIG. 15I, the step of forming the first carrier transport layer 2 on the first electrode 1 in step S2 includes: steps S21" to S22". FIGS. 15J to 15L correspond to the process diagrams of steps S21" and S22" for the light-emitting device 10 being upright.

In S21", an initial first carrier first transport sub-layer 24' is formed on the first electrode 1, and local laser annealing is performed on the initial first carrier first transport sub-layer to form the first carrier first transport sub-layer 24 with a plurality of patterned structures G1.

For example, as shown in FIG. 15J, a material is deposited on the first electrode 1 by using magnetron sputtering, and the material may be ZnO or Mg-doped ZnO, thereby forming a ZnO thin film or Mg-doped ZnO thin film, and thus obtaining the initial first carrier first transport sub-layer. The obtained initial first carrier first transport sub-layer includes a plurality of patterned regions, and an orthographic projection of the patterned region on the first electrode is in a shape of a square, triangle, ellipse or circle. As shown in FIG. 15K, by performing the local laser annealing on the patterned regions of the initial first carrier first transport sub-layer at 300 to 500 degrees Celsius, the patterned regions after the local laser annealing can form the plurality of patterned structures G1. The first carrier first transport sub-layer 24 includes the plurality of patterned structures G1 and the unannealed portion of the initial first carrier first transport sub-layer 24' (i.e., other structures G2 except the plurality of patterned structures G1).

It should be noted that the above-mentioned high-temperature of 300 to 500 degrees Celsius is a range value of maintaining the temperature of the substrate during the deposition of the initial first carrier first transport sub-layer.

In S22", the first carrier second transport sub-layer 25 is formed on the first carrier first transport sub-layer 24.

For example, a material is deposited on the first carrier first transport sub-layer 24 at a normal temperature by using magnetron sputtering, and the material may be ZnO or Mg-doped ZnO, thereby forming a ZnO thin film or Mg-doped ZnO thin film, and thus obtaining the first carrier second transport sub-layer 25. Alternatively, a material is deposited on the first carrier first transport sub-layer 24 by using ink-jet printing, and the material may be zinc oxide nanoparticles formed by a sol-gel method, thereby forming a thin film of zinc oxide nanoparticles, and thus obtaining the first carrier second transport sub-layer 25.

The first carrier transport layer 2 fabricated by using S21" and S22" is the first carrier transport layer 2 shown in FIGS. 5A to 5E and 7A to 7E, and the first carrier first transport sub-layer 24 includes the plurality of patterned structures G1.

For example, before annealing, the size of grains in the initial first carrier first transport sub-layer 24' is relatively small, for example, the size of grains in the ZnO thin film before annealing is in a range of 1 nm to 10 nm, and the grain boundaries are relatively blurred. After annealing, the size of grains in the first carrier first transport sub-layer 24 becomes larger and the grain boundaries become sharper, for example, the size of grains in the ZnO thin film is greater than 10 nm.

The size of grains in the first carrier second transport sub-layer 25 is greater than that of grains in the plurality of patterned structures G1, and the grain boundaries of the first carrier second transport sub-layer 25 are shaper than those of the plurality of patterned structures G1.

For example, the first carrier first transport sub-layer 24 away from the light-emitting layer 3 may be a C-axis oriented film layer, or a non-C-axis oriented film layer; and the first carrier second transport sub-layer 25 proximate to the light-emitting layer 3 is a C-axis oriented film layer. The C-axis oriented film layer is that the film layer has obvious crystallization and good conductivity in a vertical direction, and has a relatively poor conductivity in a direction perpendicular to the vertical direction. Therefore, during the transfer of carriers from the first electrode 1 to the light-emitting layer 3, the side leakage of the film may be effectively reduced and crosstalk may be avoided. The vertical direction is a direction perpendicular to a plane where the light-emitting layer is located.

For example, the first carrier first transport sub-layer 24 away from the light-emitting layer 3 and the first carrier second transport sub-layer 25 proximate to the light-emitting layer 3 are both C-axis oriented film layers. In this case, the first carrier second transport sub-layer 25 proximate to the light-emitting layer 3 has a greater C-axis orientation than the first carrier first transport sub-layer 24 away from the light-emitting layer 3, which means that a ratio of the conductivity of the first carrier second transport sub-layer 25 in the direction perpendicular to the plane where the light-emitting layer 3 is located to the conductivity of the first carrier second transport sub-layer 25 in the direction parallel to the plane where the light-emitting layer 3 is located is greater.

Figure 15O:
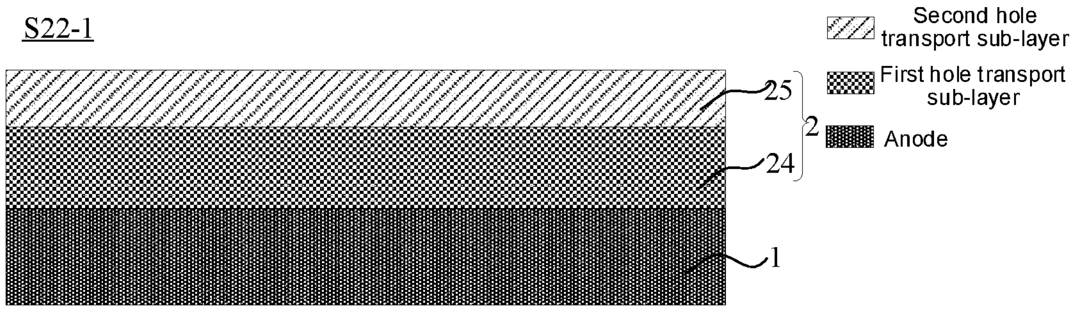
FIG. 15O is yet another process diagram of a manufacturing method for a light-emitting device, in accordance with some embodiments of the present disclosure.

In some embodiments, referring to FIG. 15M, the step of forming the first carrier transport layer 2 on the first electrode 1 in step S2 includes: steps S21-1 to S22-1. FIGS. 15M to 15O correspond to the process diagrams of steps S21-1 and S22-1 for the light-emitting device 10 being upright.

In S21-1, an initial first carrier first transport sub-layer 24' is formed on the first electrode 1, and ion implantation is performed on the initial first carrier first transport sub-layer to form the first carrier first transport sub-layer 24.

For example, as shown in FIG. 15N, a material is deposited on the first electrode 1 by using magnetron sputtering, and the material may be ZnO or Mg-doped ZnO, thereby forming a ZnO thin film or Mg-doped ZnO thin film, and thus obtaining the initial first carrier first transport sub-layer 24'.

For example, the ion implantation is performed on the initial first carrier first transport sub-layer 24' (the implanted ions are, for example, high-energy oxygen ions, silicon ions, helium ions or rare earth metal thulium ions), during which the high-energy ions mainly impact the surface lattice of the initial first carrier first transport sub-layer, so that the atoms in the surface lattice of the initial first carrier first transport sub-layer enter the interior of the film layer to form lattice damage, thereby reducing the refractive index and forming the first carrier first transport sub-layer 24 with the low refractive index.

In S22-1, the first carrier second transport sub-layer 25 is formed on the first carrier first transport sub-layer 24.

For example, a material is deposited on the first carrier first transport sub-layer 24 at a normal temperature by using magnetron sputtering, and the material may be ZnO or Mg-doped ZnO, thereby forming a ZnO thin film or Mg-doped ZnO thin film, and thus obtaining the first carrier second transport sub-layer 25. Alternatively, a material is deposited on the first carrier first transport sub-layer 24 by using ink-jet printing, and the material may be zinc oxide nanoparticles formed by a sol-gel method, thereby forming a thin film of zinc oxide nanoparticles, and thus obtaining the first carrier second transport sub-layer 25.

The first carrier transport layer 2 fabricated by using S21-1 and S22-1 is the first carrier transport layer 2 shown in FIG. 15O, and the first carrier first transport sub-layer 24 is of a whole layer structure.

Figure 15P:
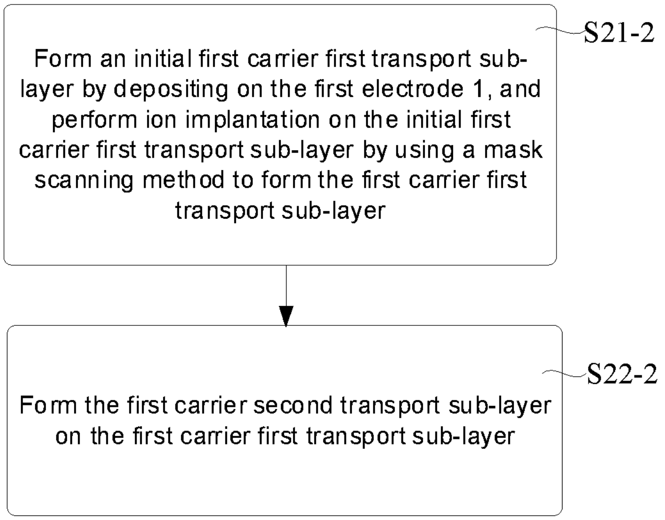
FIG. 15P is a flow chart of a manufacturing method for a light-emitting device, in accordance with some embodiments of the present disclosure.

In some embodiments, as shown in FIG. 15P, step S2 includes steps S21-2 and S22-2.

In S21-2, an initial first carrier first transport sub-layer 24' is formed by depositing on the first electrode 1, and ion implantation is performed on the initial first carrier first transport sub-layer by using a mask scanning method to form the first carrier first transport sub-layer 24.

Figure 15Q:
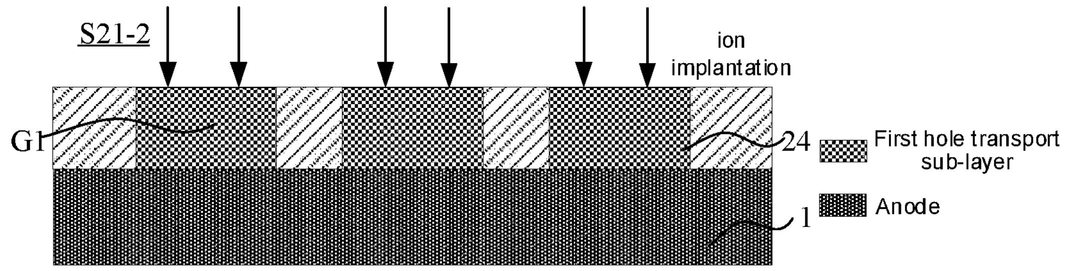
FIG. 15Q is yet another process diagram of a manufacturing method for a light-emitting device, in accordance with some embodiments of the present disclosure.

For example, as shown in FIG. 15Q, a material is deposited on the first electrode 1 by using magnetron sputtering, and the material may be ZnO or Mg-doped ZnO, thereby forming a ZnO thin film or Mg-doped ZnO thin film, and thus obtaining the initial first carrier first transport sub-layer.

For example, a mask is provided between the initial first carrier first transport sub-layer 24' and the ion implantation device, and the ion beam emitted by the ion implantation device passes through openings of the mask to reach the initial first carrier first transport sub-layer, thereby achieving the ion implantation for different positions of the initial first carrier first transport sub-layer 24'. A portion of the initial first carrier first transport sub-layer 24' that is implanted with ions forms the first carrier first transport sub-layer 24 with the patterned structures G1.

In S22-2, the first carrier second transport sub-layer 25 is formed on the first carrier first transport sub-layer 24.

Figure 15R:
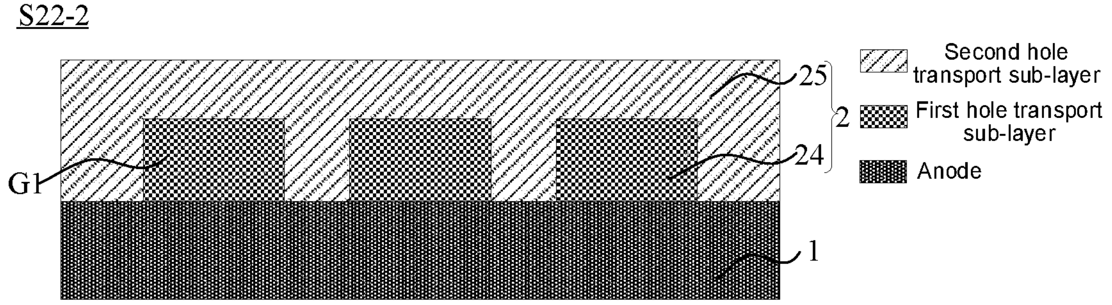
FIG. 15R is yet another process diagram of a manufacturing method for a light-emitting device, in accordance with some embodiments of the present disclosure.

For example, as shown in FIG. 15R, a material is deposited on the first carrier first transport sub-layer 24 at a normal temperature by using magnetron sputtering, and the material may be ZnO or Mg-doped ZnO, thereby forming a ZnO thin film or Mg-doped ZnO thin film, and thus obtaining the first carrier second transport sub-layer 25. Alternatively, a material is deposited on the first carrier first transport sub-layer 24 by using ink-jet printing, and the material may be zinc oxide nanoparticles formed by a sol-gel method, thereby forming a thin film of zinc oxide nanoparticles, and thus obtaining the first carrier second transport sub-layer 25.

The first carrier transport layer 2 fabricated by using S21-2 and S22-2 is the first carrier transport layer 2 shown in FIGS. 5A to 5E and 7A to 7E, and the first carrier first transport sub-layer 24 includes the plurality of patterned structures G1.

For example, the first carrier first transport sub-layer 24 away from the light-emitting layer 3 may be a C-axis oriented film layer, or a non-C-axis oriented film layer; and the first carrier second transport sub-layer 25 proximate to the light-emitting layer 3 is a C-axis oriented film layer. The C-axis oriented film layer is that the film layer has obvious crystallization and good conductivity in a vertical direction, and has a relatively poor conductivity in a direction perpendicular to the vertical direction. Therefore, during the transfer of carriers from the first electrode 1 to the light-emitting layer 3, the side leakage of the film may be effectively reduced and crosstalk may be avoided. The vertical direction is a direction perpendicular to a plane where the light-emitting layer is located.

For example, the first carrier first transport sub-layer 24 away from the light-emitting layer 3 and the first carrier second transport sub-layer 25 proximate to the light-emitting layer 3 are both C-axis oriented film layers. In this case, the first carrier second transport sub-layer 25 proximate to the light-emitting layer 3 has a greater C-axis orientation than the first carrier first transport sub-layer 24 away from the light-emitting layer 3.

The following describes the specific steps of S4 under the condition that the formed second carrier transport layer 4 includes two second carrier transport sub-layers 41 with different refractive indexes, in which the second carrier transport sub-layer proximate to the second electrode 5 is the second carrier first transport sub-layer 42, and the second carrier transport sub-layer proximate to the light-emitting layer is the second carrier second transport sub-layer 43.

Figure 16D:
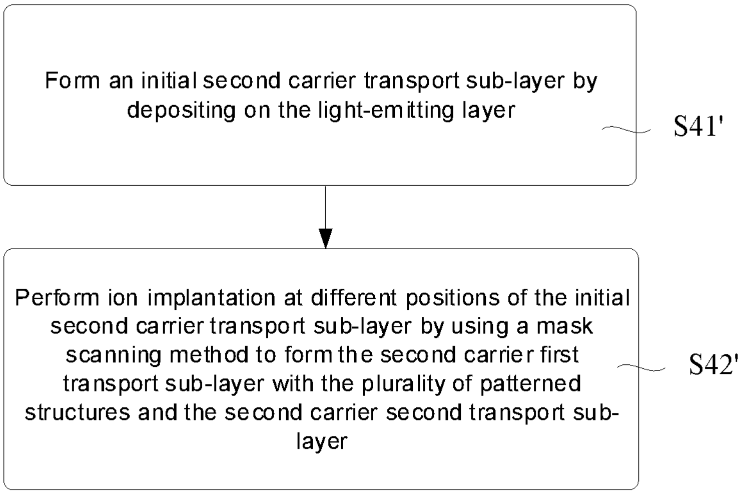
FIG. 16D is yet another flow chart of a manufacturing method for a light-emitting device, in accordance with some embodiments of the present disclosure.
Figure 16E:
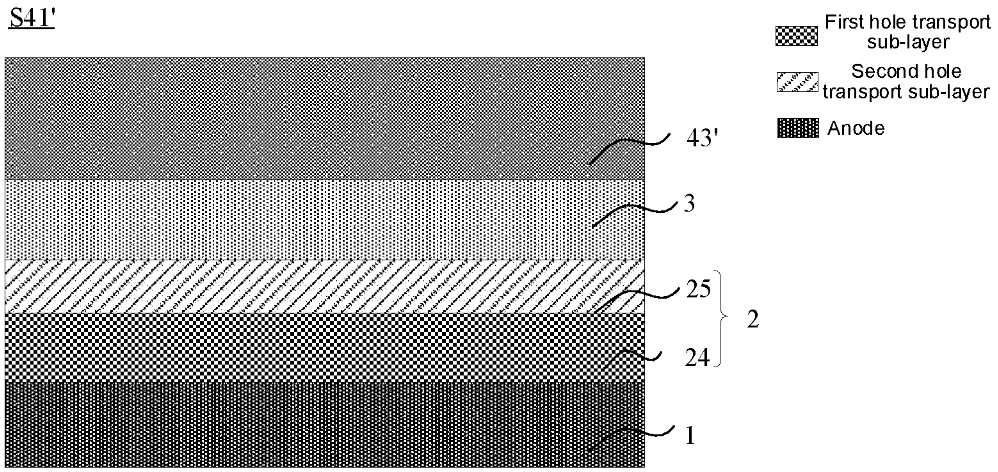
FIG. 16E is a process diagram of a manufacturing method for a light-emitting device, in accordance with some embodiments of the present disclosure.
Figure 16F:
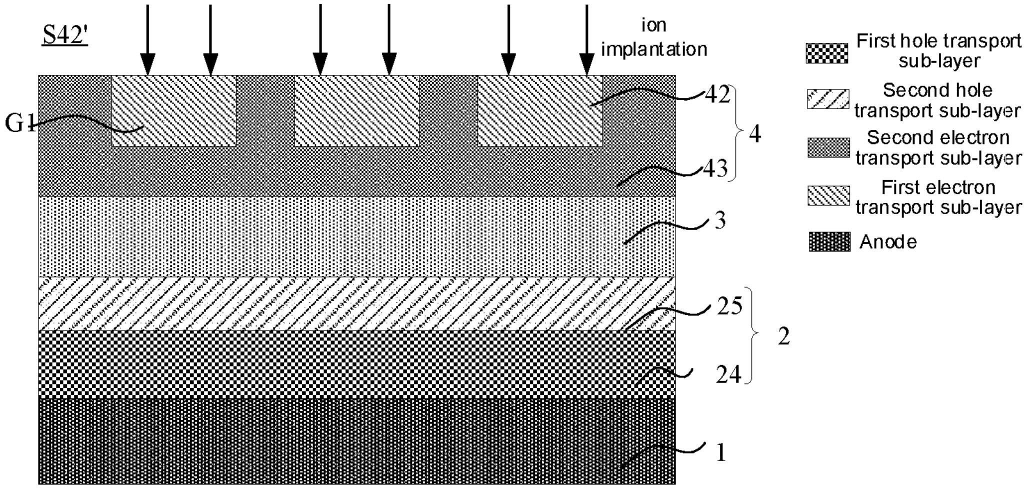
FIG. 16F is another process diagram of a manufacturing method for a light-emitting device, in accordance with some embodiments of the present disclosure.
Figure 16G:
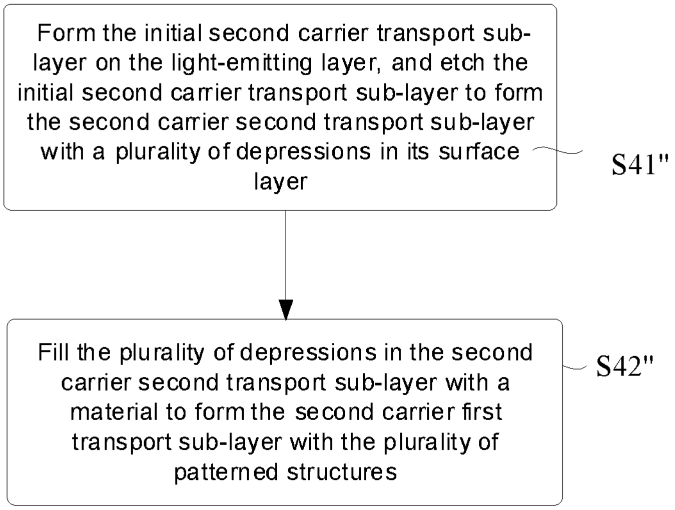
FIG. 16G is yet another flow chart of a light-emitting device, in accordance with some embodiments of the present disclosure.

As shown in FIGS. 16A, 16D and 16G, the step of forming the second carrier transport layer 4 on the light-emitting layer 3 in step S4 includes steps S41 and S42, or S41' and S42', or S41" and S42". FIGS. 16B and 16C correspond to the process diagrams of steps S41 and S42 for the light-emitting device 10 being upright, FIGS. 16E and 16F correspond to the process diagrams of steps S41' and S42', and FIGS. 16H, 16I and 16J correspond to the process diagrams of steps S41" and S42".

In some embodiments, as shown in FIG. 16A, step S4 include steps S41 and S42.

In S41, an initial second carrier transport sub-layer 43' is formed by depositing on the light-emitting layer 3.

For example, as shown in FIG. 16B, a material is deposited on the light-emitting layer 3 by using magnetron sputtering, and the material may be ZnO or Mg-doped ZnO, thereby forming a ZnO thin film or Mg-doped ZnO thin film, and thus obtaining the initial second carrier transport sub-layer.

In S42, ion implantation is performed on the initial second carrier transport sub-layer to form the second carrier first transport sub-layer 42 and the second carrier second transport sub-layer 43.

It should be noted that, the second carrier first transport sub-layer 42 is the portion of the initial second carrier transport sub-layer that has been implanted with ions, and the second carrier second transport sub-layer 43 is the portion of the initial second carrier transport sub-layer that has not been implanted with ions.

For example, as shown in FIG. 16C, the ion implantation is performed on the initial second carrier transport sub-layer (the implanted ions are, for example, high-energy oxygen ions, silicon ions, helium ions or rare earth metal thulium ions), during which the high-energy ions mainly impact the surface lattice of the initial second carrier transport sub-layer, so that the atoms in the surface lattice of the initial second carrier transport sub-layer enter the interior of the film layer to form lattice damage, thereby reducing the refractive index and forming the second carrier first transport sub-layer 42 with the low refractive index and the second carrier second transport sub-layer 43 (i.e., the portion that has not been implanted with ions.

For example, the ion implantation is performed on the initial second carrier transport sub-layer, the refractive index of the initial second carrier transport sub-layer is changed by adjusting the dose of the ion implantation, and the depth of the ions implanted in the initial second carrier transport sub-layer is adjusted by the energy of the ion implantation. Thus, the second carrier first transport sub-layer 42 and the second carrier second transport sub-layer 43 are finally formed, and the boundary line between the second carrier first transport sub-layer 42 and the second carrier second transport sub-layer 43 is related to the depth of the ion implantation.

In some embodiments, after the ion implantation, metal atoms in the lattice of the initial thin film are occupied or replaced by metal heteroatoms. For example, the material of the initial second carrier transport sub-layer is zinc oxide, and zinc atoms in the second carrier first transport sub-layer 42 are replaced by metal heteroatoms (e.g., silicon atoms, helium atoms, or the like). The concentration of the doped atoms in the second carrier first transport sub-layer decreases exponentially with the depth of the doped atoms in the second carrier first transport sub-layer, and the distance between the doped atoms becomes closer as the concentration of the doped atoms increases.

The second carrier transport layer 4 fabricated by using S41 and S42 is the second carrier transport layer 4 shown in FIGS. 4A to 4F, and the second carrier first transport sub-layer 42 is of a whole layer structure.

For example, the second carrier first transport sub-layer 42 away from the light-emitting layer 3 may be a C-axis oriented film layer, or a non-C-axis oriented film layer; and the second carrier second transport sub-layer 43 proximate to the light-emitting layer 3 is a C-axis oriented film layer. The C-axis oriented film layer is that the film layer has obvious crystallization and good conductivity in a vertical direction, and has a relatively poor conductivity in a direction perpendicular to the vertical direction. Therefore, during the transfer of carriers from the second electrode 5 to the light-emitting layer 3, the side leakage of the film may be effectively reduced and crosstalk may be avoided. The vertical direction is a direction perpendicular to a plane where the light-emitting layer is located.

For example, the second carrier first transport sub-layer 42 away from the light-emitting layer 3 and the second carrier second transport sub-layer 43 proximate to the light-emitting layer 3 are both C-axis oriented film layers. In this case, the second carrier second transport sub-layer 43 proximate to the light-emitting layer 3 has a greater C-axis orientation than the second carrier first transport sub-layer 42 away from the light-emitting layer 3, which means that a ratio of the conductivity of the second carrier second transport sub-layer 43 in the direction perpendicular to the plane where the light-emitting layer 3 is located to the conductivity of the second carrier second transport sub-layer 43 in the direction parallel to the plane where the light-emitting layer 3 is located is greater.

In some embodiments, as shown in FIG. 16D, step S4 include steps S41' and S42'.

In S41', an initial second carrier transport sub-layer 43' is formed by depositing on the light-emitting layer 3.

For example, as shown in FIG. 16E, a material is deposited on the light-emitting layer 3 by using magnetron sputtering, and the material may be ZnO or Mg-doped ZnO, thereby forming a ZnO thin film or Mg-doped ZnO thin film, and thus obtaining the second carrier transport sub-layer.

In S42', ion implantation is performed at different positions of the initial second carrier transport sub-layer by using a mask scanning method to form the second carrier first transport sub-layer 42 with the plurality of patterned structures G1 and the second carrier second transport sub-layer 43.

For example, as shown in FIG. 16F, a mask is provided between the initial second carrier transport sub-layer and the ion implantation device, and the ion beam emitted by the ion implantation device passes through openings of the mask to reach the initial second carrier transport sub-layer, thereby achieving the ion implantation for different positions of the initial second carrier transport sub-layer. A portion of the initial second carrier transport sub-layer that is implanted with ions forms the second carrier first transport sub-layer 42 with the patterned structures G1, and a portion of the initial second carrier transport sub-layer that has not been implanted with ions forms the second carrier second transport sub-layer 43.

The refractive index of the initial second carrier transport sub-layer is changed by adjusting the dose of ion implantation, and the depth of ions implanted in the initial second carrier transport sub-layer is adjusted by the energy of ion implantation.

The second carrier transport layer 4 fabricated by using S41' and S42' is the second carrier transport layer 4 shown in FIGS. 6A to 6E and 7A to 7E, and the second carrier first transport sub-layer 42 includes the patterned structures G1.

For example, the second carrier first transport sub-layer 42 away from the light-emitting layer 3 may be a C-axis oriented film layer, or a non-C-axis oriented film layer; and the second carrier second transport sub-layer 43 proximate to the light-emitting layer 3 is a C-axis oriented film layer. The C-axis oriented film layer is that the film layer has obvious crystallization and good conductivity in a vertical direction, and has a relatively poor conductivity in a direction perpendicular to the vertical direction. Therefore, during the transfer of carriers from the second electrode 5 to the light-emitting layer 3, the side leakage of the film may be effectively reduced and crosstalk may be avoided. The vertical direction is a direction perpendicular to a plane where the light-emitting layer is located.

For example, the second carrier first transport sub-layer 42 away from the light-emitting layer 3 and the second carrier second transport sub-layer 43 proximate to the light-emitting layer 3 are both C-axis oriented film layers. In this case, the second carrier second transport sub-layer 43 proximate to the light-emitting layer 3 has a greater C-axis orientation than the second carrier first transport sub-layer 42 away from the light-emitting layer 3, which means that a ratio of the conductivity of the second carrier second transport sub-layer 43 in the direction perpendicular to the plane where the light-emitting layer 3 is located to the conductivity of the second carrier second transport sub-layer 43 in the direction parallel to the plane where the light-emitting layer 3 is located is greater.

In some embodiments, as shown in FIG. 16G, step S4 includes steps S41" and S42".

In S41", the initial second carrier transport sub-layer is formed on the light-emitting layer 3, and the initial second carrier transport sub-layer is etched to form the second carrier second transport sub-layer with a plurality of depressions in its surface layer.

Figure 16H:
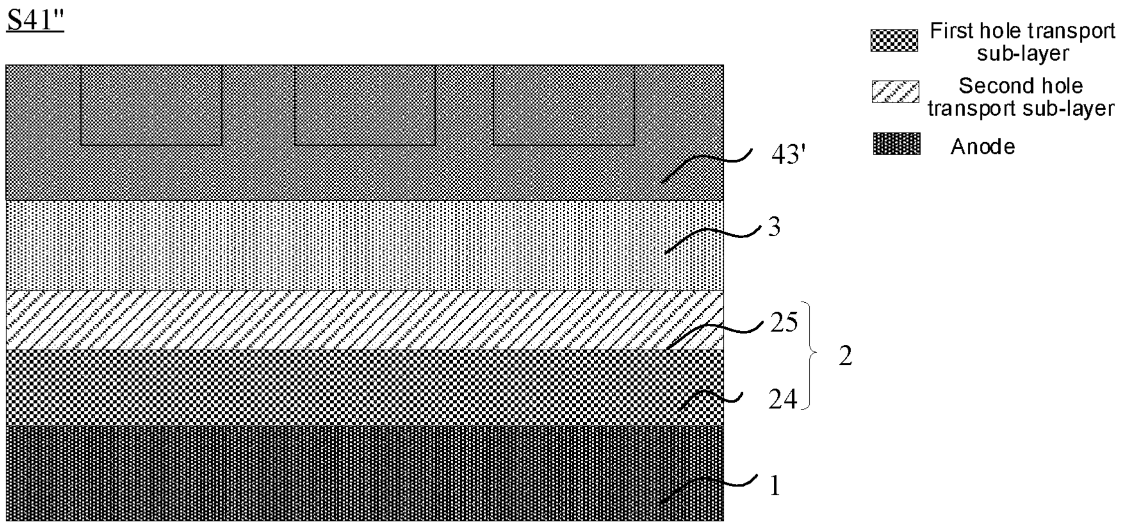
FIG. 16H is a process diagram of a manufacturing method for a light-emitting device, in accordance with some embodiments of the present disclosure.
Figure 16I:
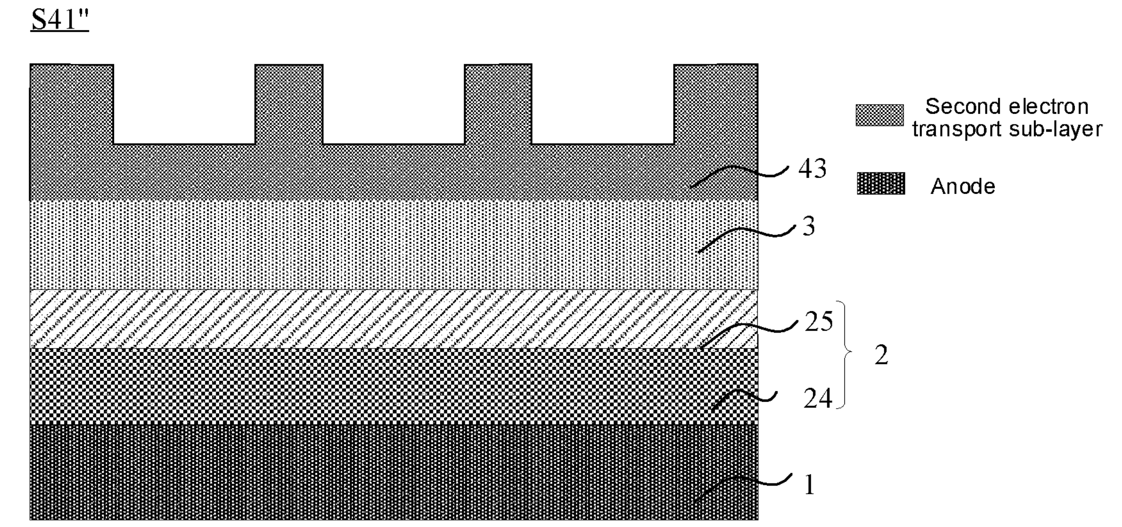
FIG. 16I is another process diagram of a manufacturing method for a light-emitting device, in accordance with some embodiments of the present disclosure.

For example, as shown in FIG. 16H, a material is deposited on the light-emitting layer 3 by using magnetron sputtering, and the material may be ZnO or Mg-doped ZnO, thereby forming a ZnO thin film or Mg-doped ZnO thin film, and thus obtaining the initial second carrier transport sub-layer 43'. As shown in FIG. 16I, the initial second carrier transport sub-layer is etched by a photolithography process, part of the material in etched regions of the initial second carrier transport sub-layer is removed, and the remaining part of the initial second carrier transport sub-layer forms the second carrier second transport sub-layer 43.

For example, the etched regions of the initial second carrier transport sub-layer are part of regions in the portion of the initial second carrier transport sub-layer away from the light-emitting layer, these regions are three-dimensional regions, and the etched region may be in a shape of a prism, a semi-cylinder, a pyramid, a hemisphere, a semi-ellipsoid, a truncated pyramid, or the like. After part of the material in the etched regions of the initial second carrier transport sub-layer is removed by the etching process, as shown in FIG. 16I, the depressions are formed in the surface layer of the initial second carrier transport sub-layer.

In S42", the plurality of depressions in the second carrier second transport sub-layer are filled with a material to form the second carrier first transport sub-layer 42 with the plurality of patterned structures G1.

Figure 16J:
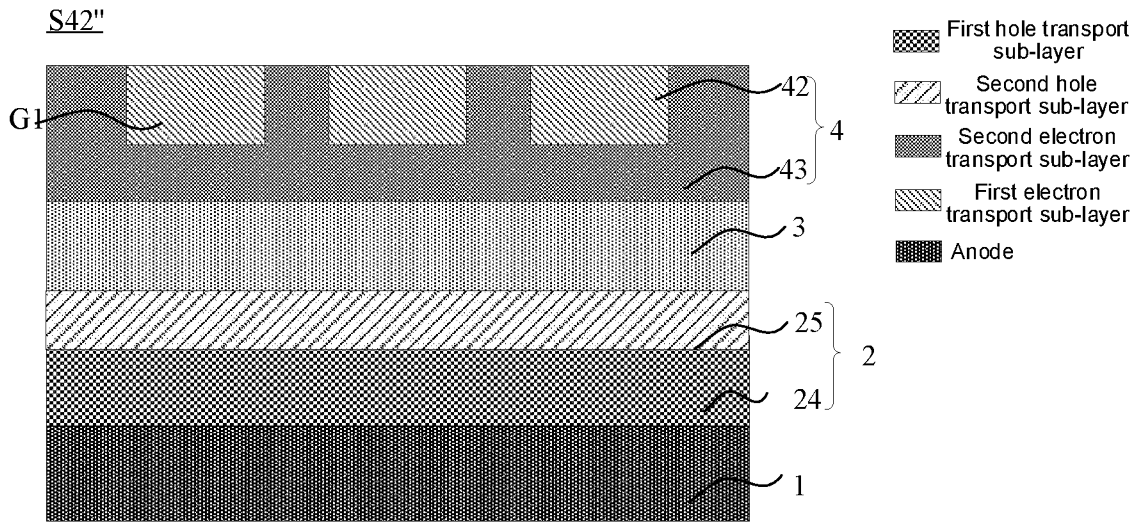
FIG. 16J is yet another process diagram of a manufacturing method for a light-emitting device, in accordance with some embodiments of the present disclosure.

For example, as shown in FIG. 16J, the depressions in the second carrier second transport sub-layer are filled with the material whose refractive index is lower than that of the material of the second carrier second transport sub-layer 43, so that the material filled in the depression forms the patterned structure G1, and the plurality of patterned structures G1 in the depressions form the second carrier first transport sub-layer 42.

The second carrier transport layer 4 fabricated by using S41" and S42" is the second carrier transport layer 4 shown in FIGS. 6A to 6E and 7A to 7E, and the second carrier first transport sub-layer 42 includes the patterned structures G1.

For example, the second carrier first transport sub-layer 42 away from the light-emitting layer 3 may be a C-axis oriented film layer, or a non-C-axis oriented film layer; and the second carrier second transport sub-layer 43 proximate to the light-emitting layer 3 is a C-axis oriented film layer. The C-axis oriented film layer is that the film layer has obvious crystallization and good conductivity in a vertical direction, and has a relatively poor conductivity in a direction perpendicular to the vertical direction. Therefore, during the transfer of carriers from the second electrode 5 to the light-emitting layer 3, the side leakage of the film may be effectively reduced and crosstalk may be avoided. The vertical direction is a direction perpendicular to a plane where the light-emitting layer is located.

For example, the second carrier first transport sub-layer 42 away from the light-emitting layer 3 and the second carrier second transport sub-layer 43 proximate to the light-emitting layer 3 are both C-axis oriented film layers. In this case, the second carrier second transport sub-layer 43 proximate to the light-emitting layer 3 has a greater C-axis orientation than the second carrier first transport sub-layer 42 away from the light-emitting layer 3, which means that a ratio of the conductivity of the second carrier second transport sub-layer 43 in the direction perpendicular to the plane where the light-emitting layer 3 is located to the conductivity of the second carrier second transport sub-layer 43 in the direction parallel to the plane where the light-emitting layer 3 is located is greater.

It should be noted that, in terms of structure, the light-emitting device 10 can be of an upright structure and an inverted structure; the first electrode 1 is usually used as the anode in the upright structure, and then the hole injection layer 8, the hole transport layer, the light-emitting layer 3, the electron transport layer 2 and the cathode are sequentially deposited; and the first electrode 1 is used as the cathode in the inverted structure on which the electron transport layer 2 is directly deposited, and then the light-emitting layer 3, the hole transport layer 4, the hole injection layer 8 and the anode are deposited.

Figure 17:
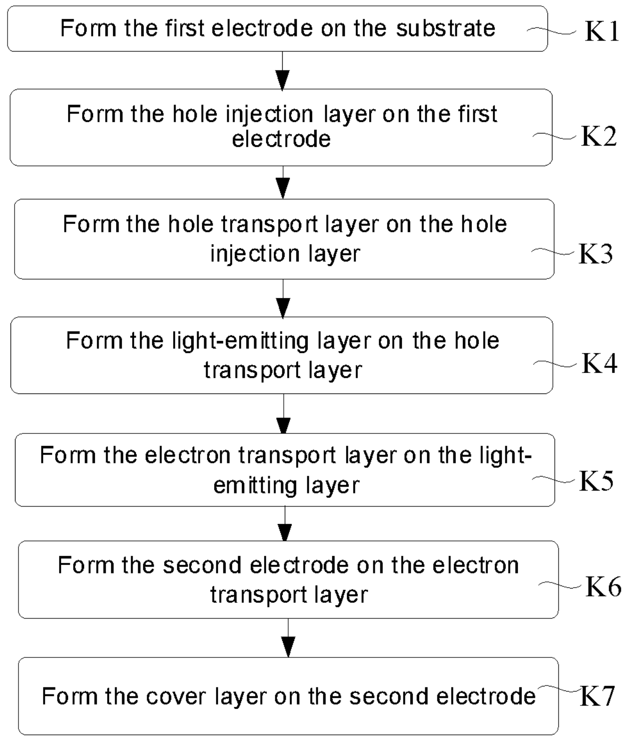
FIG. 17 is a flow chart of a manufacturing method for a light-emitting device, in accordance with some embodiments of the present disclosure.

In some examples, as shown in FIG. 10, the above-mentioned upright light-emitting device 10 is used as an example; as shown in FIG. 17, steps of forming the light-emitting device 10 include K1 to K7.

In K1, the first electrode 1 is formed on the substrate.

For example, the first electrode 1 is the anode.

For the first electrode 1 as the anode, reference may be made to step S1 for details, which will not be repeated here.

In K2, the hole injection layer 8 is formed on the first electrode 1.

For example, the thickness of the hole injection layer 8 is in a range of 3 nm to 7 nm, preferably 5 nm. The hole injection layer 8 is made of an organic material.

In K3, the hole transport layer is formed on the hole injection layer 8.

For example, reference may be made to the above steps S21 and S22 of forming the first carrier transport layer 2, i.e., forming the hole transport layer, which will not be repeated here.

In K4, the light-emitting layer 3 is formed on the hole transport layer.

For example, for this step, reference may be made to the description for forming the light-emitting layer 3 in the above-mentioned step S3, which will not be repeated here.

In K5, the electron transport layer is formed on the light-emitting layer 3.

For example, reference may be made to the above steps S41 and S42 or S41' and S42' of forming the second carrier transport layer 4, i.e., forming the electron transport layer, which will not be repeated here.

In K6, the second electrode 5 is formed on the electron transport layer.

For example, the second electrode 5 is the cathode. For the second electrode 5 as the cathode, reference may be made to step S5 for details, which will not be repeated here.

In K7, the cover layer 9 is formed on the second electrode 5.

For example, reference may be made to the introduction for the cover layer 9 in step S6, which will not be repeated here.

Figure 18:
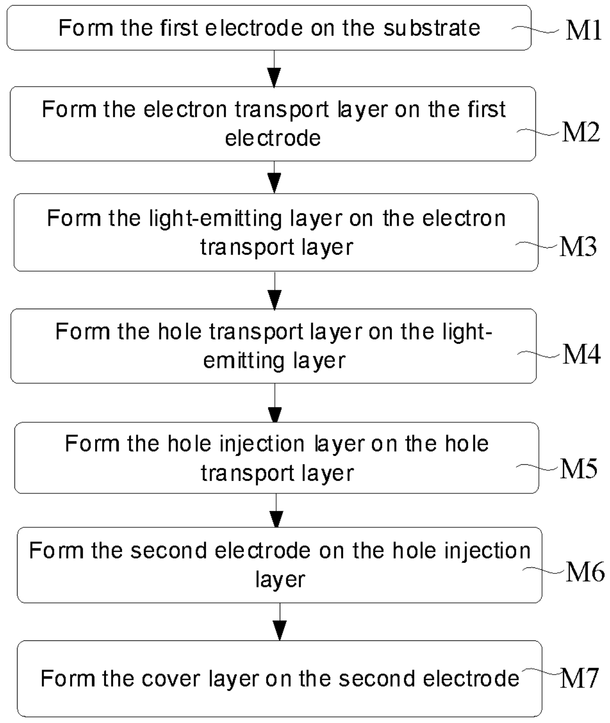
FIG. 18 is a flow chart of a manufacturing method for another light-emitting device, in accordance with some embodiments of the present disclosure.

In some examples, as shown in FIG. 11, the above-mentioned inverted light-emitting device 10 is used as an example; as shown in FIG. 18, steps of forming the light-emitting device 10 include M1 to M7.

In M1, the first electrode 1 is formed on the substrate.

For example, the first electrode 1 is the cathode.

For the first electrode 1 as the cathode, reference may be made to step S1 for details, which will not be repeated here.

In M2, the electron transport layer is formed on the first electrode 1.

For example, reference may be made to the above steps S21 and S22 of forming the first carrier transport layer 2, i.e., forming the electron transport layer, which will not be repeated here.

In M3, the light-emitting layer 3 is formed on the electron transport layer.

For example, for this step, reference may be made to the description for forming the light-emitting layer 3 in the above-mentioned step S3, which will not be repeated here. In M4, the hole transport layer is formed on the light-emitting layer 3.

For example, reference may be made to the above steps S41 and S42 or S41' and S42' of forming the second carrier transport layer 4, i.e., forming the hole transport layer, which will not be repeated here.

In M5, the hole injection layer 8 is formed on the hole transport layer.

For example, reference may be made to the above steps S21 and S22 of forming the first carrier transport layer 2, i.e., forming the hole transport layer, which will not be repeated here.

For example, the thickness of the hole injection layer 8 is in a range of 3 nm to 7 nm, preferably 5 nm.

In M6, the second electrode 5 is formed on the hole injection layer 8.

For example, the second electrode 5 is the anode. For the second electrode 5 as the anode, reference may be made to step S5 for details, which will not be repeated here. In M7, the cover layer 9 is formed on the second electrode 5.

For example, reference may be made to the introduction for the cover layer 9 in step S6, which will not be repeated here.

Figure 21:
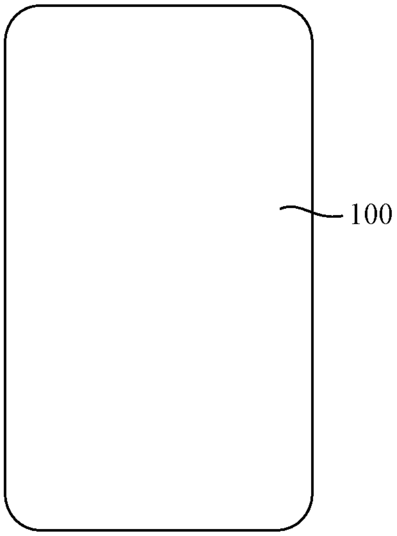
FIG. 21 is a structural diagram of yet another display substrate, in accordance with some embodiments of the present disclosure.

Some embodiments of the present disclosure further provide a display substrate 100, and as shown in FIG. 21, the display substrate 100 includes the light-emitting device 10 as described above.

The display substrate 100 may be, for example, a quantum dot light-emitting diode (QLED) display substrate, a mini light-emitting diode (Mini LED) display substrate, or a micro light-emitting diode (Micro LED) display substrate.

The beneficial effects of the display substrate 100 are the same as the beneficial effects of the light-emitting device 10 provided in the first aspect of the present disclosure, which will not be repeated here.

Figure 19A:
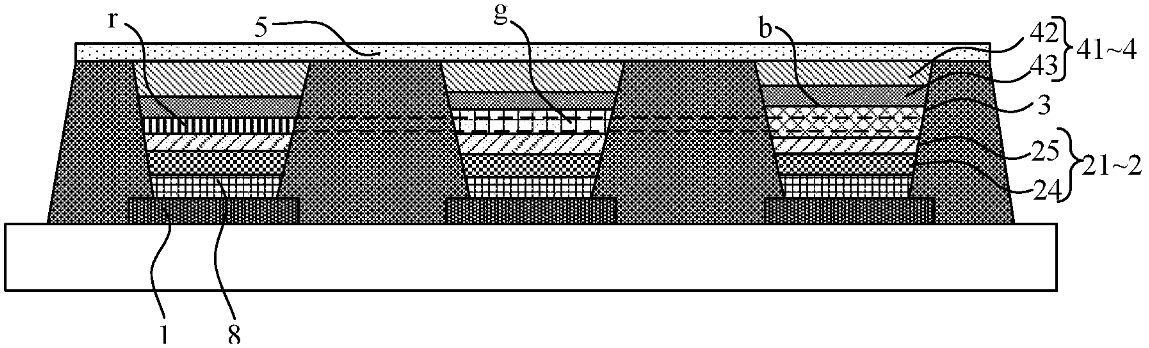
FIG. 19A is a structural diagram of a display substrate, in accordance with some embodiments of the present disclosure.
Figure 19B:
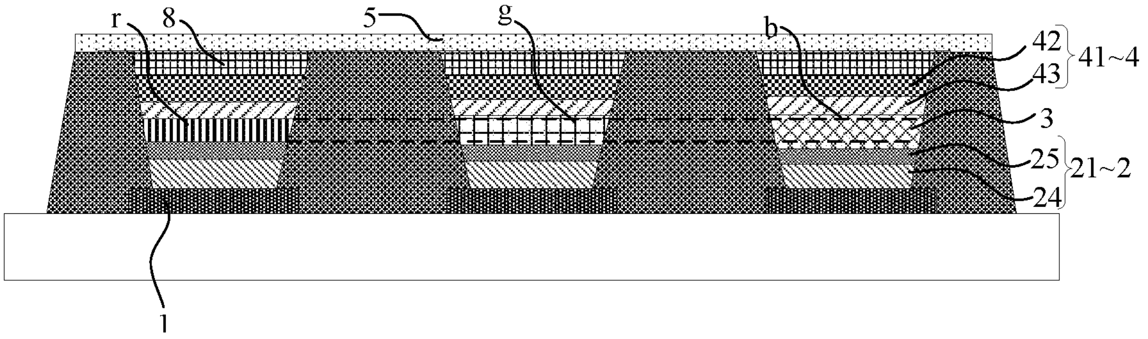
FIG. 19B is a structural diagram of another display substrate, in accordance with some embodiments of the present disclosure.

In some embodiments, as shown in FIGS. 19A and 19B, the display substrate 100 includes a plurality of sub-pixels, and the plurality of sub-pixels include red sub-pixels, green sub-pixels and blue sub-pixels. A surface of the first carrier transport layer 2 of the light-emitting device in the red sub-pixel away from the first electrode 1, a surface of the first carrier transport layer 2 of the light-emitting device in the green sub-pixel away from the first electrode 1, and a surface of the first carrier transport layer 2 of the light-emitting device in the blue sub-pixel away from the first electrode 1 are not in the same plane; and a surface of the second carrier transport layer 4 of the light-emitting device in the red sub-pixel away from the second electrode 5, a surface of the second carrier transport layer 4 of the light-emitting device in the green sub-pixel away from the second electrode 5, and a surface of the second carrier transport layer 4 of the light-emitting device in the blue sub-pixel away from the second electrode 5 are not in the same plane.

For example, as shown in FIG. 19A, the light-emitting device 10 is upright; in this case, the first carrier transport layer 2 is the hole transport layer, and the second carrier transport layer 4 is the electron transport layer. The surface of the first carrier transport layer 2 of the light-emitting device in the red sub-pixel away from the first electrode 1, the surface of the first carrier transport layer 2 of the light-emitting device in the green sub-pixel away from the first electrode 1, and the surface of the first carrier transport layer 2 of the light-emitting device in the blue sub-pixel away from the first electrode 1 are not in the same plane. That is, the surface of the hole transport layer of the light-emitting device in the red sub-pixel away from the first electrode 1, the surface of the hole transport layer of the light-emitting device in the green sub-pixel away from the first electrode 1, and the surface of the hole transport layer of the light-emitting device in the blue sub-pixel away from the first electrode 1 are not in the same plane. The surface of the second carrier transport layer 4 of the light-emitting device in the red sub-pixel away from the second electrode 5, the surface of the second carrier transport layer 4 of the light-emitting device in the green sub-pixel away from the second electrode 5, and the surface of the second carrier transport layer 4 of the light-emitting device in the blue sub-pixel away from the second electrode 5 are not in the same plane. That is, the surface of the electron transport layer of the light-emitting device in the red sub-pixel away from the second electrode 5, the surface of the electron transport layer of the light-emitting device in the green sub-pixel away from the second electrode 5, and the surface of the electron transport layer of the light-emitting device in the blue sub-pixel away from the second electrode 5 are not in the same plane.

For example, as shown in FIG. 19B, the light-emitting device 10 is inverted; in this case, the first carrier transport layer 2 is the electron transport layer, and the second carrier transport layer 4 is the hole transport layer. The surface of the first carrier transport layer 2 of the light-emitting device in the red sub-pixel away from the first electrode 1, the surface of the first carrier transport layer 2 of the light-emitting device in the green sub-pixel away from the first electrode 1, and the surface of the first carrier transport layer 2 of the light-emitting device in the blue sub-pixel away from the first electrode 1 are not in the same plane. That is, the surface of the electron transport layer of the light-emitting device in the red sub-pixel away from the first electrode 1, the surface of the electron transport layer of the light-emitting device in the green sub-pixel away from the first electrode 1, and the surface of the electron transport layer of the light-emitting device in the blue sub-pixel away from the first electrode 1 are not in the same plane. The surface of the second carrier transport layer 4 of the light-emitting device in the red sub-pixel away from the second electrode 5, the surface of the second carrier transport layer 4 of the light-emitting device in the green sub-pixel away from the second electrode 5, and the surface of the second carrier transport layer 4 of the light-emitting device in the blue sub-pixel away from the second electrode 5 are not in the same plane. That is, the surface of the hole transport layer of the light-emitting device in the red sub-pixel away from the second electrode 5, the surface of the hole transport layer of the light-emitting device in the green sub-pixel away from the second electrode 5, and the surface of the hole transport layer of the light-emitting device in the blue sub-pixel away from the second electrode 5 are not in the same plane.

It should be noted that, the surface of the first carrier transport layer 2 of the light-emitting device in the red sub-pixel away from the first electrode 1, the surface of the first carrier transport layer 2 of the light-emitting device in the green sub-pixel away from the first electrode 1, and the surface of the first carrier transport layer 2 of the light-emitting device in the blue sub-pixel away from the first electrode 1 are not in the same plane, that is, the surface of the electron transport layer of the light-emitting device in the red sub-pixel away from the first electrode 1, the surface of the electron transport layer of the light-emitting device in the green sub-pixel away from the first electrode 1, and the surface of the electron transport layer of the light-emitting device in the blue sub-pixel away from the first electrode 1 are not in the same plane, which means that thicknesses of the first carrier transport layer 2 of the light-emitting device in the red sub-pixel, the first carrier transport layer 2 of the light-emitting device in the green sub-pixel, and the first carrier transport layer 2 of the light-emitting device in the blue sub-pixel are different. The surface of the second carrier transport layer 4 of the light-emitting device in the red sub-pixel away from the second electrode 5, the surface of the second carrier transport layer 4 of the light-emitting device in the green sub-pixel away from the second electrode 5, and the surface of the second carrier transport layer 4 of the light-emitting device in the blue sub-pixel away from the second electrode 5 are not in the same plane. That is, thicknesses of the second carrier transport layer 4 of the light-emitting device in the red sub-pixel, the second carrier transport layer 4 of the light-emitting device in the green sub-pixel, and the second carrier transport layer 4 of the light-emitting device in the blue sub-pixel are different. There are different cavity length requirements for the light-emitting devices in different sub-pixels under the condition of achieving optimal light extraction efficiency, that is, there are different thickness requirements for the first carrier transport layer 2 and the second carrier transport layer 4. For example, red, green, and blue light-emitting devices have the optimum light extraction efficiency at cavity lengths of 140 nm, 120 nm, and 80 nm, respectively; and the corresponding thickness requirements for the first carrier transport layer 2 and the second carrier transport layer 4 are the same as the previous content.

Figure 20A:
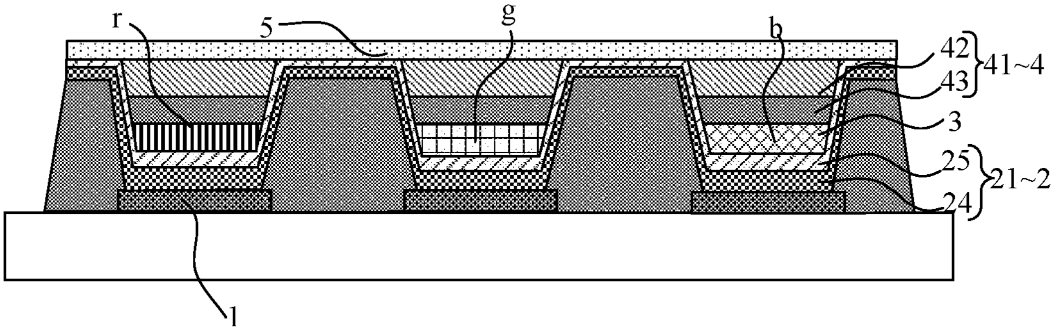
FIG. 20A is a structural diagram of a display substrate, in accordance with some embodiments of the present disclosure.
Figure 20B:
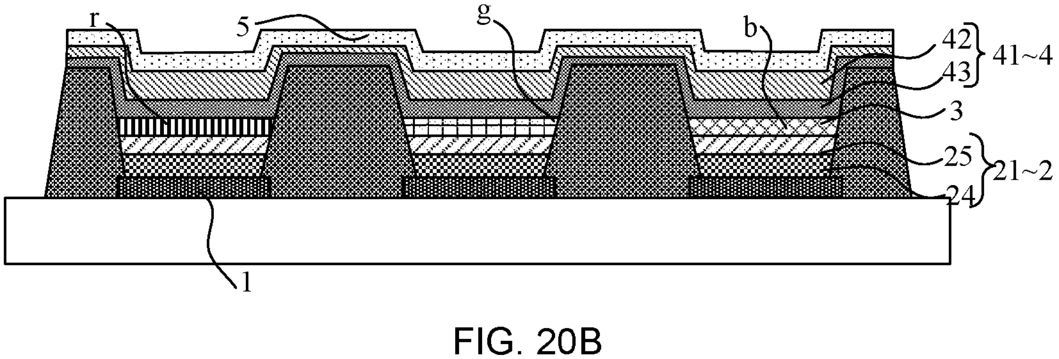
FIG. 20B is a structural diagram of another display substrate, in accordance with some embodiments of the present disclosure.

In some embodiments, as shown in FIGS. 20A and 20B, the display substrate 100 includes a plurality of sub-pixels, and the plurality of sub-pixels include red sub-pixels, green sub-pixels and blue sub-pixels. A surface of the first carrier transport layer 2 of the light-emitting device in the red sub-pixel away from the first electrode 1, a surface of the first carrier transport layer 2 of the light-emitting device in the green sub-pixel away from the first electrode 1, and a surface of the first carrier transport layer 2 of the light-emitting device in the blue sub-pixel away from the first electrode 1 are in the same plane; and a surface of the second carrier transport layer 4 of the light-emitting device in the red sub-pixel away from the second electrode 5, a surface of the second carrier transport layer 4 of the light-emitting device in the green sub-pixel away from the second electrode 5, and a surface of the second carrier transport layer 4 of the light-emitting device in the blue sub-pixel away from the second electrode 5 are in the same plane.

For example, as shown in FIG. 20A, the figure is a structure diagram of light-emitting devices 10 sharing the first carrier transport layer 2. The light-emitting device 10 is upright, and the first carrier transport layer 2 is the hole transport layer; the light-emitting device 10 is inverted, the first carrier transport layer 2 is the electron transport layer. The surface of the first carrier transport layer 2 of the light-emitting device in the red sub-pixel away from the first electrode 1, the surface of the first carrier transport layer 2 of the light-emitting device in the green sub-pixel away from the first electrode 1, and the surface of the first carrier transport layer 2 of the light-emitting device in the blue sub-pixel away from the first electrode 1 are in the same plane. That is, in the case where the light-emitting device 10 is upright, the surface of the hole transport layer of the red sub-pixel away from the first electrode 1, the surface of the hole transport layer of the green sub-pixel away from the first electrode 1, and the surface of the hole transport layer of the blue sub-pixel away from the first electrode 1 are in the same plane; and in the case where the light-emitting device 10 is inverted, the surface of the electron transport layer of the red sub-pixel away from the first electrode 1, the surface of the electron transport layer of the green sub-pixel away from the first electrode 1, and the surface of the electron transport layer of the blue sub-pixel away from the first electrode 1 are in the same plane.

For example, as shown in FIG. 20B, the figure is a structure diagram of light-emitting devices 10 sharing the second carrier transport layer 4. The light-emitting device 10 is upright, and the second carrier transport layer 4 is the electron transport layer; the light-emitting device 10 is inverted, the second carrier transport layer 4 is the hole transport layer. The surface of the second carrier transport layer 4 of the light-emitting device in the red sub-pixel away from the second electrode 5, the surface of the second carrier transport layer 4 of the light-emitting device in the green sub-pixel away from the second electrode 5, and the surface of the second carrier transport layer 4 of the light-emitting device in the blue sub-pixel away from the second electrode 5 are in the same plane. That is, in the case where the light-emitting device 10 is upright, the surface of the electron transport layer of the light-emitting device in the red sub-pixel away from the second electrode 5, the surface of the electron transport layer of the light-emitting device in the green sub-pixel away from the second electrode 5, and the surface of the electron transport layer of the light-emitting device in the blue sub-pixel away from the second electrode 5 are in the same plane; and in the case where the light-emitting device 10 is inverted, the surface of the hole transport layer of the light-emitting device in the red sub-pixel away from the second electrode 5, the surface of the hole transport layer of the light-emitting device in the green sub-pixel away from the second electrode 5, and the surface of the hole transport layer of the light-emitting device in the blue sub-pixel away from the second electrode 5 are in the same plane.

It should be noted that, in the red sub-pixel, green sub-pixel and blue sub-pixel, the surfaces of the first carrier transport layers of the light-emitting devices away from the first electrode 1 are in the same plane, and the second carrier transport layers are also on the same plane, that is, the thicknesses of the first carrier transport layer 2 of the light-emitting device in the red sub-pixel, the first carrier transport layer 2 of the light-emitting device in the green sub-pixel, and the first carrier transport layer 2 of the light-emitting device in the blue sub-pixel are the same, and the thicknesses of the second carrier transport layer 4 of the light-emitting device in the red sub-pixel, the second carrier transport layer 4 of the light-emitting device in the green sub-pixel, and the second carrier transport layer 4 of the light-emitting device in the blue sub-pixel are the same.

In some embodiments, a wavelength of light emitted by the light-emitting device in the red sub-pixel is $\lambda 1$, a wavelength of light emitted by the light-emitting device in the green sub-pixel is $\lambda 2$, and a wavelength of light emitted by the light-emitting device in the blue sub-pixel is $\lambda 3$; $\lambda 1>\lambda 2>\lambda 3$.

A proportion of the thickness of the first carrier first transport sub-layer 24 to the total thickness of the first carrier transport layer in the light-emitting device in the red sub-pixel is k1, a proportion of the thickness of the first carrier first transport sub-layer 24 to the total thickness of the first carrier transport layer in the light-emitting device in the green sub-pixel is k2, a proportion of the thickness of the first carrier first transport sub-layer 24 to the total thickness of the first carrier transport layer in the light-emitting device in the blue sub-pixel is k3; $k1<k2<k3$.

For example, in order to ensure better light extraction efficiency in the case of the above-mentioned equal thickness, light-emitting devices 10 in different sub-pixels are provided. The smaller the wavelength of the light emitted by the light-emitting layer 3, the higher the proportion of the thickness of the first carrier first transport sub-layer 24 to the total thickness of the first carrier transport layer 2. That is, in a case where the light-emitting layer 3 emits red light, the proportion of the thickness of the first carrier first transport sub-layer 24 to the total thickness of the first carrier transport layer 2 is the lowest; in a case where the light-emitting layer 3 emits blue light, the proportion of the thickness of the first carrier first transport sub-layer 24 to the total thickness of the first carrier transport layer 2 is the highest; and in a case where the light-emitting layer 3 emits green light, the proportion of the thickness of the first carrier first transport sub-layer 24 to the total thickness of the first carrier transport layer 2 is between the proportion for the red light and the proportion for the blue light.

In some embodiments, a proportion of the thickness of the second carrier first transport sub-layer to the total thickness of the second carrier transport layer in the light-emitting device in the red sub-pixel is k1', a proportion of the thickness of the second carrier first transport sub-layer to the total thickness of the second carrier transport layer in the light-emitting device in the green sub-pixel is k2', and a proportion of the thickness of the second carrier first transport sub-layer to the total thickness of the second carrier transport layer in the light-emitting device in the blue sub-pixel is k3'; $k1'<k2'<k3'$.

For example, the smaller the wavelength of the light emitted by the light-emitting layer 3, the higher the proportion of the thickness of the second carrier first transport sub-layer 42 to the total thickness of the second carrier transport layer 4. That is, in the case where the light-emitting layer 3 emits red light, the proportion of the thickness of the second carrier first transport sub-layer 42 to the total thickness of the second carrier transport layer 4 is the lowest; in the case where the light-emitting layer 3 emits blue light, the proportion of the thickness of the second carrier first transport sub-layer 42 to the total thickness of the second carrier transport layer 4 is the highest; and in the case where the light-emitting layer 3 emits green light, the proportion of the thickness of the second carrier first transport sub-layer 42 to the total thickness of the second carrier transport layer 4 is between the proportion for the red light and the proportion for the blue light. For example, the specific thickness range values of the first carrier first transport sub-layer, the first carrier second transport sub-layer, the second carrier first transport sub-layer, and the second carrier second transport sub-layer can refer to the thickness requirements of the aforementioned part, and the refractive index requirement of each film layer can also refer to the refractive index of the aforementioned part.

In some embodiments, the proportion of the thickness of the first carrier first transport sub-layer 24 to the total thickness of the first carrier transport layer in the light-emitting device in the red sub-pixel is k1, the proportion of the thickness of the first carrier first transport sub-layer 24 to the total thickness of the first carrier transport layer in the light-emitting device in the green sub-pixel is k2, and the proportion of the thickness of the first carrier first transport sub-layer 24 to the total thickness of the first carrier transport layer 2 in the light-emitting device in the blue sub-pixel is k3; $k1<k2<k3$. The proportion of the thickness of the second carrier first transport sub-layer to the total thickness of the second carrier transport layer in the light-emitting device in the red sub-pixel is k1', the proportion of the thickness of the second carrier first transport sub-layer to the total thickness of the second carrier transport layer in the light-emitting device in the green sub-pixel is k2', and the proportion of the thickness of the second carrier first transport sub-layer to the total thickness of the second carrier transport layer in the light-emitting device in the blue sub-pixel is k3'; $k1'<k2'<k3'$.

For example, for the explanations about the proportion of the thickness of the film layer in the above embodiments, reference is made to the introduction in the aforementioned part, and details are not repeated here.

Figure 22:
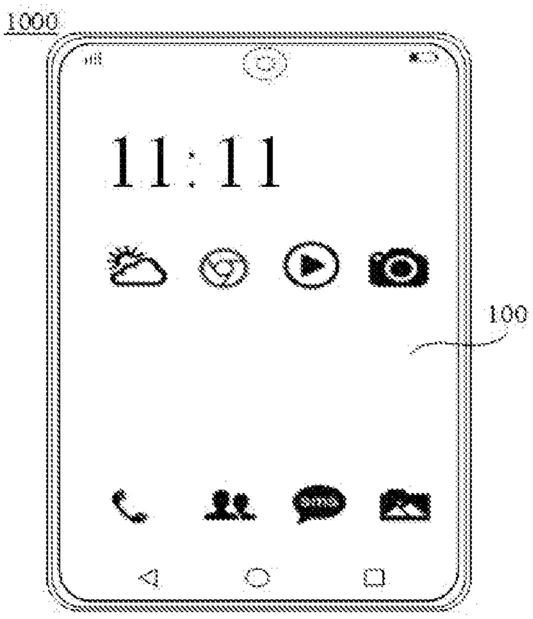
FIG. 22 is a structural diagram of a display apparatus, in accordance with some embodiments of the present disclosure.

Some embodiments of the present disclosure further provide a display apparatus 1000. As shown in FIG. 22, the display apparatus 1000 includes the display substrate 100 described above.

The display apparatus 1000 provided in the embodiments of the present disclosure may be any apparatus that displays an image whether in motion (e.g., a video) or stationary (e.g., a still image), and whether literal or graphical. More specifically, it is expected that the embodiments may be implemented in or associated with a plurality of electronic devices. The plurality of electronic devices may include (but is not limit to), for example, mobile telephones, wireless devices, personal data assistants (PAD), hand-held or portable computers, GPS receivers/navigators, cameras, MP4 video players, video cameras, game consoles, watches, clocks, calculators, TV monitors, flat panel displays, computer monitors, car displays (such as odometer displays, etc.), navigators, cockpit controllers and/or displays, camera view displays (such as rear view camera displays in vehicles), electronic photos, electronic billboards or indicators, projectors, building structures, packagings and aesthetic structures (such as a display for an image of a piece of jewelry), etc.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting device, comprising: a first electrode, and a first carrier transport layer, a light-emitting layer, a second carrier transport layer and a second electrode that are stacked on the first electrode in sequence, wherein transmittance of the second electrode is higher than that of the first electrode, and the transmittance is transmittance of visible light;

the first carrier transport layer includes at least two first carrier transport sub-layers with different refractive indexes, and in the at least two first carrier transport sub-layers, the refractive indexes of the first carrier transport sub-layers decrease layer by layer in a direction from the light-emitting layer to the first electrode; and in the at least two first carrier transport sub-layers, a thickness of a film layer with a low refractive index is greater than a thickness of a film layer with a high refractive index, wherein the at least two first carrier transport sub-layers include two first carrier transport sub-layers, a first carrier transport sub-layer proximate to the first electrode is a first carrier first transport sub-layer, and a first carrier transport sub-layer proximate to the light-emitting layer is a first carrier second transport sub-layer; and same host atoms are included in the first carrier first transport sub-layer and the first carrier second transport sub-layer; a concentration of doped atoms in the first carrier first transport sub-layer decreases exponentially with a depth of the doped atoms in the first carrier first transport sub-layer, and a distance between the doped atoms increases as the depth of the doped atoms in the first carrier first transport sub-layer increases; wherein the depth of the doped atoms in the first carrier first transport sub-layer is a distance between the doped atoms and a surface of the first carrier first transport sub-layer away from the first electrode;

and/or, the second carrier transport layer includes at least two second carrier transport sub-layers with different refractive indexes, and in the at least two second carrier transport sub-layers, the refractive indexes of the second carrier transport sub-layers decrease layer by layer in a direction from the light-emitting layer to the second electrode; and in the at least two second carrier transport sub-layers, a thickness of a film layer with a low refractive index is greater than a thickness of a film layer with a high refractive index, wherein the at least two second carrier transport sub-layers include two second carrier transport sub-layers, a second carrier transport sub-layer proximate to the second electrode is a second carrier first transport sub-layer, and a second carrier transport sub-layer proximate to the light-emitting layer is a second carrier second transport sub-layer; and same host atoms are included in the second carrier first transport sub-layer and the second carrier second transport sub-layer; a concentration of doped atoms in the second carrier first transport sub-layer decreases exponentially with a depth of the doped atoms in the second carrier first transport sub-layer, and a distance between the doped atoms increases as the depth of the doped atoms in the second carrier first transport sub-layer increases; wherein the depth of the doped atoms in the second carrier first transport sub-layer is a distance between the doped atoms and a surface of the second carrier first transport sub-layer away from the first electrode.

2. The light-emitting device according to claim 1, wherein in the two first carrier transport sub-layers, the first carrier first transport sub-layer is a continuous film layer, and a material of the first carrier first transport sub-layer is a first carrier first material;

and/or, in the two second carrier transport sub-layers, the second carrier first transport sub-layer is a continuous film layer, and a material of the second carrier first transport sub-layer is a second carrier first material.

3. The light-emitting device according to claim 1, wherein in the two first carrier transport sub-layers, the first carrier first transport sub-layer includes a plurality of patterned structures spaced apart from each other, and materials of the plurality of patterned structures are a first carrier first material;

the first carrier second transport sub-layer includes a first portion disposed on a side of the plurality of patterned structures of the first carrier first transport sub-layer away from the first electrode, and a second portion disposed on the first electrode and in contact with the first electrode; thicknesses of the first portion and the second portion of the first carrier second transport sub-layer are equal, and a surface of the first carrier second transport sub-layer away from the first electrode is not in a same plane; materials of the first portion and the second portion of the first carrier second transport sub-layer are both a first carrier second material.

4. The light-emitting device according to claim 3, wherein cross-sectional areas of at least one patterned structure in the plurality of patterned structures gradually increase or remain unchanged in a direction away from the light-emitting layer, a cross-sectional area of the patterned structure being an area of a cross-section obtained by taking a section of the patterned structure along a plane parallel to the light-emitting layer.

5. The light-emitting device according to claim 1, wherein in the two first carrier transport sub-layers, the first carrier first transport sub-layer is a continuous film layer, and includes a plurality of patterned structures spaced apart from each other and other structures except the plurality of patterned structures; a surface of the first carrier first transport sub-layer away from the first electrode is in a same plane; and the first carrier second transport sub-layer is a continuous film layer, and a material of the first carrier second transport sub-layer and a material of the other structures of the first carrier first transport sub-layer are both a first carrier second material, and a material of the plurality of patterned structures of the first carrier first transport sub-layer is a first carrier first material.

6. The light-emitting device according to claim 1, wherein in the two second carrier transport sub-layers, the second carrier first transport sub-layer includes a plurality of patterned structures spaced apart from each other, and a material of the plurality of patterned structures of the second carrier first transport sub-layer is a second carrier first material;

the second carrier second transport sub-layer includes a first portion disposed on a side of the plurality of patterned structures of the second carrier first transport sub-layer away from the second electrode, and a second portion disposed on a side of the second electrode and in contact with the second electrode; materials of the first portion and the second portion of the second carrier second transport sub-layer are both a second carrier second material;

thicknesses of the first portion and the second portion of the second carrier second transport sub-layer are not equal, and a thickness of the second portion of the second carrier second transport sub-layer is equal to a sum of a thickness of the first portion of the second carrier second transport sub-layer and a thickness of the second carrier first transport sub-layer.

7. The light-emitting device according to claim 1, wherein in the two first carrier transport sub-layers, the first carrier second transport sub-layer is C-axis oriented;

and/or, in the two second carrier transport sub-layers, the second carrier second transport sub-layer is C-axis oriented.

8. The light-emitting device according to claim 7, wherein in the two first carrier transport sub-layers, the first carrier first transport sub-layer is C-axis oriented, and a degree of C-axis orientation of the first carrier first transport sub-layer is less than that of the first carrier second transport sub-layer;

and/or, in the two second carrier transport sub-layers, the second carrier first transport sub-layer is C-axis oriented, and a degree of C-axis orientation of the second carrier first transport sub-layer is less than that of the second carrier second transport sub-layer.

9. The light-emitting device according to claim 1, wherein a refractive index of the first carrier first transport sub-layer is in a range of 1.7 to 1.77, and a refractive index of the first carrier second transport sub-layer is in a range of 2.0 to 2.06;

and/or, a refractive index of the second carrier first transport sub-layer is in a range of 1.7 to 1.77; and a refractive index of the second carrier second transport sub-layer is in a range of 2.0 to 2.06.

10. The light-emitting device according to claim 9, wherein a surface roughness of the first carrier transport layer away from the first electrode is in a range of 0.5 nm to 2 nm; and/or, a surface roughness of the second carrier transport layer away from the first electrode is in a range of 0.5 nm to 2 nm.

11. The light-emitting device according to claim 1, wherein the light-emitting device is upright, the first electrode is an anode, the second electrode is a cathode, the first carrier transport layer is a hole transport layer, and the second carrier transport layer is an electron transport layer; or the light-emitting device is inverted, the first electrode is the cathode, the second electrode is the anode, the first carrier transport layer is the electron transport layer, and the second carrier transport layer is the hole transport layer;

wherein the second electrode is a transparent electrode.

12. A display substrate, comprising at least one light-emitting device according to claim 1.

13. The display substrate according to claim 12, wherein the display substrate includes a plurality of sub-pixels, and the plurality of sub-pixels include red sub-pixels, green sub-pixels and blue sub-pixels; a surface of a first carrier transport layer of a light-emitting device in a red sub-pixel away from the first electrode, a surface of a first carrier transport layer of a light-emitting device in a green sub-pixel away from the first electrode, and a surface of a first carrier transport layer of a light-emitting device in a blue sub-pixel away from the first electrode are not in a same plane; and a surface of a second carrier transport layer of the light-emitting device in the red sub-pixel away from the second electrode, a surface of a second carrier transport layer of the light-emitting device in the green sub-pixel away from the second electrode, and a surface of a second carrier transport layer of the light-emitting device in the blue sub-pixel away from the second electrode are not in a same plane.

14. The display substrate according to claim 12, wherein the display substrate includes a plurality of sub-pixels, and the plurality of sub-pixels include red sub-pixels, green sub-pixels and blue sub-pixels; a surface of a first carrier transport layer of a light-emitting device in a red sub-pixel away from the first electrode, a surface of a first carrier transport layer of a light-emitting device in a green sub-pixel away from the first electrode, and a surface of a first carrier transport layer of a light-emitting device in a blue sub-pixel away from the first electrode are in a same plane; and a surface of a second carrier transport layer of the light-emitting device in the red sub-pixel away from the second electrode, a surface of a second carrier transport layer of the light-emitting device in the green sub-pixel away from the second electrode, and a surface of a second carrier transport layer of the light-emitting device in the blue sub-pixel away from the second electrode are in a same plane.

15. The display substrate according to claim 12, wherein a wavelength of light emitted by the light-emitting device in the red sub-pixel is $\lambda 1$, a wavelength of light emitted by the light-emitting device in the green sub-pixel is $\lambda 2$, and a wavelength of light emitted by the light-emitting device in the blue sub-pixel is $\lambda 3$; $\lambda 1>\lambda 2>\lambda 3$; and a proportion of a thickness of a first carrier first transport sub-layer to a total thickness of the first carrier transport layer in the light-emitting device in the red sub-pixel is k1, a proportion of a thickness of a first carrier first transport sub-layer to a total thickness of the first carrier transport layer in the light-emitting device in the green sub-pixel is k2, and a proportion of a thickness of a first carrier first transport sub-layer to a total thickness of the first carrier transport layer in the light-emitting device in the blue sub-pixel is k3; $k1<k2<k3$;

and/or, a proportion of a thickness of a second carrier first transport sub-layer to a total thickness of the second carrier transport layer in the light-emitting device in the red sub-pixel is k1', a proportion of a thickness of a second carrier first transport sub-layer to a total thickness of the second carrier transport layer in the light-emitting device in the green sub-pixel is k2', and a proportion of a thickness of a second carrier first transport sub-layer to a total thickness of the second carrier transport layer in the light-emitting device in the blue sub-pixel is k3'; $k1'<k2'<k3'$.

16. A manufacturing method for a light-emitting device, comprising:

forming a first electrode;

forming a first carrier transport layer on the first electrode;

forming a light-emitting layer on the first carrier transport layer;

forming a second carrier transport layer on the light-emitting layer; and forming a second electrode on the second carrier transport layer;

wherein the first carrier transport layer includes at least two first carrier transport sub-layers with different refractive indexes, and in the at least two first carrier transport sub-layers, the refractive indexes of the first carrier transport sub-layers decrease layer by layer in a direction from the light-emitting layer to the first electrode; and in the at least two first carrier transport sub-layers, a thickness of a film layer with a low refractive index is greater than a thickness of a film layer with a high refractive index, wherein the at least two first carrier transport sub-layers include two first carrier transport sub-layers, a first carrier transport sub-layer proximate to the first electrode is a first carrier first transport sub-layer, and a first carrier transport sub-layer proximate to the light-emitting layer is a first carrier second transport sub-layer; and same host atoms are included in the first carrier first transport sub-layer and the first carrier second transport sub-layer; a concentration of doped atoms in the first carrier first transport sub-layer decreases exponentially with a depth of the doped atoms in the first carrier first transport sub-layer, and a distance between the doped atoms increases as the depth of the doped atoms in the first carrier first transport sub-layer increases; wherein the depth of the doped atoms in the first carrier first transport sub-layer is a distance between the doped atoms and a surface of the first carrier first transport sub-layer away from the first electrode;

and/or the second carrier transport layer includes at least two second carrier transport sub-layers with different refractive indexes, and in the at least two second carrier transport sub-layers, the refractive indexes of the second carrier transport sub-layers decrease layer by layer in a direction from the light-emitting layer to the second electrode; and in the at least two second carrier transport sub-layers, a thickness of a film layer with a low refractive index is greater than a thickness of a film layer with a high refractive index, wherein the at least two second carrier transport sub-layers include two second carrier transport sub-layers, a second carrier transport sub-layer proximate to the second electrode is a second carrier first transport sub-layer, and a second carrier transport sub-layer proximate to the light-emitting layer is a second carrier second transport sub-layer; and same host atoms are included in the second carrier first transport sub-layer and the second carrier second transport sub-layer; a concentration of doped atoms in the second carrier first transport sub-layer decreases exponentially with a depth of the doped atoms in the second carrier first transport sub-layer, and a distance between the doped atoms increases as the depth of the doped atoms in the second carrier first transport sub-layer increases; wherein the depth of the doped atoms in the second carrier first transport sub-layer is a distance between the doped atoms and a surface of the second carrier first transport sub-layer away from the first electrode.

17. The manufacturing method for the light-emitting device according to claim 16, wherein forming the first carrier transport layer on the first electrode, includes:

forming an initial first carrier first transport sub-layer on the first electrode, and annealing the initial first carrier first transport sub-layer to form the first carrier first transport sub-layer; and forming the first carrier second transport sub-layer on the first carrier first transport sub-layer;

or, forming the initial first carrier first transport sub-layer on the first electrode, etching the initial first carrier first transport sub-layer to form a plurality of patterned structures, and annealing the plurality of patterned structures to form the first carrier first transport sub-layer; and forming the first carrier second transport sub-layer on the first carrier first transport sub-layer;

or, forming the initial first carrier first transport sub-layer on the first electrode, and performing local laser annealing on the initial first carrier first transport sub-layer to form the first carrier first transport sub-layer; and forming the first carrier second transport sub-layer on the first carrier first transport sub-layer;

or, forming the initial first carrier first transport sub-layer on the first electrode, and performing ion implantation on the initial first carrier first transport sub-layer to form the first carrier first transport sub-layer; and forming the first carrier second transport sub-layer on the first carrier first transport sub-layer.

18. The manufacturing method for the light-emitting device according to claim 16, wherein forming the second carrier transport layer on the light-emitting layer, includes:

forming an initial second carrier transport sub-layer on the light-emitting layer, and performing ion implantation on the initial second carrier transport sub-layer to form the second carrier first transport sub-layer and the second carrier second transport sub-layer, wherein the second carrier first transport sub-layer is a portion of the initial second carrier transport sub-layer that has been implanted with ions, and the second carrier second transport sub-layer is a portion of the initial second carrier transport sub-layer that has not been implanted with ions;

or, forming the initial second carrier transport sub-layer on the light-emitting layer; and performing ion implantation at different positions of the initial second carrier transport sub-layer by using a mask scanning method to form the second carrier first transport sub-layer with a plurality of patterned structures and the second carrier second transport sub-layer, wherein the second carrier first transport sub-layer is a portion of the initial second carrier transport sub-layer that has been implanted with ions, and the second carrier second transport sub-layer is a portion of the initial second carrier transport sub-layer that has not been implanted with ions;

or, forming the initial second carrier transport sub-layer on the light-emitting layer, etching the initial second carrier transport sub-layer to form the second carrier second transport sub-layer with a plurality of depressions; and filling the plurality of depressions in the second carrier second transport sub-layer with a material to form the second carrier first transport sub-layer with a plurality of patterned structures.

19. A light-emitting device, comprising: a first electrode, and a first carrier transport layer, a light-emitting layer, a second carrier transport layer and a second electrode that are stacked on the first electrode in sequence, wherein transmittance of the second electrode is higher than that of the first electrode, and the transmittance is transmittance of visible light;

the first carrier transport layer includes at least two first carrier transport sub-layers with different refractive indexes, and in the at least two first carrier transport sub-layers, the refractive indexes of the first carrier transport sub-layers decrease layer by layer in a direction from the light-emitting layer to the first electrode; and in the at least two first carrier transport sub-layers, a thickness of a film layer with a low refractive index is greater than a thickness of a film layer with a high refractive index, wherein the at least two first carrier transport sub-layers include two first carrier transport sub-layers, a first carrier transport sub-layer proximate to the first electrode is a first carrier first transport sub-layer, and a first carrier transport sub-layer proximate to the light-emitting layer is a first carrier second transport sub-layer;

a refractive index of the first carrier first transport sub-layer is in a range of 1.7 to 1.77, and a refractive index of the first carrier second transport sub-layer is in a range of 2.0 to 2.06; and a surface roughness of the first carrier transport layer away from the first electrode is in a range of 0.5 nm to 2 nm;

and/or, the second carrier transport layer includes at least two second carrier transport sub-layers with different refractive indexes, and in the at least two second carrier transport sub-layers, the refractive indexes of the second carrier transport sub-layers decrease layer by layer in a direction from the light-emitting layer to the second electrode; and in the at least two second carrier transport sub-layers, a thickness of a film layer with a low refractive index is greater than a thickness of a film layer with a high refractive index, wherein the at least two second carrier transport sub-layers include two second carrier transport sub-layers, a second carrier transport sub-layer proximate to the second electrode is a second carrier first transport sub-layer, and a second carrier transport sub-layer proximate to the light-emitting layer is a second carrier second transport sub-layer;

a refractive index of the second carrier first transport sub-layer is in a range of 1.7 to 1.77; and a refractive index of the second carrier second transport sub-layer is in a range of 2.0 to 2.06; and a surface roughness of the second carrier transport layer away from the first electrode is in a range of 0.5 nm to 2 nm.

* * * * *